US011252367B2

(12) United States Patent
Tagawa et al.

(10) Patent No.: US 11,252,367 B2
(45) Date of Patent: Feb. 15, 2022

(54) SOLID-STAGE IMAGE SENSOR, IMAGING DEVICE, AND METHOD OF CONTROLLING SOLID-STATE IMAGE SENSOR

(71) Applicant: SONY SEMICONDUCTOR SOLUTIONS CORPORATION, Kanagawa (JP)

(72) Inventors: Yukio Tagawa, Tokyo (JP); Mamoru Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 164 days.

(21) Appl. No.: 16/633,407

(22) PCT Filed: Jun. 12, 2018

(86) PCT No.: PCT/JP2018/022322
§ 371 (c)(1),
(2) Date: Jan. 23, 2020

(87) PCT Pub. No.: WO2019/026429
PCT Pub. Date: Feb. 7, 2019

(65) Prior Publication Data
US 2020/0382735 A1    Dec. 3, 2020

(30) Foreign Application Priority Data
Aug. 1, 2017    (JP) .............................. JP2017-148821

(51) Int. Cl.
*H04N 5/378*  (2011.01)
*H04N 5/369*  (2011.01)
(Continued)

(52) U.S. Cl.
CPC ....... *H04N 5/378* (2013.01); *H01L 27/14621* (2013.01); *H01L 27/14627* (2013.01);
(Continued)

(58) Field of Classification Search
CPC ...... H04N 5/378; H04N 5/379; H04N 5/3698; H04N 5/37452; H04N 5/3745;
(Continued)

(56) References Cited

U.S. PATENT DOCUMENTS 10,868,064 B2 * 12/2020 Wada ................ H01L 27/14603
2005/0072901 A1    4/2005 Funakoshi et al.
(Continued)

FOREIGN PATENT DOCUMENTS

CN    101296330 A    10/2008
JP    2003-259218 A    9/2003
(Continued)

OTHER PUBLICATIONS

Choi, et al., "An Energy/Illumination-Adaptive CMOS Image Sensor With Reconfigurable Modes of Operations", Journal of Solid-State Circuits, IEEE, vol. 50, No. 6, Jun. 2015, pp. 1438-1450.
(Continued)

*Primary Examiner* — Tony Ko
(74) *Attorney, Agent, or Firm* — Chip Law Group

(57) ABSTRACT

To increase a readout speed of a pixel signal in a non-differential mode in a solid-state image sensor that performs differential amplification in a differential mode and does not perform differential amplification in the non-differential mode. A connection control unit sequentially performs control of connecting a first pixel connected to a first signal line to a reset power supply via a third signal line and control of connecting a second pixel connected to a second signal line to the reset power supply via a fourth signal line in a differential mode, and performs control of connecting a third pixel to the third signal line and control of connecting the fourth pixel to the fourth signal line in a non-differential mode. Furthermore, a drive unit outputs a signal obtained by amplifying a difference between respective pixel signals of
(Continued)

the first and second pixels via one of the first and second signal lines in the differential mode, and outputs respective pixel signals of the first, second, third, and fourth pixels via the first, second, third, and fourth signal lines in the non-differential mode.

14 Claims, 44 Drawing Sheets

(51) Int. Cl.
*H01L 27/146* (2006.01)
*H04N 5/3745* (2011.01)

(52) U.S. Cl.
CPC .. *H01L 27/14634* (2013.01); *H01L 27/14636* (2013.01); *H01L 27/14645* (2013.01); *H04N 5/3698* (2013.01); *H04N 5/379* (2018.08); *H04N 5/37452* (2013.01)

(58) Field of Classification Search
CPC ......... H01L 27/14621; H01L 27/14627; H01L 27/14634; H01L 27/14636; H01L 27/14645; H01L 27/1464; H01L 27/14612; H01L 27/14641; H01L 27/14603

See application file for complete search history.

(56) References Cited

U.S. PATENT DOCUMENTS

| 2008/0258047 | A1 | 10/2008 | Sakakibara et al. |
| 2020/0389609 | A1* | 12/2020 | Komai ................. H04N 5/3559 |
| 2021/0176421 | A1* | 6/2021 | Shikina .............. H04N 5/37455 |

FOREIGN PATENT DOCUMENTS

| JP | 2008-271280 A | 11/2008 |
| JP | 2015-053625 A | 3/2015 |

OTHER PUBLICATIONS

International Search Report and Written Opinion of PCT Application No. PCT/JP2018/022322, dated Aug. 28, 2018, 06 pages of ISRWO.

Choi, et al., "An Energy/Illumination-Adaptive CMOS Image Sensor With Reconfigurable Modes of Operations", IEEE Journal of Solid-State Circuits, vol. 50, No. 6, Jun. 2015, pp. 1438-1450.

* cited by examiner

FIG. 17
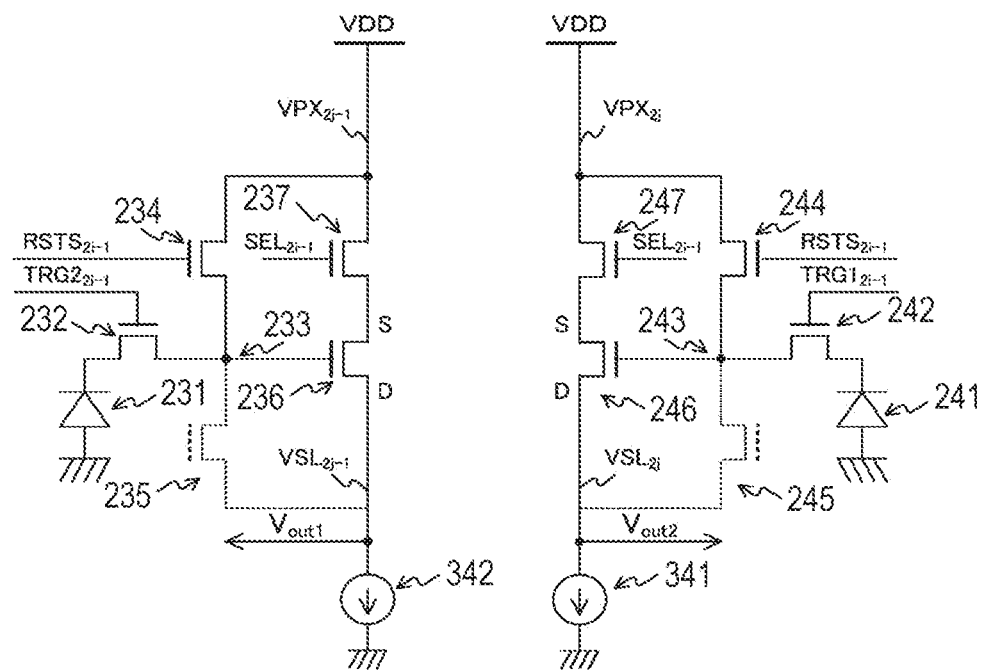
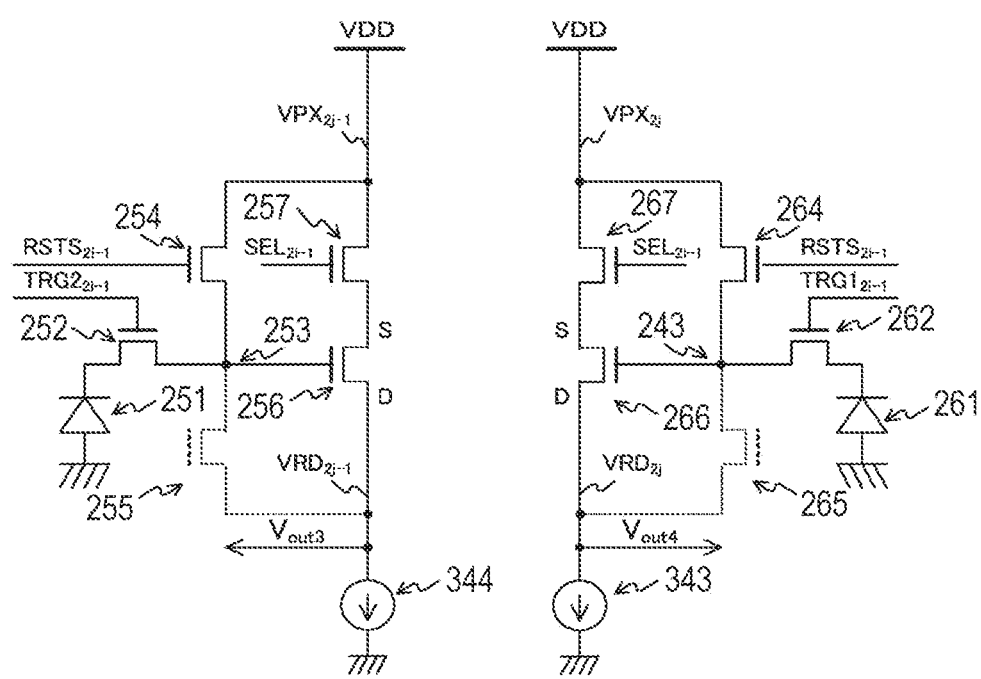

FIG. 20
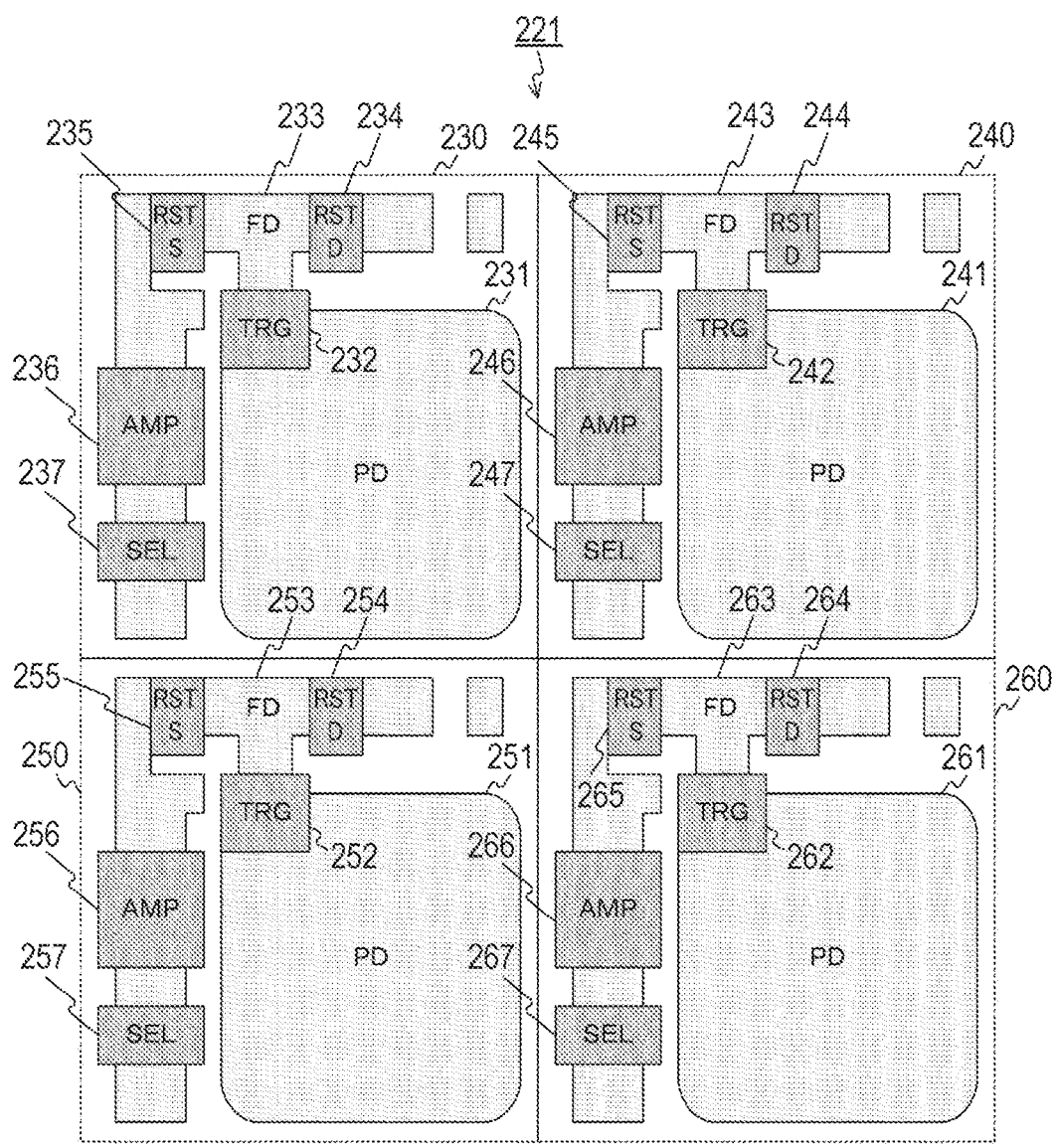
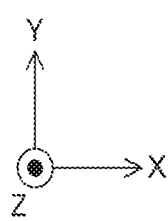

SOLID-STAGE IMAGE SENSOR, IMAGING DEVICE, AND METHOD OF CONTROLLING SOLID-STATE IMAGE SENSOR

CROSS REFERENCE TO RELATED APPLICATIONS

This application is a U.S. National Phase of International Patent Application No. PCT/JP2018/022322 filed on Jun. 12, 2018, which claims priority benefit of Japanese Patent Application No. JP 2017-148821 filed in the Japan Patent Office on Aug. 1, 2017. Each of the above-referenced applications is hereby incorporated herein by reference in its entirety.

TECHNICAL FIELD

The present technology relates to a solid-state image sensor, an imaging device, and a method of controlling a solid-state image sensor. Specifically, the present invention relates to a solid-state image sensor that outputs a pixel signal via a vertical signal line, an imaging device, and a method of controlling the same.

BACKGROUND ART

Conventionally, solid-state image sensors that photoelectrically convert light to capture image data have been used in imaging devices or the like. For example, for the purpose of increasing sensitivity, a differential amplification-type solid-state image sensor has been proposed, which amplifies a difference (that is, performs differential amplification) between respective pixel signals of a pair of pixels in a differential mode (for example, (See Non-Patent Document 1). This solid-state image sensor can change a circuit configuration in a pixel and output a pixel signal without performing the differential amplification in a non-differential mode. In the non-differential mode, the sensitivity is reduced while the readout speed is increased as compared with the differential mode. Furthermore, in the solid-state image sensor, a vertical signal line VRD for supplying a reset power supply in the differential mode and a vertical signal line VSL for outputting a pixel signal in the differential mode and the non-differential mode are wired for every column.

CITATION LIST

Non-Patent Document

Non-Patent Document 1: Jaehyuk Choi, et al., An Energy/Illumination-Adaptive CMOS Image Sensor With Reconfigurable Modes of Operations, IEEE JOURNAL OF SOLID-STATE CIRCUITS 2015.

SUMMARY OF THE INVENTION

Problems to be Solved by the Invention

However, the above-described conventional technology is difficult to further increase the readout speed in the non-differential mode. If the number of wired vertical signal lines VSL used for output, of the vertical signal lines VRD and VSL, is set to two per column, two rows can be simultaneously read and the readout speed can be doubled. However, the increase in the number of wired lines makes miniaturization difficult and thus is not favorable. As described above, the solid-state image sensor capable of switching the differential mode and the non-differential mode has a problem of a difficulty in increasing the readout speed in the non-differential mode.

The present technology has been devised in view of such a situation, and an object is to increase a readout speed of a pixel signal in a non-differential mode in a solid-state image sensor that performs differential amplification in a differential mode and does not perform differential amplification in the non-differential mode.

Solutions to Problems

The present technology has been made to solve the above-described problems, and the first aspect of the present technology is a solid-state image sensor and a method of controlling the same, the solid-state image sensor including: a first pixel connected to a first signal line; a second pixel connected to a second signal line; a third pixel; a fourth pixel; a connection control unit configured to sequentially perform control of connecting the first pixel to a reset power supply via a third signal line and control of connecting the second pixel to the reset power supply via a fourth signal line in a differential mode, and perform control of connecting the third pixel to the third signal line and control of connecting the fourth pixel to the fourth signal line in a non-differential mode; and a drive unit configured to output a signal obtained by amplifying a difference between respective pixel signals of the first and second pixels via one of the first and second signal lines in the differential mode, and output respective pixel signals of the first, second, third, and fourth pixels via the first, second, third, and fourth signal lines in the non-differential mode. The above configuration brings about an effect of outputting the signal obtained by amplifying the difference in the pixel signals in the differential mode, and outputting the respective pixel signals of the first, second, third, and fourth pixels in the non-differential mode.

Furthermore, in the first aspect, the connection control unit may further perform control of connecting the first and second pixels to a predetermined current source via fifth and sixth signal lines in the differential mode, and may further perform control of connecting the first and third pixels to a power supply via the fifth signal line and control of connecting the second and fourth pixels to a power supply via the sixth signal line in the non-differential mode. The above configuration brings about an effect of supplying a current via the fifth and sixth signal lines in the differential mode and supplying a current via the fifth and sixth signal lines in the non-differential mode.

Furthermore, in the first aspect, each of the first and second pixels may include a charge storage unit configured to store a charge, and a pair of reset transistors configured to initialize an amount of the stored charge, and the connection control unit may sequentially perform control of connecting one of the pair of transistors of the first pixel to the reset power supply via the third signal line and control of connecting one of the pair of transistors of the second pixel to the reset power supply via the fourth signal line in the differential mode, and may perform control of connecting the others of the respective pairs of transistors of the first and third pixels to the power supply via the fifth signal line and control of connecting the others of the respective pairs of transistors of the second and fourth pixels to the power supply via the sixth signal line in the non-differential mode.

The above configuration brings about an effect of driving the different reset transistors in the differential mode and in the non-differential mode.

Furthermore, in the first aspect, the first, second, third, and fourth signal lines may be wired along a perpendicular direction to a predetermined direction, the first and second pixels may be arrayed in the predetermined direction, the first and third pixels may be arrayed in the perpendicular direction, and the third and fourth pixels may be arrayed in the predetermined direction. The above configuration brings about an effect of outputting the signals from the pixels of 2 rows×2 columns.

Furthermore, in the first aspect, the first, second, third, and fourth signal lines may be wired along a perpendicular direction to a predetermined direction, and the first, second, third, and fourth pixels may be arrayed in the predetermined direction. The above configuration brings about an effect of outputting the signals from the pixels of 1 row×4 columns.

Furthermore, in the first aspect, the first, second, third, and fourth signal lines may be wired along a perpendicular direction to a predetermined direction, and the first, second, third, and fourth pixels may be arrayed in the perpendicular direction. The above configuration brings about an effect of outputting the signals from the pixels of 4 rows×1 column.

Furthermore, in the first aspect, each of the first, second, third, and fourth pixels may include a charge storage unit configured to store a charge, a plurality of photoelectric conversion elements each configured to photoelectrically convert incident light to generate the charge, and a transfer unit configured to transfer the charge from each of the plurality of photoelectric conversion elements to the charge storage unit. The above configuration brings about an effect of outputting the signals from the plurality of pixels sharing the charge storage unit.

Furthermore, in the first aspect, each of the first, second, third, and fourth pixels may include a microlens configured to collect incident light, a photoelectric conversion layer configured to photoelectrically convert the collected incident light to generate a charge, and a wiring layer arranged between the photoelectric conversion layer and the microlens, and the first, second, third, and fourth signal lines may be wired in the wiring layer. The above configuration brings about an effect of outputting a signal from a front surface irradiation-type solid-state image sensor.

Furthermore, in the first aspect, each of the first, second, third, and fourth pixels may include a microlens configured to collect incident light, a wiring layer, and a photoelectric conversion layer arranged between the microlens and the wiring layer and configured to photoelectrically convert the collected incident light to generate a charge, and the first, second, third, and fourth signal lines may be wired in the wiring layer. The above configuration brings about an effect of outputting a signal from a back surface irradiation-type solid-state image sensor.

Furthermore, in the first aspect, the first, second, third, and fourth pixels and the connection control unit may be arranged in a first semiconductor chip, and the drive unit may be arranged in a second semiconductor chip stacked on the first semiconductor chip. The above configuration brings about an effect of outputting a signal from a stacked-type solid-state image sensor.

Furthermore, in the first aspect, the first, second, third, and fourth pixels may be arranged in a first semiconductor chip, and the connection control unit and the drive unit may be arranged in a second semiconductor chip stacked on the first semiconductor chip. The above configuration brings about an effect of outputting a signal from a stacked-type solid-state image sensor in which only pixels are arranged in the first semiconductor chip.

Furthermore, in the first aspect, an analog-to-digital conversion unit configured to execute sampling processing of converting the pixel signal into a digital signal every time the pixel signal is output over a plurality of times, and an adder circuit configured to add and output the digital signals may be further included. The above configuration brings about an effect of outputting an added result of execution of the sampling processing over a plurality of times.

Furthermore, the second aspect of the present technology is an imaging device including a first pixel connected to a first signal line; a second pixel connected to a second signal line; a third pixel; a fourth pixel; a connection control unit configured to sequentially perform control of connecting the first pixel to a reset power supply via a third signal line and control of connecting the second pixel to the reset power supply via a fourth signal line in a differential mode, and perform control of connecting the third pixel to the third signal line and control of connecting the fourth pixel to the fourth signal line in a non-differential mode; a drive unit configured to output a signal obtained by amplifying a difference between respective pixel signals of the first and second pixels via one of the first and second signal lines in the differential mode, and output respective pixel signals of the first, second, third, and fourth pixels via the first, second, third, and fourth signal lines in the non-differential mode; and an image processing unit configured to execute predetermined processing for image data generated from the pixel signals. The above configuration brings about an effect of processing image data generated from the signal obtained by amplifying the difference in the pixel signals in the differential mode, and processing image data generated from the respective pixel signals of the first, second, third, and fourth pixels in the non-differential mode.

Effects of the Invention

According to the present technology, an excellent effect of increasing a readout speed of a pixel signal in a non-differential mode can be exhibited in a solid-state image sensor that performs differential amplification in a differential mode and does not perform differential amplification in the non-differential mode. Note that effects described here are not necessarily limited, and any of effects described in the present disclosure may be exhibited.

BRIEF DESCRIPTION OF DRAWINGS

FIG. 17 is a diagram in which the basic unit and the unit readout circuit of when performing readout in the non-differential mode according to the first embodiment of the present technology are simplified.

FIG. 20 is a plan view illustrating a configuration example of a photoelectric conversion layer according to the first embodiment of the present technology.

MODE FOR CARRYING OUT THE INVENTION

Hereinafter, modes for implementing the present technology (hereinafter referred to as embodiments) will be described. Description will be given according to the following order.

1. First Embodiment (an example of switching connection destinations of vertical signal lines)
2. Second Embodiment (an example of switching connection destinations of vertical signal lines for pixels of 4 rows×1 column)
3. Third Embodiment (an example of switching connection destinations of vertical signal lines for pixels of 1 row×4 columns)
4. Fourth Embodiment (an example of switching connection destinations of vertical signal lines in four-pixel sharing type)
5. Fifth Embodiment (an example of switching connection destinations of vertical signal lines in eight-pixel sharing type)
6. Sixth Embodiment (an example of switching connection destinations of vertical signal lines in back-surface irradiation type)
7. Seventh Embodiment (an example of switching connection destinations of vertical signal lines in stacked type)
8. Eighth Embodiment (an example of switching connection destinations of vertical signal lines and performing multi-sampling)
9. Application Example to Mobile Bodies

1. First Embodiment

[Configuration Example of Imaging Device]

Figure 1:
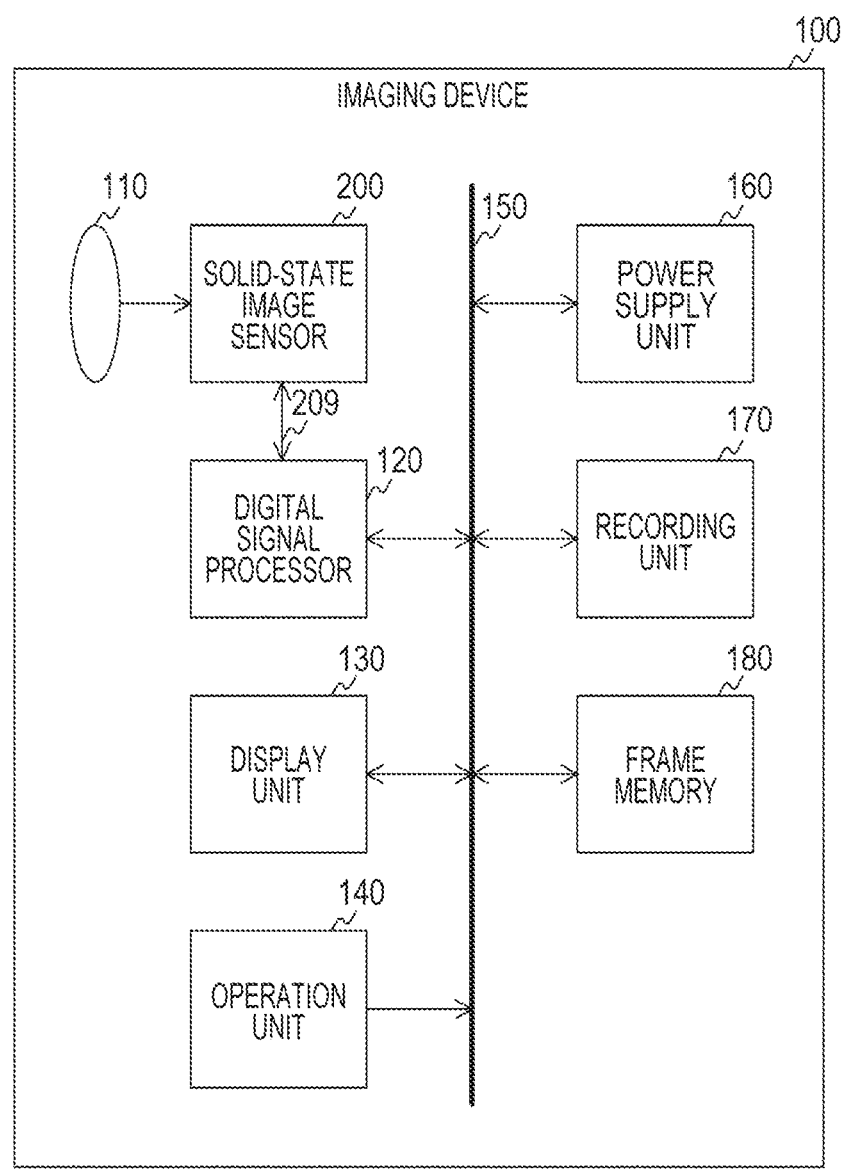
FIG. 1 is a block diagram illustrating a configuration example of an imaging device according to a first embodiment of the present technology.

FIG. 1 is a block diagram illustrating a configuration example of an imaging device 100 according to a first embodiment of the present technology. The imaging device 100 is a device for capturing image data, and includes an optical unit 110, a solid-state image sensor 200, and a digital signal processor 120. Furthermore, the imaging device 100 includes a display unit 130, an operation unit 140, a bus 150, a power supply unit 160, a storage unit 170, and a frame memory 180. As the imaging device 100, for example, a smartphone or a personal computer having an imaging function, an in-vehicle camera, or the like is assumed in addition to a digital camera such as a digital still camera.

The optical unit 110 condenses light from an object and guides the light to the solid-state image sensor 200. The solid-state image sensor 200 generates image data in synchronization with a vertical synchronization signal VSYNC. Here, the vertical synchronization signal VSYNC is a periodic signal having a predetermined frequency (for example, 30 Hz) indicating imaging timing. The solid-state image sensor 200 supplies the generated image data to the digital signal processor 120 via a signal line 209.

The digital signal processor 120 executes predetermined signal processing such as demosaic processing and noise reduction processing for the image data from the solid-state image sensor 200. The digital signal processor 120 outputs the processed image data to the frame memory 180 or the like via the bus 150. Furthermore, the digital signal processor 120 generates a mode signal MODE instructing either a differential mode or a non-differential mode and the vertical synchronization signal VSYNC, and supplies the signals to the solid-state image sensor 200.

Here, the differential mode is a mode in which the solid-state image sensor 200 generates a signal obtained by amplifying a difference (performing differential amplification) between respective pixel signals of a pair of pixels. Meanwhile, the non-differential mode is a source follower mode of forming a source follower circuit and outputting a pixel signal without performing differential amplification. In the differential mode, conversion efficiency can be significantly increased by increasing a gain for an image signal, but an operating point is narrow and expansion of a dynamic range is difficult. For this reason, the differential mode is suitable for imaging in a dark place, and the non-differential (source follower) mode is suitable for imaging in a bright place. Therefore, the digital signal processor 120 measures an amount of ambient light and instructs the differential mode in a case where the amount of light is smaller than a predetermined threshold, and instructs the non-differential mode in a case where the amount of light is greater than or equal to the threshold, for example.

The display unit 130 displays the image data. As the display unit 130, a liquid crystal panel or an organic electro luminescence (EL) panel is assumed, for example. The operation unit 140 generates an operation signal according to a user operation.

The bus 150 is a common path for the optical unit 110, the solid-state image sensor 200, the digital signal processor 120, the display unit 130, the operation unit 140, the power supply unit 160, the storage unit 170, and the frame memory 180 to exchange data with one another.

The power supply unit 160 supplies power to the solid-state image sensor 200, the digital signal processor 120, the display unit 130, and the like. The storage unit 170 stores various data such as image data. The frame memory 180 holds image data.

[Configuration Example of Solid-State Image Sensor]

Figure 2:
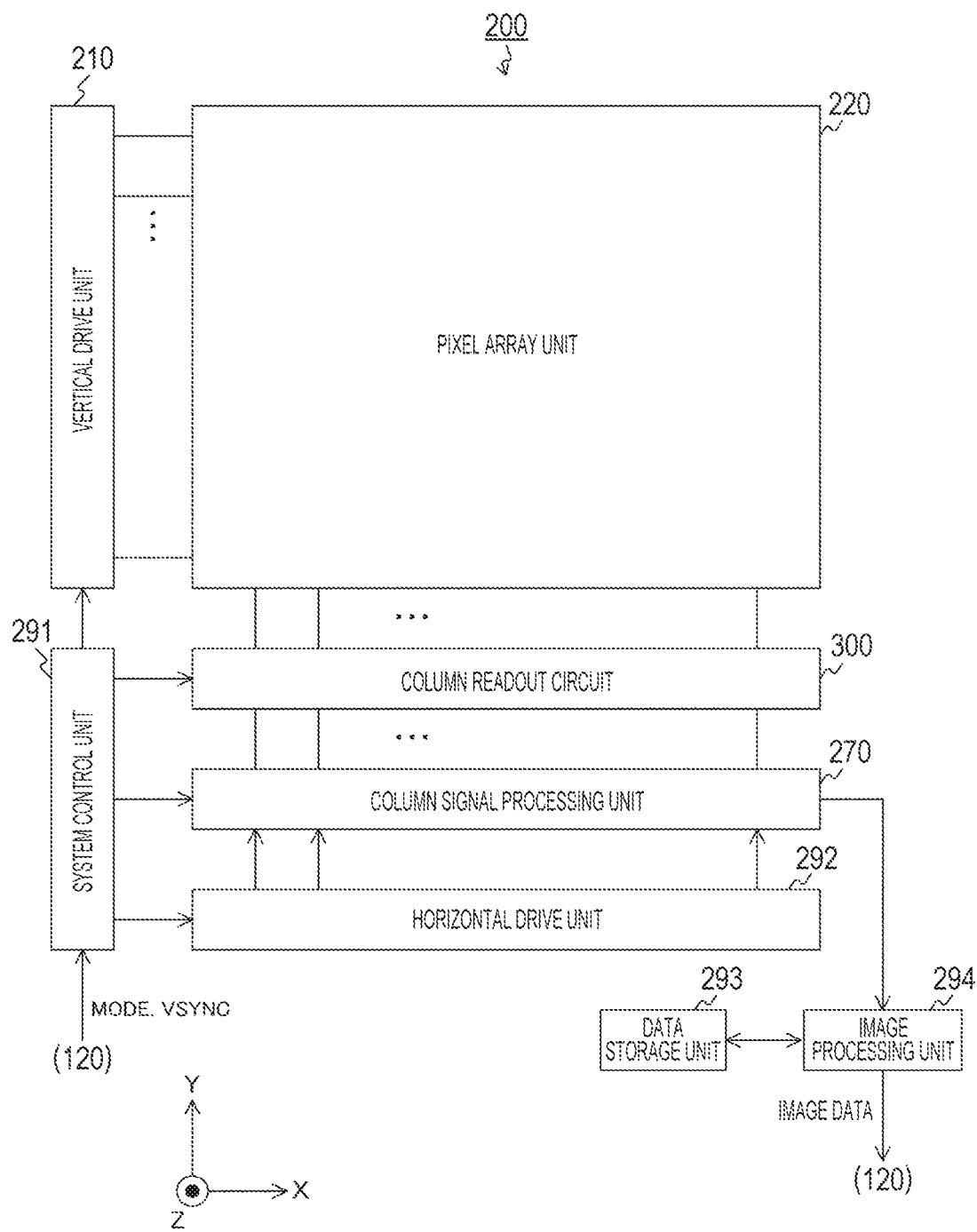
FIG. 2 is a block diagram illustrating a configuration example of a solid-state image sensor according to the first embodiment of the present technology.

FIG. 2 is a block diagram illustrating a configuration example of the solid-state image sensor 200 according to the first embodiment of the present technology. The solid-state image sensor 200 includes a vertical drive unit 210, a pixel array unit 220, a system control unit 291, a column readout circuit 300, a column signal processing unit 270, a horizontal drive unit 292, a data storage unit 293, and an image processing unit 294. These circuits are arranged on one semiconductor chip.

The system control unit 291 controls the vertical drive unit 210, the column readout circuit 300, the column signal processing unit 270, and the horizontal drive unit 292. The system control unit 291 includes a timing generator and the like. The system control unit 291 generates timing signals instructing respective operation timings of the vertical drive unit 210, the column signal processing unit 270, and the horizontal drive unit 292 in synchronization with the vertical synchronization signal VSYNC, and supplies the timing signals to the corresponding circuits. Furthermore, the system control unit 291 generates a control signal for controlling a switch in the column readout circuit 300 according to the mode signal MODE, and supplies the control signal to the column readout circuit 300.

In the pixel array unit 220, a plurality of pixels is arrayed in a two-dimensional lattice manner. Hereinafter, a set of pixels arrayed in a predetermined direction (such as a horizontal direction) is referred to as "row" or "line", and a set of pixels arrayed in a direction perpendicular to the row is referred to as "column". Furthermore, the number of rows in the pixel array unit 220 is M (M is an integer), and the number of columns is N (N is an integer).

Here, all the pixels in the pixel array unit 220 are assumed to be effective pixels that perform photoelectric conversion. Note that dummy pixels that do not perform photoelectric conversion and light-shielding pixels that block incident light may be further arranged in the pixel array unit 220, in addition to the effective pixels.

The vertical drive unit 210 sequentially selects and drives the rows. The vertical drive unit 210 includes a shift register, an address decoder, and the like. In the differential mode, the vertical drive unit 210 sequentially selects one row at a time and sequentially drives odd columns and even columns in the row every time a row is selected. Meanwhile, in the non-differential mode, the vertical drive unit 210 sequentially selects two rows at a time, and simultaneously drives all the pixels in the selected two rows. Therefore, in the non-differential mode, one piece of image data is generated by N/2 times of reading, and in the differential mode, one piece of image data is generated by 2×N times of reading. That is, a readout speed in the non-differential mode is four times that in the differential mode. In this way, the control method for driving pixels in units of rows is called rolling shutter method. Note that the vertical drive unit 210 is an example of a drive unit described in the claims. Furthermore, although the vertical drive unit 210 uses the rolling shutter method, a global shutter method for simultaneously driving all the pixels can also be used.

The column readout circuit 300 switches a connection destination of each vertical signal line wired to the pixel array unit 220 according to the control of the system control unit 291.

The column signal processing unit 270 performs signal processing for each column such as analog to digital (AD) conversion processing for the pixel signal from the column. The column signal processing unit 270 sequentially outputs each pixel data after the signal processing to the image processing unit 294 according to the control of the horizontal drive unit 292.

The horizontal drive unit 292 controls the column signal processing unit 270 and causes the column signal processing unit 270 to sequentially output the pixel data. The horizontal drive unit 292 includes a shift register and an address decoder.

The image processing unit 294 performs various types of image processing such as pixel addition processing for the image data including M×N pixel data. The image processing unit 294 temporarily stores image data in the data storage unit 293 as necessary in image processing. Furthermore, the image processing unit 294 supplies the processed image data to the digital signal processor 120.

Note that the image processing unit 294 may be disposed outside the solid-state image sensor 200 (in the digital signal processor 120 or the like). Furthermore, the image processing unit 294 may generate the mode signal MODE instead of the digital signal processor 120.

[Configuration Example of Column Readout Circuit]

Figure 3:
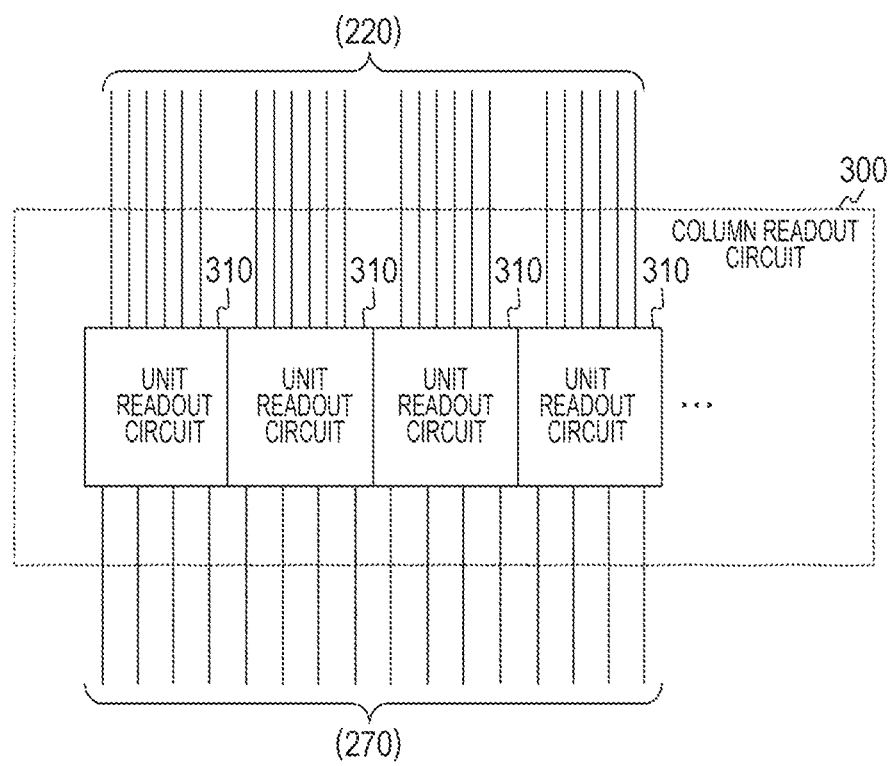
FIG. 3 is a block diagram illustrating a configuration example of a column readout circuit according to the first embodiment of the present technology.

FIG. 3 is a block diagram illustrating a configuration example of the column readout circuit 300 according to the first embodiment of the present technology. The column readout circuit 300 includes a unit readout circuit 310 for every two columns. In a case where the number of columns is N, N/2 unit readout circuits 310 are arranged.

Each of the unit readout circuits 310 is connected to the pixel array unit 220 via six vertical signal lines. Furthermore, the unit readout circuit 310 is connected to the column signal processing unit 270 via four signal lines.

Figure 4:
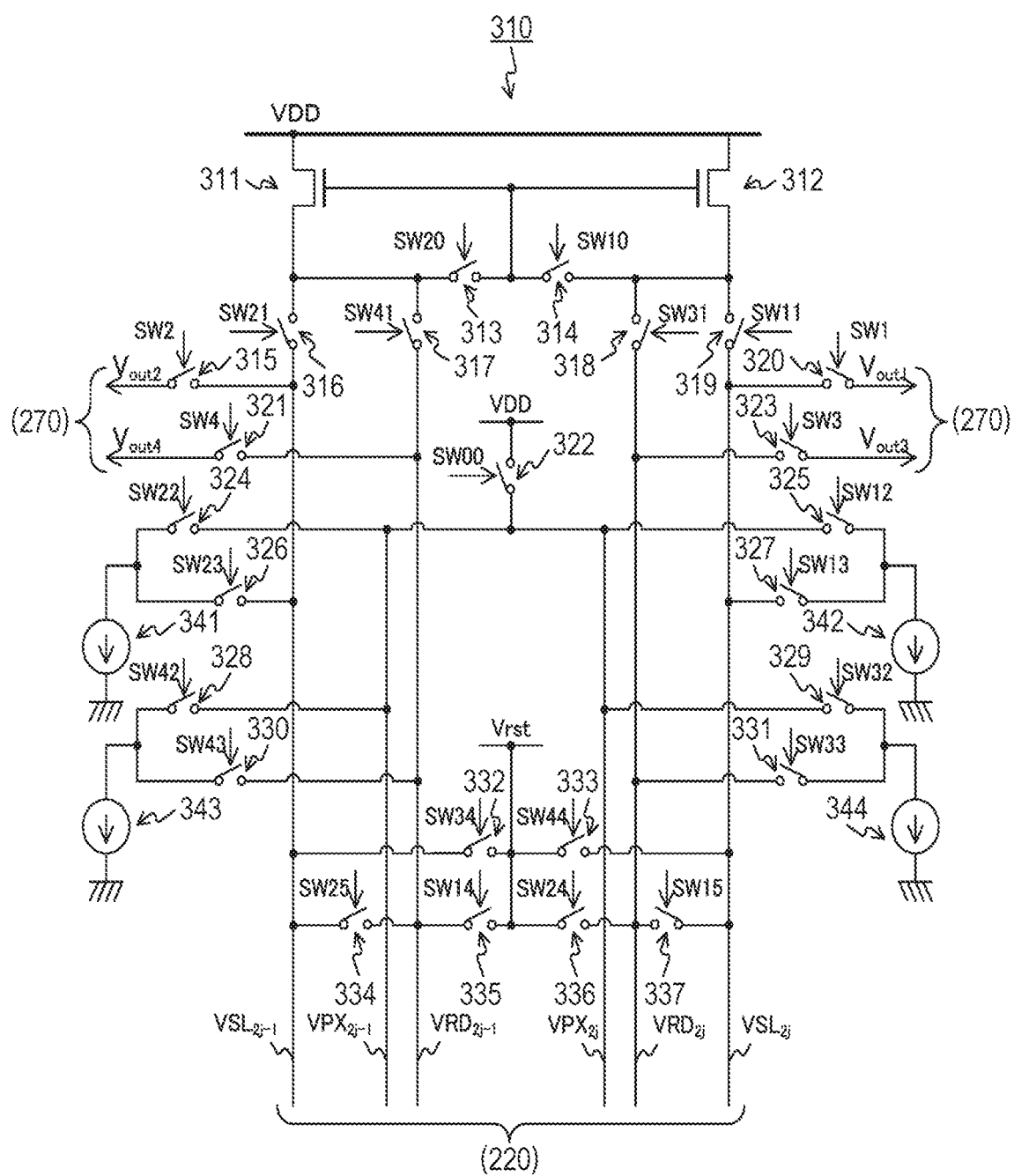
FIG. 4 is a circuit diagram illustrating a configuration example of a unit readout circuit according to the first embodiment of the present technology.

FIG. 4 is a circuit diagram illustrating a configuration example of the unit readout circuit 310 according to the first embodiment of the present technology. The unit readout circuit 310 includes n-type transistors 311 and 312, switches 313 to 337, and current sources 341 to 344.

Here, in the pixel array unit 220, vertical signal lines $VSL_{2j-1}$, $VPX_{2j-1}$, and $VRD_{2j-1}$ are wired along a column direction in the (2j−1)th (j is an integer from 1 to N/2) column. Furthermore, vertical signal lines $VSL_{2j}$, $VPX_{2j}$, and $VRD_{2j}$ are wired in the 2jth column. The vertical signal lines $VSL_{2j-1}$ and $VSL_{2j}$ are used for outputting the signals from the pixels to the column signal processing unit 270. Furthermore, the vertical signal lines $VPX_{2j-1}$ and $VPX_{2j}$ are used for connecting the pixels to the current sources 341 to 344. The vertical signal lines $VRD_{2j-1}$ and $VRD_{2j}$ are used for supplying reset power supply to the pixels or used for outputting the signals from the pixels to the column signal processing unit 270.

Note that the vertical signal line $VSL_{2j}$ is an example of a first signal line described in the claims, and the vertical signal line $VSL_{2j-1}$ is an example of a second signal line described in the claims. The vertical signal line $VRD_{2j}$ is an example of a third signal line described in the claims, and the vertical signal line $VRD_{2j-1}$ is an example of a fourth signal line described in the claims. Furthermore, the vertical signal line $VPX_{2j}$ is an example of a fifth signal line described in the claims, and the vertical signal line $VPX_{2j-1}$ is an example of a sixth signal line described in the claims.

Sources of the n-type transistors 311 and 312 are connected to a power supply of a power supply voltage VDD. As the n-type transistors 311 and 312, metal oxide semiconductor (MOS) transistors are used, for example.

The switch 313 opens and closes a path between a gate and a drain of the n-type transistor 311 according to a control signal SW20 from the system control unit 291. The switch 314 opens and closes a path between a gate and a drain of the n-type transistor 312 according to a control signal SW10 from the system control unit 291. By controlling one of these switches 313 and 314 to be a closed state, a current mirror circuit including the n-type transistors 311 and 312 is formed.

The switch 316 opens and closes a path between the drain of the n-type transistor 311 and the vertical signal line $VSL_{2j-1}$ according to a control signal SW31 from the system control unit 291. The switch 317 opens and closes a path between the drain of the n-type transistor 311 and the vertical signal line $VRD_{2j-1}$ according to a control signal SW41 from the system control unit 291.

The switch 318 opens and closes a path between the drain of the n-type transistor 312 and the vertical signal line $VRD_{2j}$ according to the control signal SW31 from the system control unit 291. The switch 319 opens and closes a path between the drain of the n-type transistor 312 and the vertical signal line $VSL_{2j}$ according to a control signal SW21 from the system control unit 291.

The switch 315 opens and closes a path between the column signal processing unit 270 and the vertical signal $VSL_{2j-1}$ according to a control signal SW2 from the system control unit 291. A voltage $V_{out2}$ is output via the switch 315.

The switch 320 opens and closes a path between the column signal processing unit 270 and the vertical signal $VSL_{2j}$ according to a control signal SW1 from the system control unit 291. A voltage $V_{out1}$ is output via the switch 320.

The switch 321 opens and closes a path between the column signal processing unit 270 and the vertical signal $VRD_{2j-1}$ according to a control signal SW4 from the system control unit 291. A voltage $V_{out4}$ is output via the switch 321.

The switch 323 opens and closes a path between the column signal processing unit 270 and the vertical signal $VRD_{2j}$ according to a control signal SW3 from the system control unit 291. A voltage $V_{out3}$ is output via the switch 323.

The switch 322 opens and closes a path between the power supply of the power supply voltage VDD and the vertical signals $VPX_{2j-1}$ and $VPX_{2j}$ according to a control signal SW00 from the system control unit 291.

The switch 324 opens and closes a path between the vertical signal $VPX_{2j-1}$ and the current source 341 according to a control signal SW22 from the system control unit 291. The switch 325 opens and closes a path between the vertical signal $VPX_{2j}$ and the current source 342 according to a control signal SW12 from the system control unit 291.

The switch 326 opens and closes a path between the vertical signal $VSL_{2j-1}$ and the current source 341 according to a control signal SW23 from the system control unit 291. The switch 327 opens and closes a path between the vertical signal $VSL_{2j}$ and the current source 342 according to a control signal SW13 from the system control unit 291.

The switch 328 opens and closes a path between the vertical signal $VPX_{2j-1}$ and the current source 343 according to a control signal SW42 from the system control unit 291. The switch 329 opens and closes a path between the vertical signal $VPX_{2j}$ and the current source 344 according to a control signal SW32 from the system control unit 291.

The switch 330 opens and closes a path between the vertical signal $VRD_{2j-1}$ and the current source 343 according to a control signal SW43 from the system control unit 291. The switch 331 opens and closes a path between the vertical signal $VRD_{2j}$ and the current source 344 according to a control signal SW33 from the system control unit 291.

The switch 332 opens and closes a path between a vertical signal $VSL_{2j-1}$ and a reset power supply of a reset voltage Vrst according to a control signal SW34 from the system control unit 291. The switch 333 opens and closes a path between the vertical signal $VSL_{2j}$ and the reset power supply of the reset voltage Vrst according to a control signal SW44 from the system control unit 291.

Here, a value lower than the power supply voltage VDD is set as the reset voltage Vrst. For example, the power supply voltage VDD is 3.3 volts (V), and the reset voltage Vrst is 2.2 volts (V).

The switch 334 opens and closes a path between the vertical signal $VSL_{2j-1}$ and the vertical signal line $VRD_{2j-1}$ according to a control signal SW25 from the system control unit 291. The switch 335 opens and closes a path between the vertical signal $VRD_{2j-1}$ and the reset power supply of the reset voltage Vrst according to a control signal SW14 from the system control unit 291.

The switch 336 opens and closes a path between the vertical signal $VRD_{2j}$ and the reset power supply of the reset voltage Vrst according to a control signal SW24 from the system control unit 291. The switch 337 opens and closes a path between the vertical signal $VSL_{2j}$ and the vertical signal line $VRD_{2j}$ according to a control signal SW15 from the system control unit 291.

[Configuration Example of Pixel Array Unit]

Figure 5:
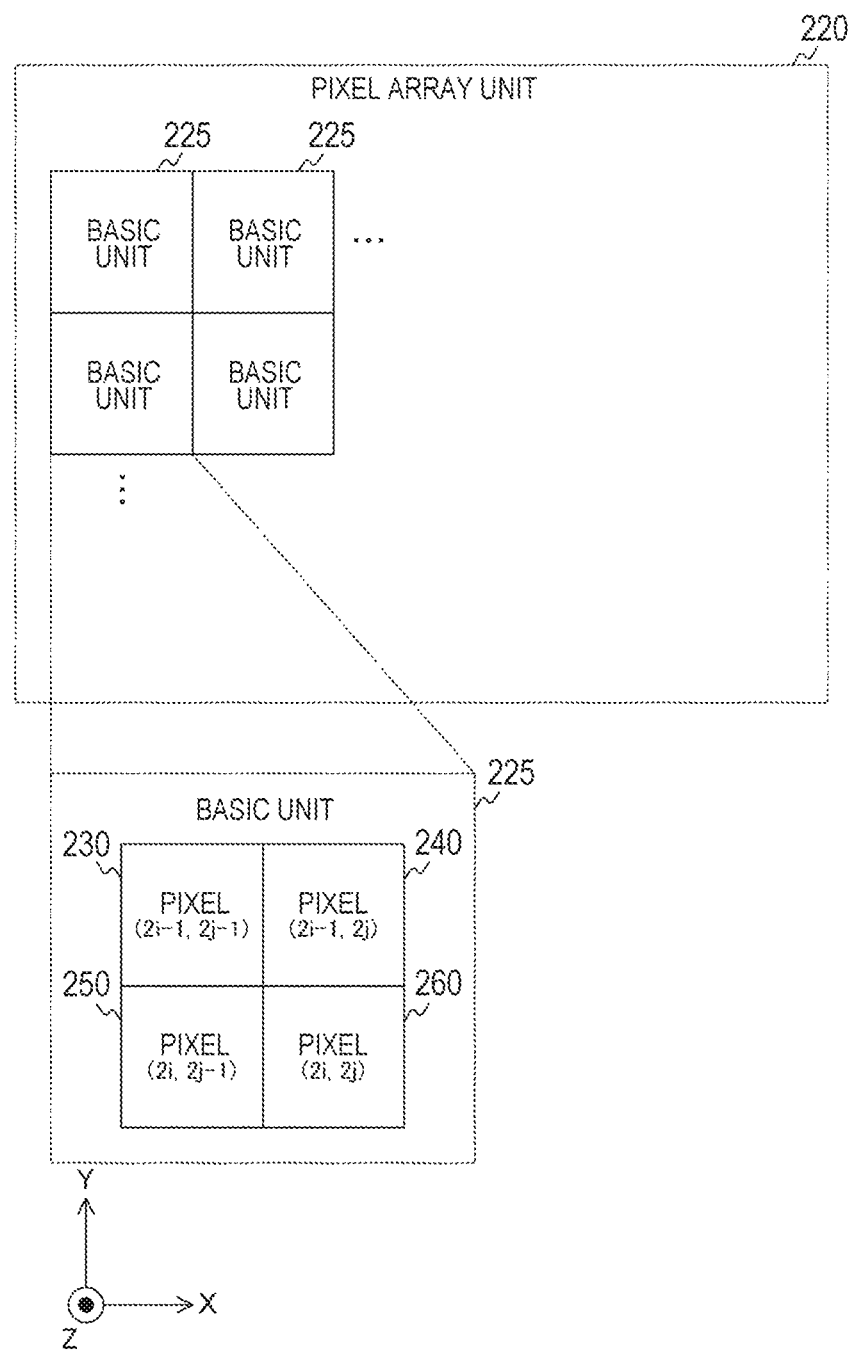
FIG. 5 is a block diagram illustrating a configuration example of a pixel array unit according to the first embodiment of the present technology.

FIG. 5 is a block diagram illustrating a configuration example of the pixel array unit 220 according to the first embodiment of the present technology. In the pixel array unit 220, a plurality of basic units 225 is arranged. In each of the basic units 225, pixels of 2 rows×2 columns are arrayed. For example, a pixel 230 is arranged in a 2i−1 row and a 2j−1 column, and a pixel 240 is arranged in the 2i−1 row and a 2j column. Furthermore, a pixel 250 is arranged in a 2i row and the 2j−1 column, and a pixel 260 is arranged in the 2i row and the 2j column. Here, i is an integer from 1 to M/2.

Furthermore, hereinafter, a row direction is defined as an X direction, a column direction is defined as a Y direction, and a direction perpendicular to the X direction and the Y direction is defined as a Z direction.

Note that the pixel 240 is an example of a first pixel described in the claims, and the pixel 230 is an example of a second pixel described in the claims. The pixel 260 is an example of a third pixel described in the claims, and the pixel 250 is an example of a fourth pixel described in the claims.

[Configuration Example of Basic Unit]

Figure 6:
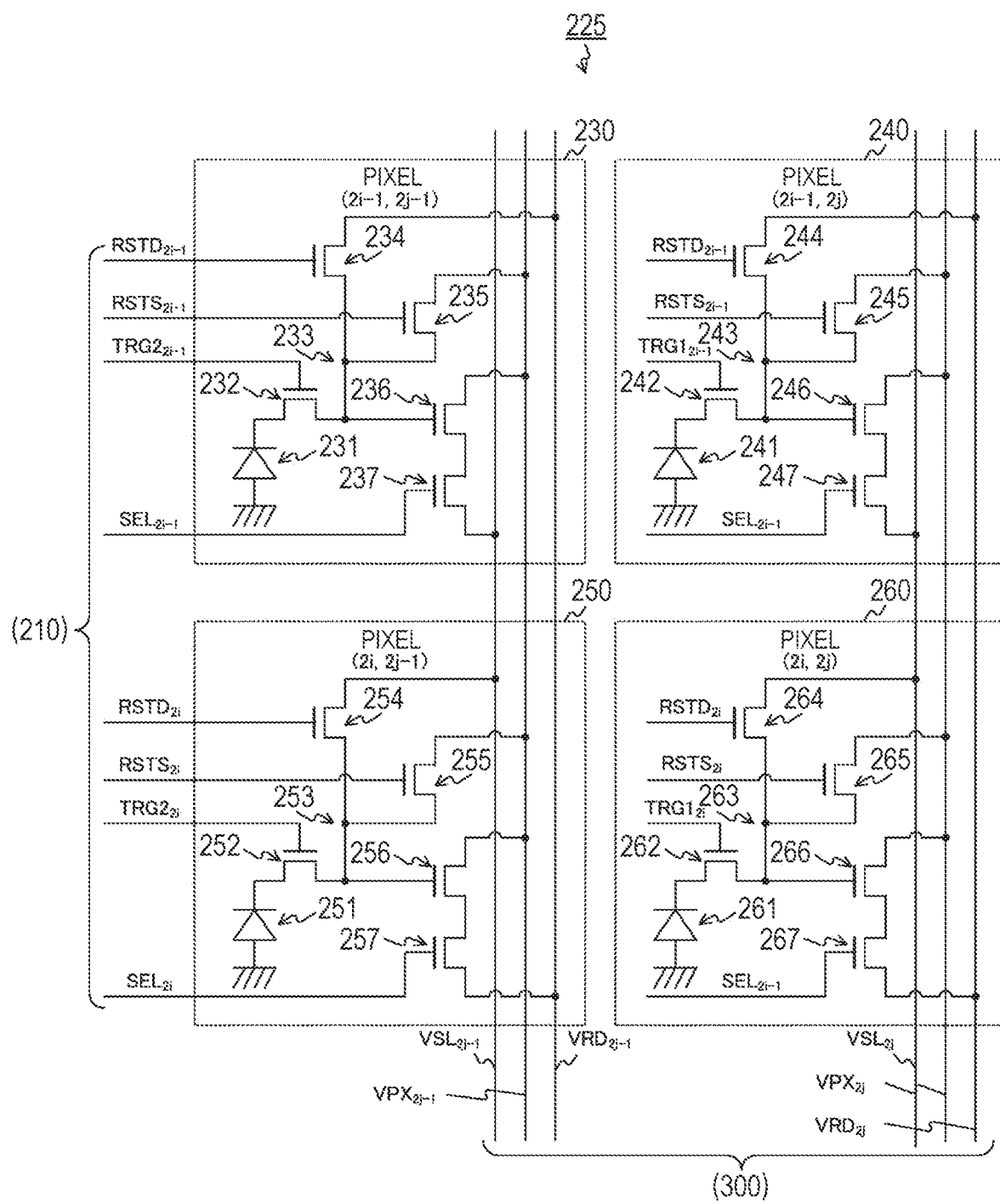
FIG. 6 is a circuit diagram illustrating a configuration example of a basic unit according to the first embodiment of the present technology.

FIG. 6 is a circuit diagram illustrating a configuration example of the basic units 225 according to the first embodiment of the present technology. In the basic unit 225, the pixel 230 includes a photodiode 231, a transfer transistor 232, a charge storage unit 233, reset transistors 234 and 235, an amplification transistor 236, and a selection transistor 237.

Furthermore, the pixel 240 includes a photodiode 241, a transfer transistor 242, a charge storage unit 243, reset transistors 244 and 245, an amplification transistor 246, and a selection transistor 247.

The pixel 250 includes a photodiode 251, a transfer transistor 252, a charge storage unit 253, reset transistors 254 and 255, an amplification transistor 256, and a selection transistor 257. The pixel 260 includes a photodiode 261, a transfer transistor 262, a charge storage unit 263, reset transistors 264 and 265, an amplification transistor 266, and a selection transistor 267.

The photodiodes 231, 241, 251, and 261 photoelectrically convert incident light to generate charges. Note that each of the photodiodes 231, 241, 251, and 261 is an example of a photoelectric conversion unit described in the claims.

The transfer transistor 232 transfers a charge from the photodiode 231 to the charge storage unit 233 according to a transfer signal $TRG2_{2i-i}$ from the vertical drive unit 210. The transfer transistor 242 transfers a charge from the photodiode 241 to the charge storage unit 243 according to a transfer signal $TRG1_{2i-1}$ from the vertical drive unit 210.

Furthermore, the transfer transistor 252 transfers a charge from the photodiode 251 to the charge storage unit 253 according to a transfer signal $TRG2_{2i}$ from the vertical drive unit 210. The transfer transistor 262 transfers a charge from the photodiode 261 to the charge storage unit 263 according to a transfer signal $TRG1_{2i}$ from the vertical drive unit 210.

The charge storage units 233, 243, 253, and 263 store the transferred charges and generate voltages corresponding to the amounts of stored charges. As the charge storage units 233, 243, 253, and 263, a floating diffusion (FD) is used, for example.

The reset transistor 234 initializes a charge amount in the charge storage unit 233 according to a reset signal $RSTD_{2i-1}$ from the vertical drive unit 210. The reset transistor 244 initializes a charge amount in the charge storage unit 243 according to the reset signal $RSTD_{2i-1}$ from the vertical drive unit 210.

Furthermore, the reset transistor 254 initializes a charge amount in the charge storage unit 253 according to a reset signal $RSTD_{2i}$ from the vertical drive unit 210. The reset transistor 264 initializes a charge amount in the charge storage unit 263 according to the reset signal $RSTD_{2i}$ from the vertical drive unit 210.

These reset transistors 234, 244, 254, and 264 are driven in the differential mode. Drive timing will be described below.

The reset transistor 235 initializes a charge amount in the charge storage unit 233 according to a reset signal $RSTS_{2i-1}$ from the vertical drive unit 210. The reset transistor 245 initializes a charge amount in the charge storage unit 243 according to the reset signal $RSTS_{2i-1}$ from the vertical drive unit 210.

Furthermore, the reset transistor 255 initializes a charge amount in the charge storage unit 253 according to a reset signal $RSTS_{2i}$ from the vertical drive unit 210. The reset transistor 265 initializes a charge amount in the charge storage unit 263 according to the reset signal $RSTS_{2i}$ from the vertical drive unit 210.

These reset transistors 235, 245, 255, and 265 are driven in the non-differential mode. Drive timing will be described below.

The amplification transistors 236, 246, 256, and 266 amplify voltage signals generated by the charge storage units.

The selection transistor 237 outputs a signal amplified by the amplification transistor 236 according to a selection signal $SEL_{2i-1}$ from the vertical drive unit 210. The selection transistor 247 outputs a signal amplified by the amplification transistor 246 according to the selection signal $SEL_{2i-1}$ from the vertical drive unit 210.

Furthermore, the selection transistor 257 outputs a signal amplified by the amplification transistor 256 according to a selection signal $SEL_{2i}$ from the vertical drive unit 210. The selection transistor 267 outputs a signal amplified by the amplification transistor 266 according to the selection signal $SEL_{2i}$ from the vertical drive unit 210.

Furthermore, a source of the reset transistor 234 is connected to the vertical signal line $VRD_{2j-1}$, and a source of the reset transistor 235 is connected to the vertical signal line $VPX_{2j-1}$. For this reason, when the high-level reset signal $RSTD_{2i-1}$ is supplied to the reset transistor 234, the charge storage unit 233 is clamped to a voltage applied via the vertical signal line $VRD_{2j-1}$ and the charge is discharged via the signal line. Furthermore, when the high-level reset signal $RSTS_{2i-1}$ is supplied to the reset transistor 235, the charge storage unit 233 is clamped to a voltage applied via the vertical signal line $VPX_{2j-1}$ and the charge is discharged via the signal line. Furthermore, in a case where the reset signals $RSTS_{2i-1}$ and $RSTD_{2i-1}$ are at a low level, the charge storage unit 233 is electrically disconnected from the vertical signal line and its potential becomes in a floating state.

A source of the amplification transistor 236 is connected to the vertical signal line $VPX_{2j-1}$, and a drain of the selection transistor 237 is connected to the vertical signal line $VSL_{2j-1}$.

A source of the reset transistor 244 is connected to the vertical signal line $VRD_{2j}$, and a source of the reset transistor 245 is connected to the vertical signal line $VPX_{2j}$. A source of the amplification transistor 246 is connected to the vertical signal line $VPX_{2j}$, and a drain of the selection transistor 247 is connected to the vertical signal line $VSL_{2j}$.

A source of the reset transistor 254 is connected to the vertical signal line $VSL_{2j-1}$, and a source of the reset transistor 255 is connected to the vertical signal line $VPX_{2j-1}$. A source of the amplification transistor 256 is connected to the vertical signal line $VPX_{2j-1}$, and a drain of the selection transistor 257 is connected to the vertical signal line $VRD_{2j-1}$.

A source of the reset transistor 264 is connected to the vertical signal line $VSL_{2j}$, and a source of the reset transistor 265 is connected to the vertical signal line $VPX_{2j}$. A source of the amplification transistor 266 is connected to the vertical signal line $VPX_{2j}$, and a drain of the selection transistor 267 is connected to the vertical signal line $VRD_{2j}$.

[Configuration Example of Column Signal Processing Unit]

Figure 7:
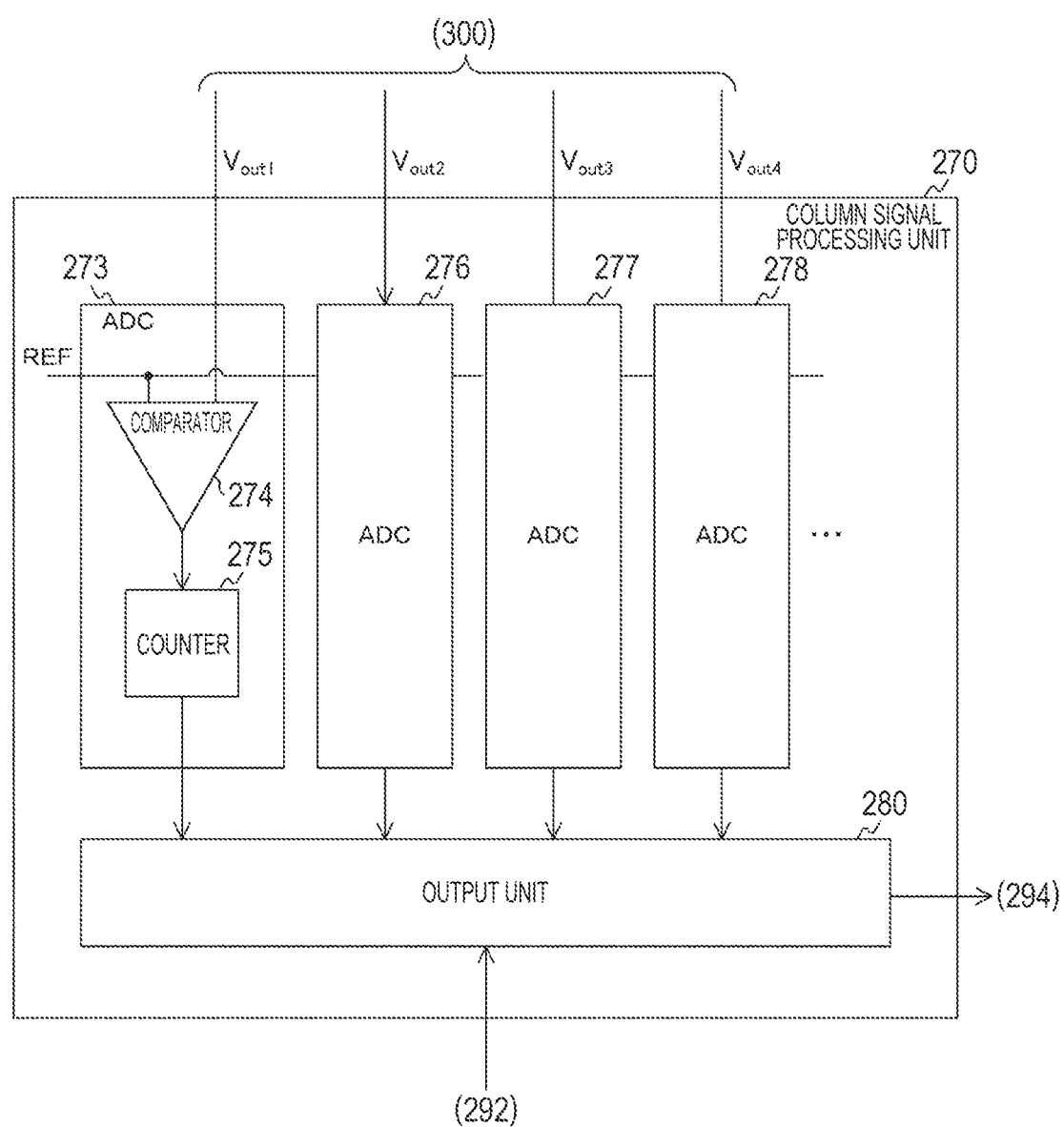
FIG. 7 is a plan view illustrating a configuration example of a column signal processing unit according to the first embodiment of the present technology.

FIG. 7 is a plan view illustrating a configuration example of the column signal processing unit 270 according to the first embodiment of the present technology. The column signal processing unit 270 includes two ADCs for every column. In a case where the number of columns is N, 2×N ADCs are provided.

ADCs 273 and 276 are arranged in the (2j−1)th column, and ADCs 277 and 278 are arranged in the 2jth column. Furthermore, an analog signal of the voltage $V_{out1}$ from the column readout circuit 300 is input to the ADC 273, and an analog signal of the voltage $V_{out2}$ from the column readout circuit 300 is input to the ADC 276. An analog signal of the voltage $V_{out3}$ from the column readout circuit 300 is input to the ADC 277, and an analog signal of the voltage $V_{out4}$ from the column readout circuit 300 is input to the ADC 278.

The ADC 273 converts the input analog signal into a digital signal. The ADC 273 includes a comparator 274 and a counter 275. Configurations of the ADCs 276, 277, and 278 are similar to the configuration of the ADC 273. Note that each of the ADCs 273, 276, 277, and 278 is an example of an analog-to-digital conversion unit described in the claims.

The comparator 274 compares the input analog signal with a reference signal REF. A sawtooth ramp signal is used as the reference signal REF, for example. The comparator 274 supplies a comparison result signal indicating a comparison result to the counter 275.

The counter 275 counts a count value within a period in which the comparison result signal is at a predetermined level. The counter 275 supplies a digital signal indicating the count value to an output unit 280 as pixel data.

The output unit 280 sequentially outputs each piece of pixel data to the image processing unit 294 according to the control of the horizontal drive unit 292.

Figure 8:
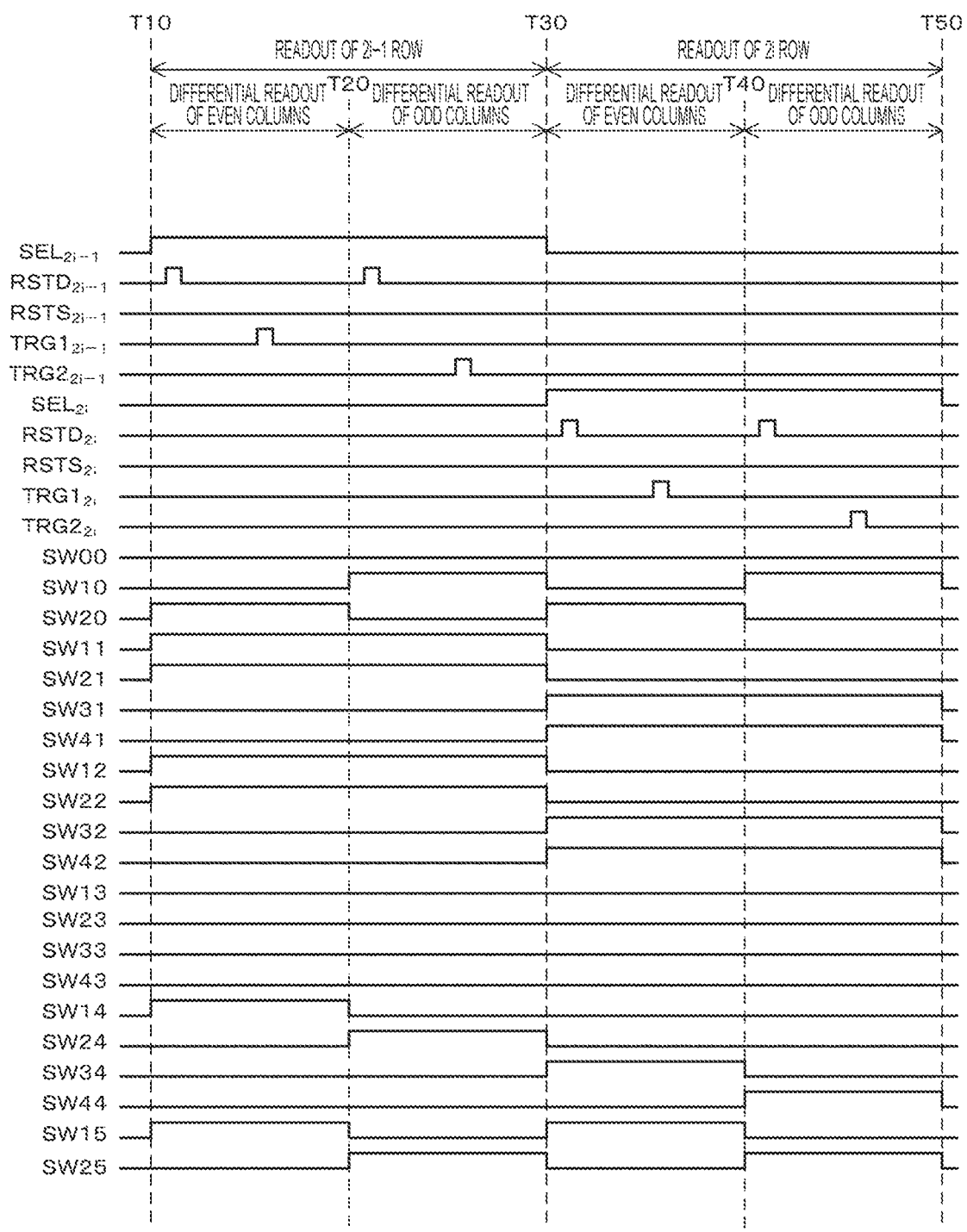
FIG. 8 is a timing chart showing an example of an operation of the solid-state image sensor in a differential mode according to the first embodiment of the present technology.

FIG. 8 is a timing chart showing an example of an operation of the solid-state image sensor 200 in the differential mode according to the first embodiment of the present technology.

Rows are sequentially selected within the period of the vertical synchronization signal VSYNC. For example, the 2i−1 row is selected in a period from timing T10 to timing T30, and the 2i row is selected in a period from the timing T30 to timing T50.

Furthermore, the even columns of the 2i−1 row are selected in a period from timing T10 to timing T20, and the odd columns of the 2i−1 row are selected in a period from the timing T20 to the timing T30. The even columns of the 2i row are selected in a period from the timing T30 to timing T40, and the odd columns of the 2i row are selected in a period from the timing T40 to the timing T50.

The vertical drive unit 210 supplies the selection signal $SEL_{2i-1}$ over the period from the timing T10 to the timing T30, and supplies the selection signal $SEL_{2i}$ over the period from the timing T30 to the timing T50.

Furthermore, the vertical drive unit 210 sequentially supplies the reset signal $RSTD_{2i-1}$ and the transfer signal $TRG1_{2i-1}$ during the selection of the even columns of the 2i−1 row. Furthermore, the system control unit 291 sequentially supplies the reset signal $RSTD_{2i-1}$ and the transfer signal $TRG2_{2i-1}$ during the selection of the odd columns of the same row.

The system control unit 291 sequentially supplies the reset signal $RSTD_{2i}$ and the transfer signal $TRG1_{2i}$ during the selection of the even columns of the 2i row. Furthermore, the system control unit 291 sequentially supplies the reset signal $RSTD_{2i}$ and the transfer signal $TRG2_{2i}$ during the selection of the odd columns of the same row.

An analog signal output by the reset signal is called "reset level". Furthermore, an analog signal output by the transfer signal is called "signal level". The output unit 280 in the column signal processing unit 270 outputs a difference between a digital signal converted from the reset level and a digital signal converted from the signal level as pixel data. Processing of performing sampling a plurality of times and obtaining a difference as described above is called correlated double sampling (CDS) processing. By the CDS processing, reset noise and fixed pattern noise peculiar to pixels caused by transistor threshold variation can be removed.

Furthermore, the system control unit 291 supplies the control signals SW11, SW21, SW12, and SW22 to the column readout circuit 300 during the selection of the 2i−1 row, and supplies the control signals SW31, SW41, SW32, and SW42 during the selection of the 2i row.

Furthermore, the system control unit 291 supplies the control signals SW20, SW14, and SW15 during the selection of the even columns of the 2i−1 row, and supplies the control signals SW10, SW24, and SW25 during the selection of the odd columns in the row.

Furthermore, the system control unit 291 supplies the control signals SW20, SW34, and SW15 during the selection of the even columns of the 2i row, and supplies the control signals SW10, SW44, and SW25 during the selection of the odd columns of the row.

By the above-described control, signals obtained by differentially amplifying the pixel signals are sequentially read out from the even and odd columns of the 2i−1 row. Next, signals obtained by differentially amplifying the pixel signals are sequentially read out from the even and odd columns of the 2i row.

Note that, in the above timing chart, the switches respectively corresponding to the plurality of control signals supplied at the same timing can be commonized to one switch to reduce the number of switches. For example, since the control signals SW11, SW21, SW12, and SW22 are supplied at the same timing, the four switches corresponding to these signals can be replaced with one switch.

Figure 9:
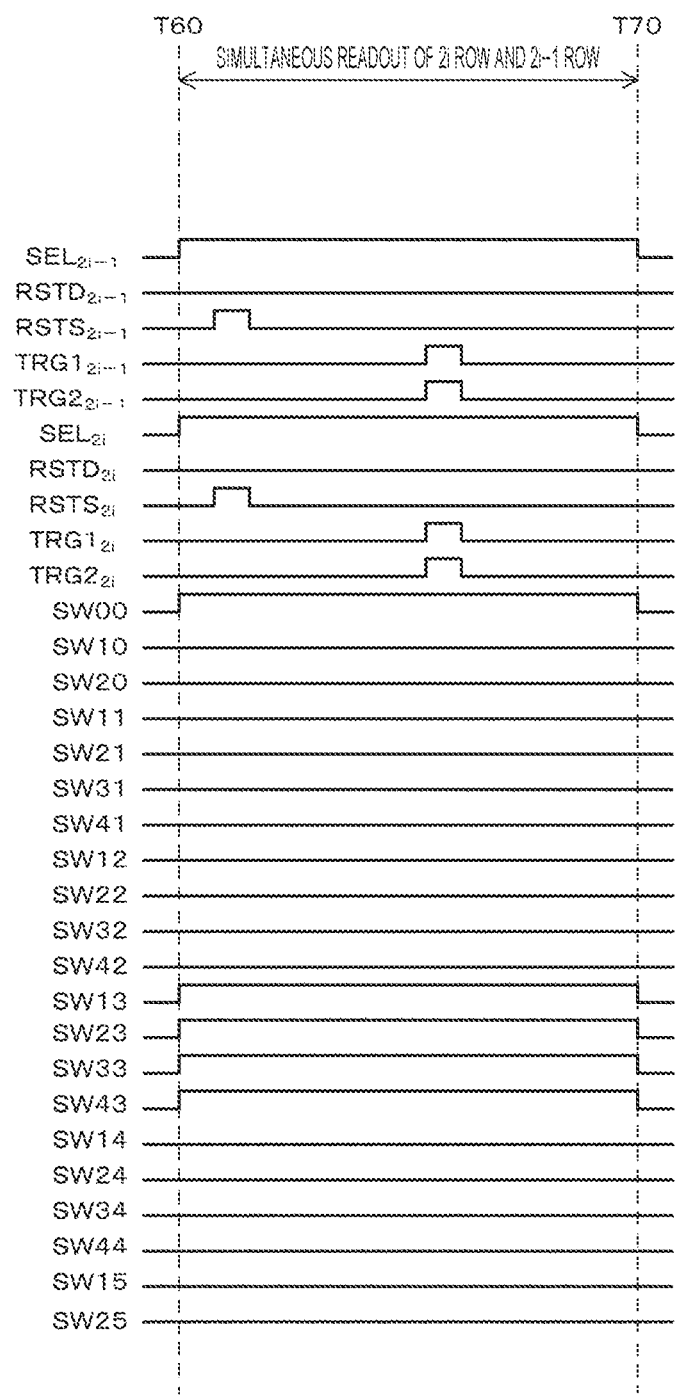
FIG. 9 is a timing chart illustrating an example of an operation of the solid-state image sensor in a non-differential mode according to the first embodiment of the present technology.

FIG. 9 is a timing chart illustrating an example of an operation of the solid-state image sensor in the non-differential mode according to the first embodiment of the present technology. Within the period of the vertical synchronization signal VSYNC, two rows are sequentially selected at a time. For example, in a period from timing T60 to timing T70, the 2i−1 row and the 2i row are simultaneously selected.

The vertical drive unit 210 supplies the selection signals $SEL_{2i-1}$ and $SEL_{2i}$ over the period from the timing T60 to the timing T70.

Furthermore, the system control unit 291 simultaneously supplies the reset signals $RSTS_{2i-1}$, and $RSTS_{2i}$ during the selection of the 2i−1 row, and then simultaneously supplies the transfer signals $TRG1_{2i-1}$, $TRG2_{2i-1}$, $TRG1_{2i}$, and $TRG2_{2i}$.

Furthermore, the system control unit 291 supplies the control signals SW00, SW13, SW23, SW33, and SW43 to the column readout circuit 300 during the selection of the 2i−1 row and the 2i row.

By the above-described control, the pixel signals are simultaneously read from the 2i−1 row and the 2i row. Since two rows are simultaneously read out in this way, the readout speed can be made faster than a case of reading out one row at a time.

Figure 10:
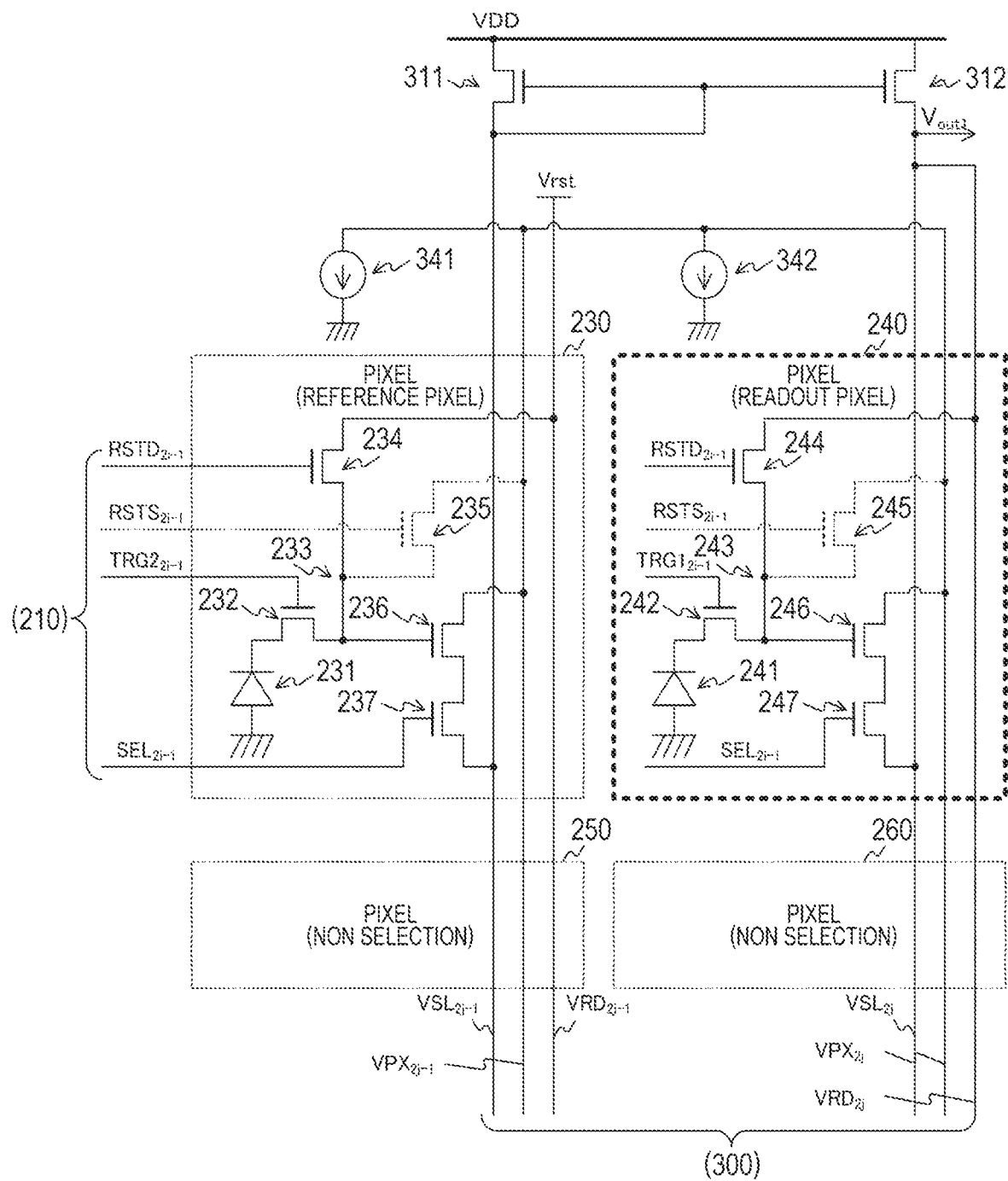
FIG. 10 is a diagram illustrating an example of respective states of the basic unit and the unit readout circuit of when performing first differential readout according to the first embodiment of the present technology.

FIG. 10 is a diagram illustrating an example of respective states of the basic unit 225 and the unit readout circuit 310 of when performing first differential readout according to the first embodiment of the present technology. In the basic unit 225, the pixel 240 is first selected as a readout pixel, and the adjacent pixel 230 is selected as a reference pixel. Here, the readout pixel is a target pixel from which a pixel signal is read out. The reference pixel is a pixel that outputs a reference signal for comparison with the signal from the readout pixel when differential amplification is performed.

The unit readout circuit 310 connects the vertical signal lines $VSL_{2j-1}$, $VSL_{2j}$, and $VRD_{2j}$ to the current mirror circuit including the n-type transistors 311 and 312. Furthermore, the unit readout circuit 310 connects the vertical signal lines $VPX_{2j-1}$ and $VPX_{2j}$ to the current sources 341 and 342, and connects the vertical signal line $VRD_{2j-1}$ to the reset power supply. Note that the unit readout circuit 310 is an example of a connection control unit described in the claims.

Furthermore, the vertical drive unit 210 supplies various drive signals excluding the reset signal $RSTS_{2i-1}$ to the 2i−1 row. Since the reset signal $RSTS_{2i-1}$ is not supplied, the reset transistors 235 and 245 do not operate.

By such control, the readout pixel and the reference pixel operate as a differential amplifier circuit, and a signal of the voltage $V_{out1}$ obtained by amplifying the difference between the pixel signals is output.

Figure 11:
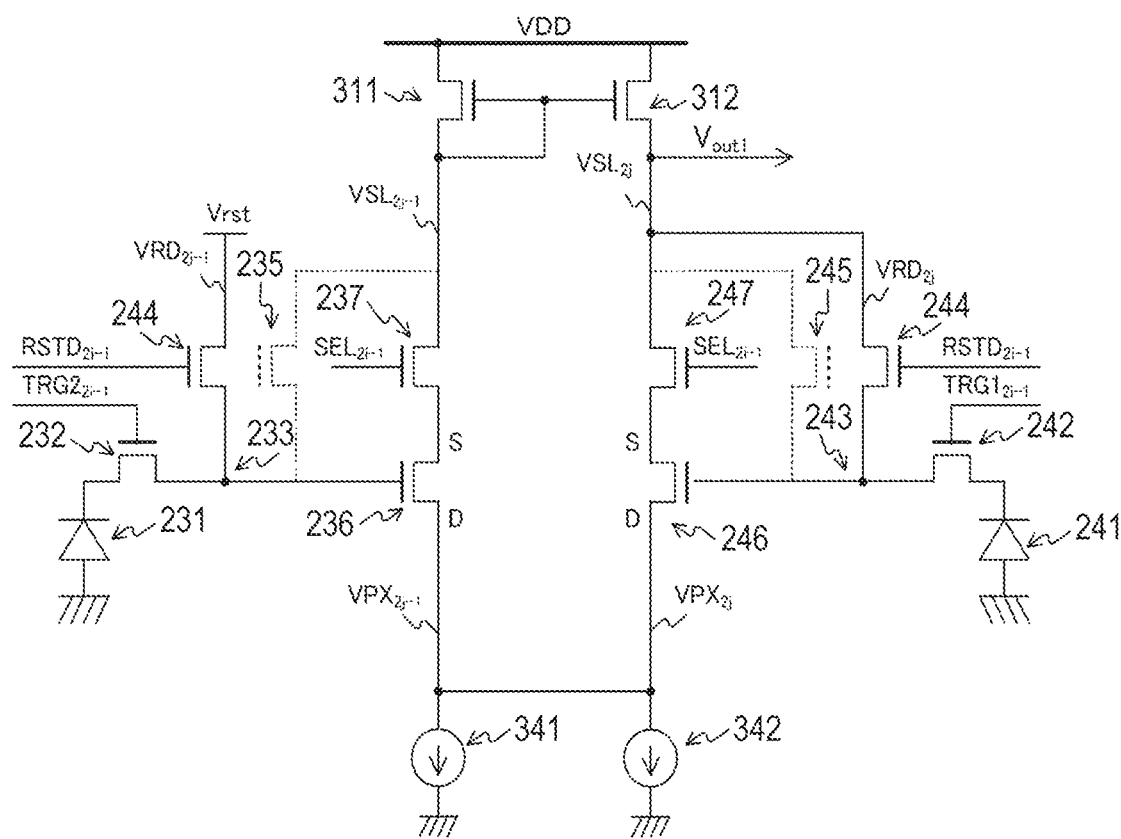
FIG. 11 is a diagram in which the basic unit and the unit readout circuit of when performing the first differential readout according to the first embodiment of the present technology are simplified.

FIG. 11 is a diagram in which the basic unit 225 and the unit readout circuit 310 of when performing the first differential readout according to the first embodiment of the present technology are simplified. As illustrated in FIG. 11, the selection transistors 237 and 247 function as a differential pair, and a signal of the voltage $V_{out1}$ obtained by differentially amplifying the input signals of the selection transistors 237 and 247 is output.

Here, if the vertical drive unit 210 drives the reset transistor 235 in the differential mode, the reset transistor 235 is reset by the power supply voltage VDD that is higher than the reset voltage Vrst and cannot increase the amplitude of the signal. Therefore, the reset transistor 244 connected to the reset power supply is provided separately from the reset transistor 235, and the vertical drive unit 210 drives the reset transistor 244 in the differential mode.

Figure 12:
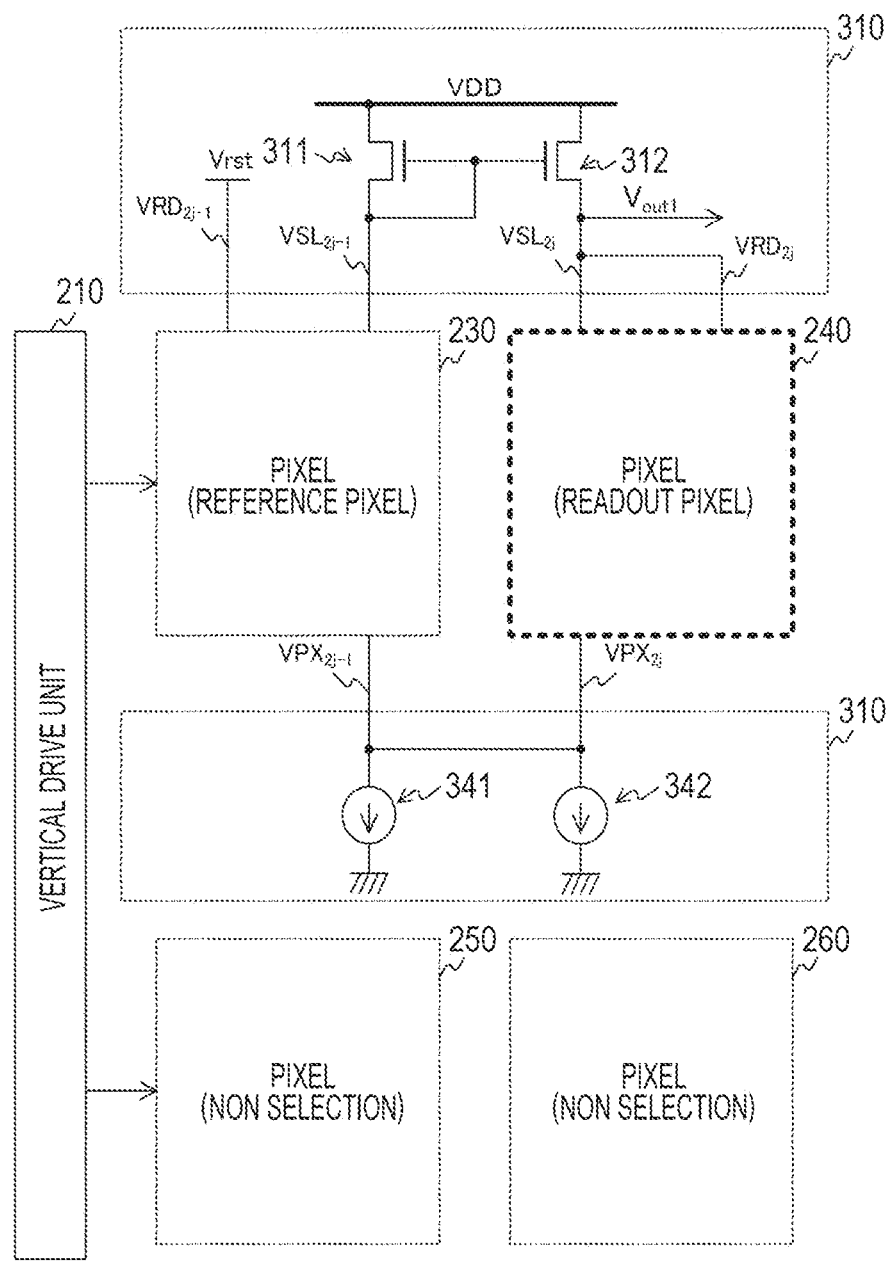
FIG. 12 is a diagram for describing connection destinations of signal lines of when performing the first differential readout according to the first embodiment of the present technology.

FIG. 12 is a diagram for describing connection destinations of signal lines of when performing the first differential readout according to the first embodiment of the present technology. As illustrated in FIG. 12, the unit readout circuit 310 connects the reference pixel (pixel 230) to the reset power supply via the vertical signal line $VRD_{2j-1}$. Furthermore, the unit readout circuit 310 connects the reference pixel and the readout pixel (pixel 240) to the current sources 341 and 342 via the vertical signal lines $VPX_{2j-1}$ and $VPX_{2j}$. Furthermore, the unit readout circuit 310 connects the reference pixel and the readout pixel to the current mirror circuit via the vertical signal lines $VSL_{2j-1}$, $VSL_{2j}$, and $VRD_{2j}$.

Furthermore, the vertical drive unit 210 drives the reference pixel and the readout pixel, and outputs a signal obtained by differentially amplifying the pixel signals via the vertical signal line $VSL_{2j}$.

Figure 13:
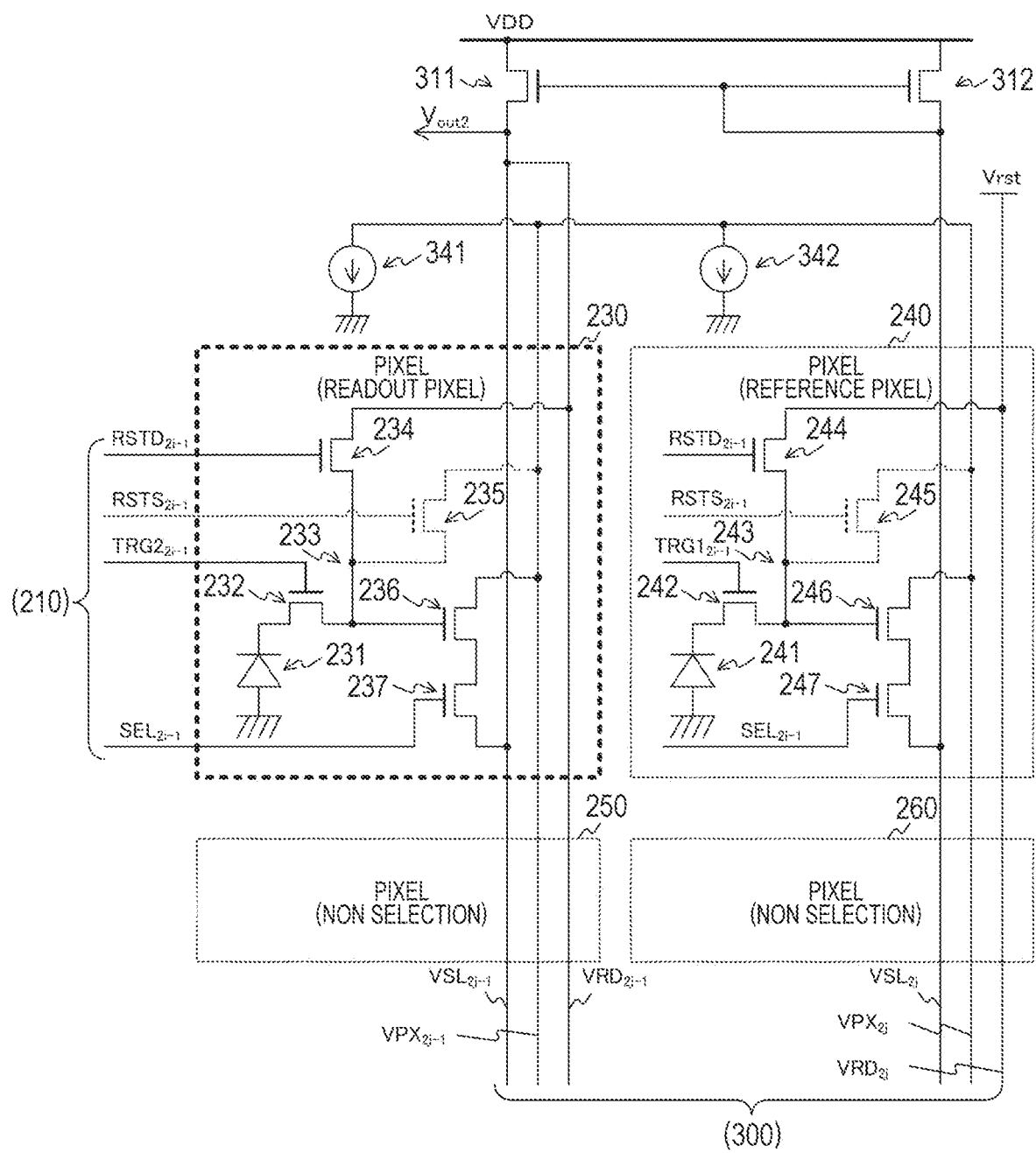
FIG. 13 is a diagram illustrating an example of respective states of the basic unit and the unit readout circuit of when performing second differential readout according to the first embodiment of the present technology.

FIG. 13 is a diagram illustrating an example of respective states of the basic unit 225 and the unit readout circuit 310 of when performing second differential readout according to the first embodiment of the present technology. As illustrated in FIG. 13, in the basic unit 225, the pixel 230 is selected as the readout pixel, and the adjacent pixel 240 is selected as the reference pixel.

The unit readout circuit 310 connects the vertical signal lines $VSL_{2j-1}$, $VSL_{2j}$, and $VRD_{2j-1}$ to the current mirror circuit. Furthermore, the unit readout circuit 310 connects the vertical signal lines $VPX_{2j-1}$ and $VPX_{2j}$ to the current sources 341 and 342, and connects the vertical signal line $VRD_{2j}$ to the reset power supply.

As described with reference to FIGS. 10 to 13, the unit readout circuit 310 sequentially performs the control of connecting the pixel 230 to the reset power supply via the vertical signal $VRD_{2j-1}$, and the control of connecting the pixel 240 to the reset power supply via the vertical signal $VRD_{2j}$. Thus, the vertical signal lines $VDR_{2j-1}$ and $VRD_{2j}$ are used for supplying the reset power in the differential mode.

Figure 14:
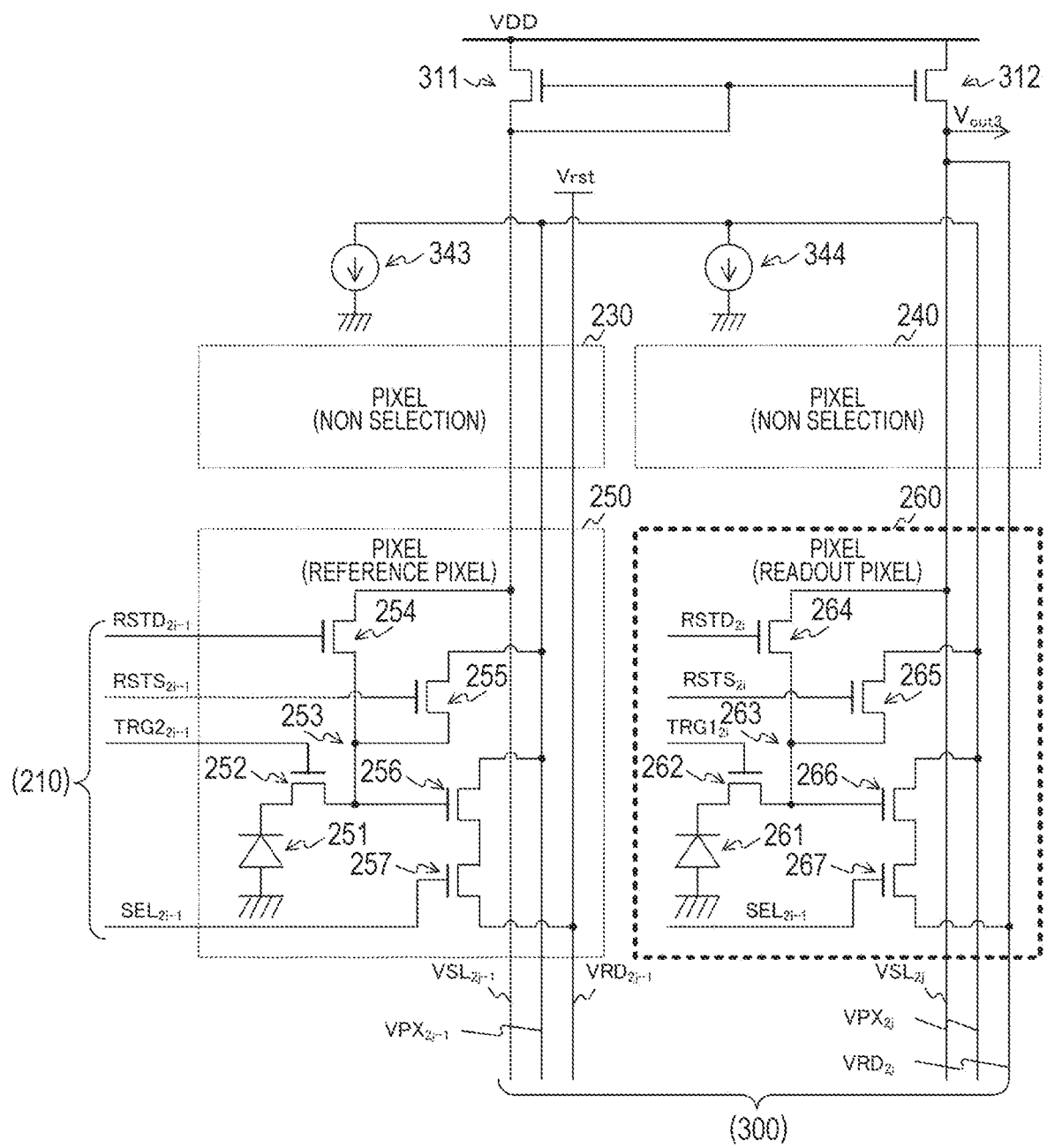
FIG. 14 is a diagram illustrating an example of respective states of the basic unit and the unit readout circuit of when performing third differential readout according to the first embodiment of the present technology.

FIG. 14 is a diagram illustrating an example of respective states of the basic unit 225 and the unit readout circuit 310 of when performing third differential readout according to the first embodiment of the present technology. As illustrated in FIG. 14, in the basic unit 225, the pixel 260 is selected as the readout pixel, and the adjacent pixel 250 is selected as the reference pixel.

The unit readout circuit 310 connects the vertical signal lines $VSL_{2j-1}$, $VSL_{2j}$, and $VRD_{2j}$ to the current mirror circuit. Furthermore, the unit readout circuit 310 connects the vertical signal lines $VPX_{2j-1}$ and $VPX_{2j}$ to the current sources 343 and 344, and connects the vertical signal line $VRD_{2j-1}$ to the reset power supply.

Figure 15:
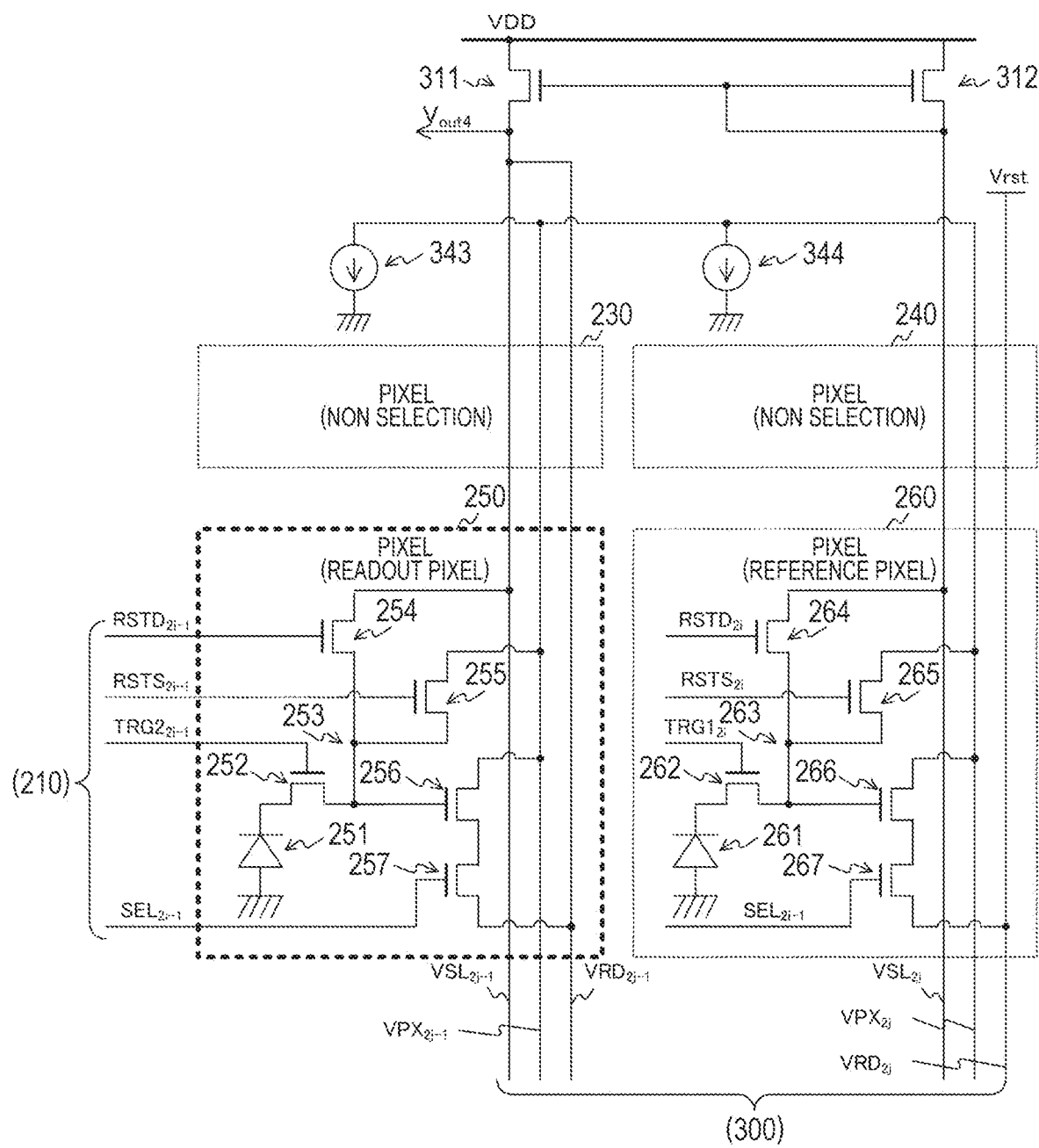
FIG. 15 is a diagram illustrating an example of respective states of the basic unit and the unit readout circuit of when performing fourth differential readout according to the first embodiment of the present technology.

FIG. 15 is a diagram illustrating an example of respective states of the basic unit 225 and the unit readout circuit 310 of when performing fourth differential readout according to the first embodiment of the present technology. As illustrated in FIG. 15, in the basic unit 225, the pixel 250 is selected as the readout pixel, and the adjacent pixel 260 is selected as the reference pixel.

The unit readout circuit 310 connects the vertical signal lines $VSL_{2j-1}$, $VSL_{2j}$, and $VRD_{2j-1}$ to the current mirror circuit. Furthermore, the unit readout circuit 310 connects the vertical signal lines $VPX_{2j-1}$ and $VPX_{2j}$ to the current sources 343 and 344, and connects the vertical signal line $VRD_{2j}$ to the reset power supply.

Figure 16:
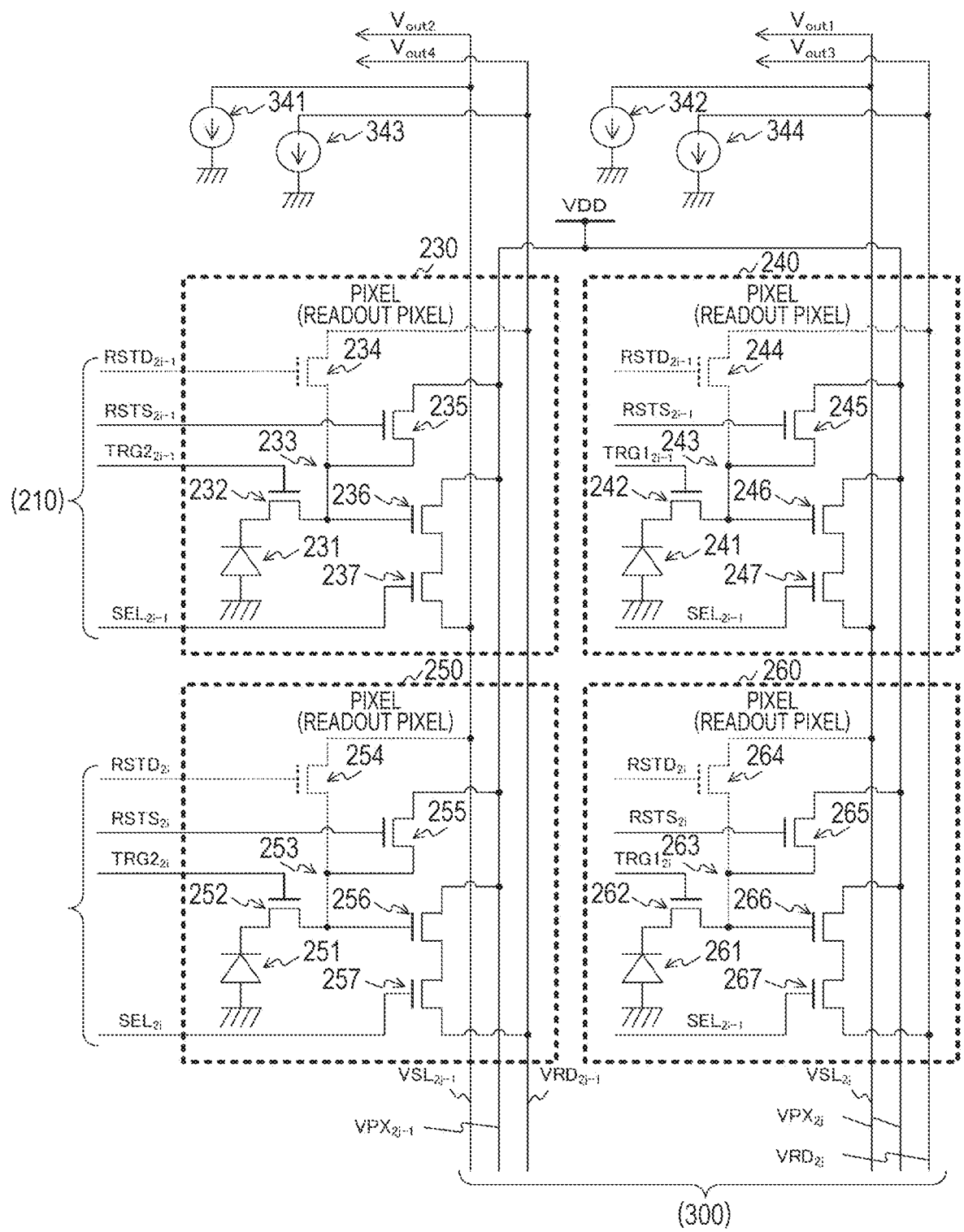
FIG. 16 is a diagram illustrating an example of respective states of the basic unit and the unit readout circuit of when performing readout in a non-differential mode according to the first embodiment of the present technology.

FIG. 16 is a diagram illustrating an example of respective states of the basic unit 225 and the unit readout circuit 310 of when performing readout in a non-differential mode according to the first embodiment of the present technology. The unit readout circuit 310 connects the vertical signal lines $VSL_{2j-1}$, $VRD_{2j-1}$, $VSL_{2j}$, and $VRD_{2j}$ to the current sources 341, 343, 342, and 344, respectively. Furthermore, the unit readout circuit 310 connects the vertical signal lines $VPX_{2j-1}$ and $VPX_{2j}$ to the power supply.

Furthermore, the vertical drive unit 210 supplies various drive signals excluding the reset signals $RSTD_{2i-1}$ and $RSTD_{2i}$ to the 2i–1 row. Since the reset signals $RSTD_{2i-1}$ and $RSTD_{2i}$ are not supplied, the reset transistors 234, 244, 254 and 265 do not operate. By such control, pixel signals are simultaneously output from two selected rows.

FIG. 17 is a diagram in which the basic unit 225 and the unit readout circuit 310 of when performing readout in the non-differential mode according to the first embodiment of the present technology are simplified. As illustrated in FIG. 17, a source follower circuit is formed in each pixel.

Figure 18:
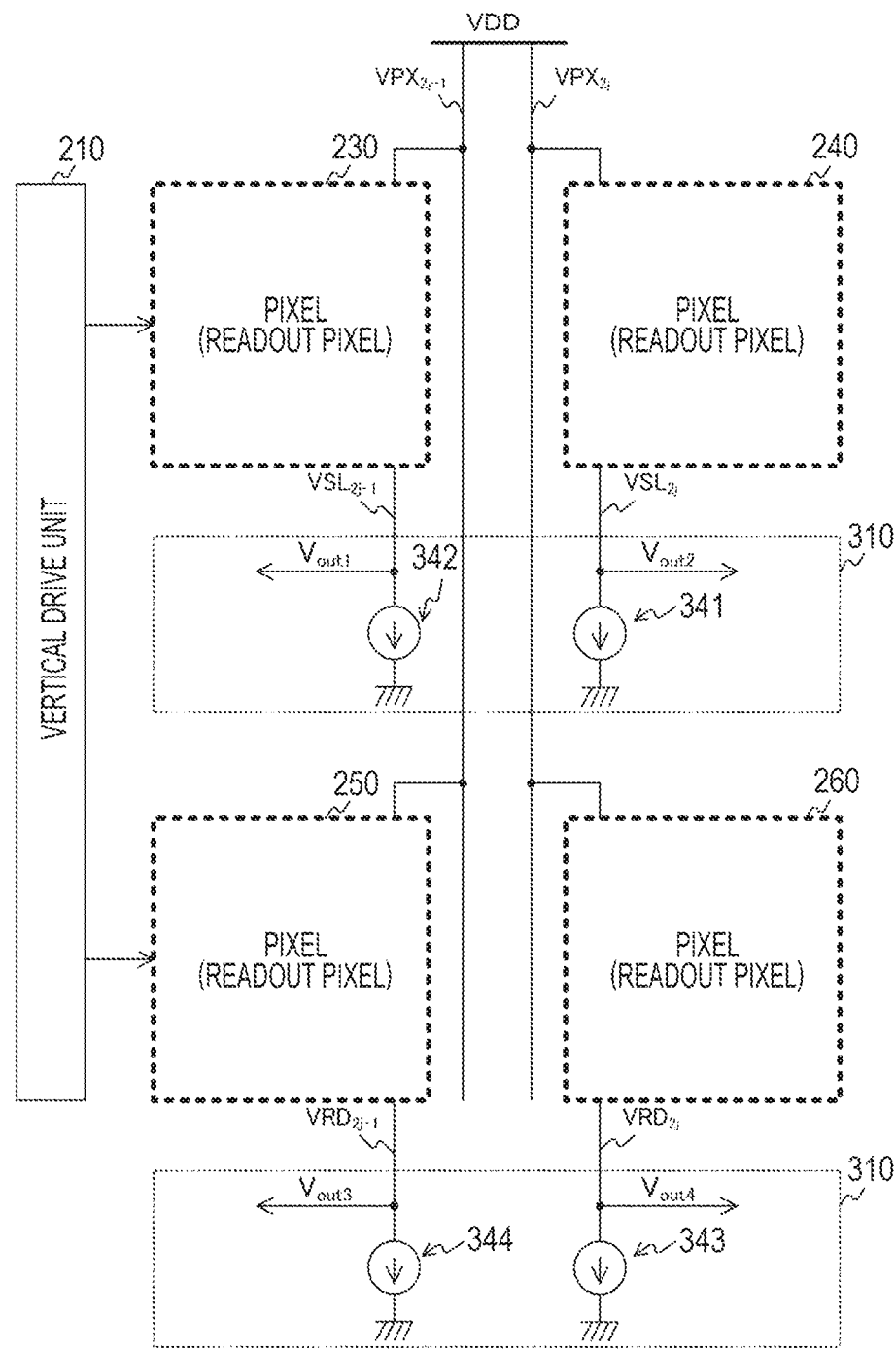
FIG. 18 is a diagram for describing connection destinations of signal lines of when performing the differential readout in the non-differential mode according to the first embodiment of the present technology.

FIG. 18 is a diagram for describing connection destinations of signal lines of when performing the readout in the non-differential mode according to the first embodiment of the present technology. As illustrated in FIG. 18, the unit readout circuit 310 connects the pixels 230 and 240 to the current sources 342 and 341 via the vertical signal lines $VSL_{2j-1}$ and $VSL_{2j}$, respectively. Furthermore, the unit readout circuit 310 connects the pixels 250 and 260 to the current sources 344 and 343 via the vertical signal lines $VRD_{2j-1}$ and $VRD_{2j}$, respectively. Furthermore, the unit readout circuit 310 connects the pixels 230, 240, 250, and 260 to the power supply via the vertical signal lines $VPX_{2j-1}$ and $VPX_{2j}$.

In the non-differential mode, the pixels 230 and 240 do not need to be connected to the current mirror circuit, unlike the differential mode. Therefore, the vertical signal lines $VSL_{2j-1}$ and $VSL_{2j}$, which have been used for connection to the current mirror circuit, can be used for outputting the respective pixel signals of the pixels 230 and 240.

Furthermore, in the non-differential mode, supply of the reset power is not necessary, unlike the differential mode. Therefore, the vertical signal lines $VRD_{2j-1}$ and $VRD_{2j}$, which have been used for supplying the reset power in the differential mode, are not used in the pixels 230 and 240 in the non-differential mode and are left behind. If these vertical signal lines are left disconnected to pixels, the solid-state image sensor can read pixel signals of only one row at a time.

Therefore, in the solid-state image sensor 200, these remaining vertical signal lines $VRD_{2j-1}$ and $VRD_{2j}$ are used for outputting the respective pixel signals of the pixels 250 and 260. In this way, by using the two vertical signal lines, which are not used by the upper two pixels in the non-differential mode, for outputting the pixel signals of the lower two pixels, the vertical signal lines are effectively utilized, and two rows can be simultaneously read out.

Figure 19:
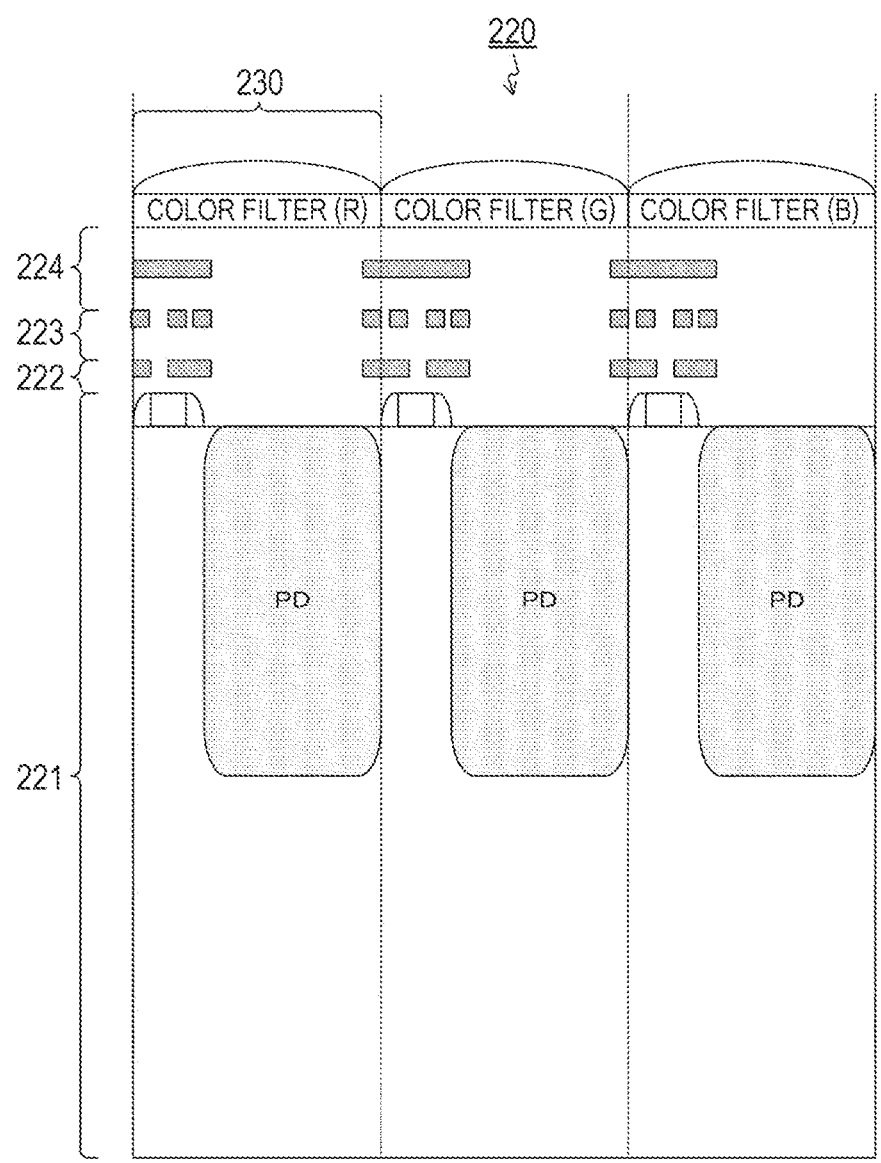
FIG. 19 is an example of a cross-sectional view of the pixel array unit according to the first embodiment of the present technology.

FIG. 19 is an example of a cross-sectional view of the pixel array unit 220 according to the first embodiment of the present technology. The pixel array unit 220 is provided with a ground-side vertical wiring layer 224 below a microlens and a horizontal wiring layer 223 below the ground-side vertical wiring layer 224, where the direction toward a light receiving surface is upward on the Z axis. Furthermore, a power supply-side vertical wiring layer 222 is provided below the horizontal wiring layer 223, and a photoelectric conversion layer 221 is provided below the power supply-side vertical wiring layer 222. As described above, in the solid-state image sensor 200 having the wiring layers such as the power supply-side vertical wiring layer 222 arranged between the microlens and the photoelectric conversion layer 221, a front surface of the substrate is irradiated with light, the front surface being a surface on the side of the wiring layers. Such a solid-state image sensor is called front surface irradiation-type solid-state image sensor.

FIG. 20 is a plan view illustrating a configuration example of the photoelectric conversion layer 221 according to the first embodiment of the present technology. In the photoelectric conversion layer 221, the photodiode 231 and the FD 233 are arranged in the pixel 230, and the transfer transistor 232 is arranged between the photodiode 231 and the FD 233. Furthermore, the reset transistors 234 and 235 are arrayed along the X direction on both sides of the FD 233. The amplification transistor 236 and the selection transistor 237 are arrayed along the Y direction. The layout of each of the pixels 240, 250 and 260 is similar to the layout of the pixel 230.

Figure 21:
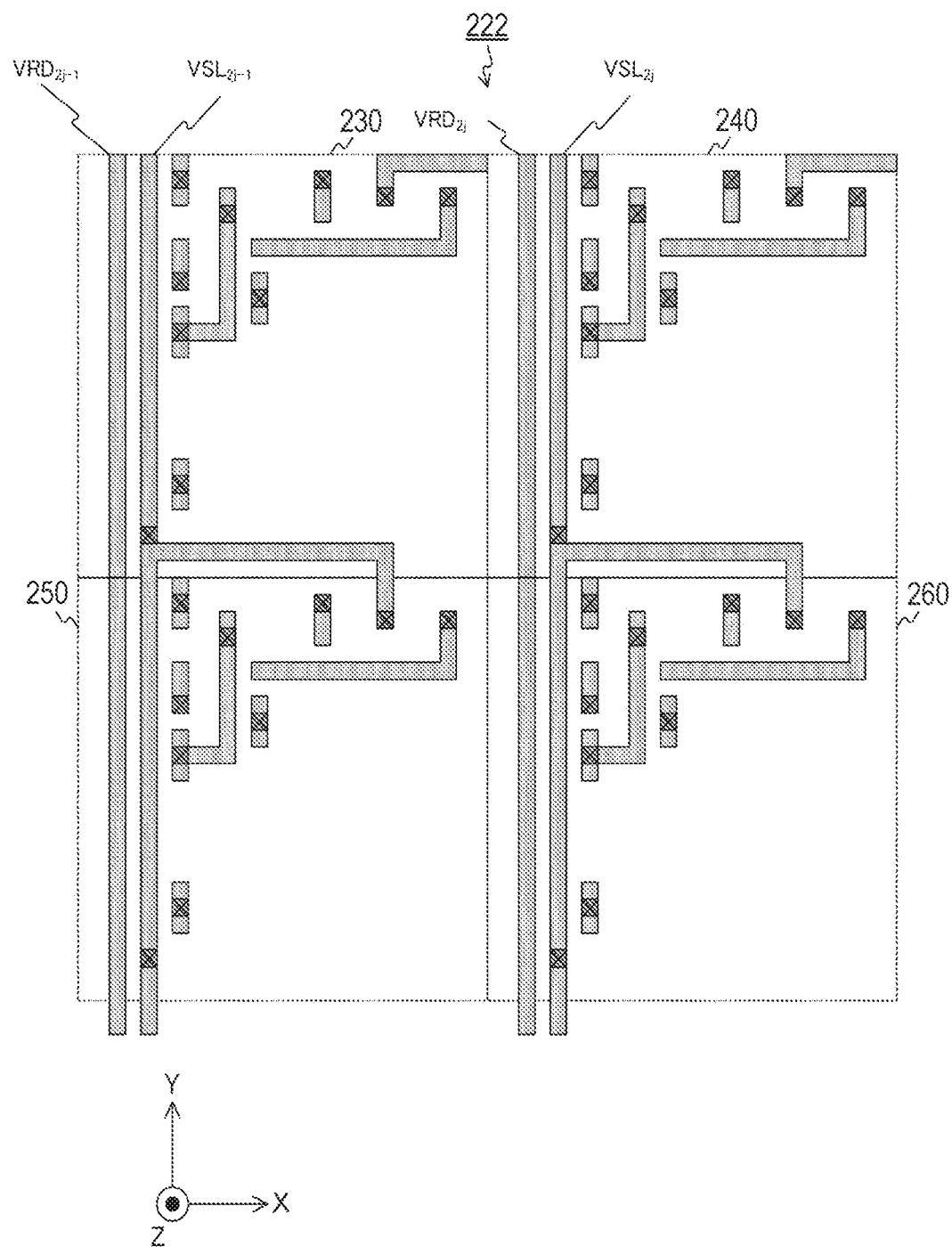
FIG. 21 is a plan view illustrating an example of a wiring layout of a power supply-side vertical wiring layer according to the first embodiment of the present technology.

FIG. 21 is a plan view illustrating an example of a wiring layout of the power supply-side vertical wiring layer 222 according to the first embodiment of the present technology. In the pixel 230 and the pixel 250, the vertical signal lines $VRD_{2j-1}$ and $VSL_{2j-1}$ are wired along the Y direction (column direction). Furthermore, in the pixels 240 and 260, the vertical signal lines $VRD_{2j}$ and $VSL_{2j}$ are wired along the Y direction.

Figure 22:
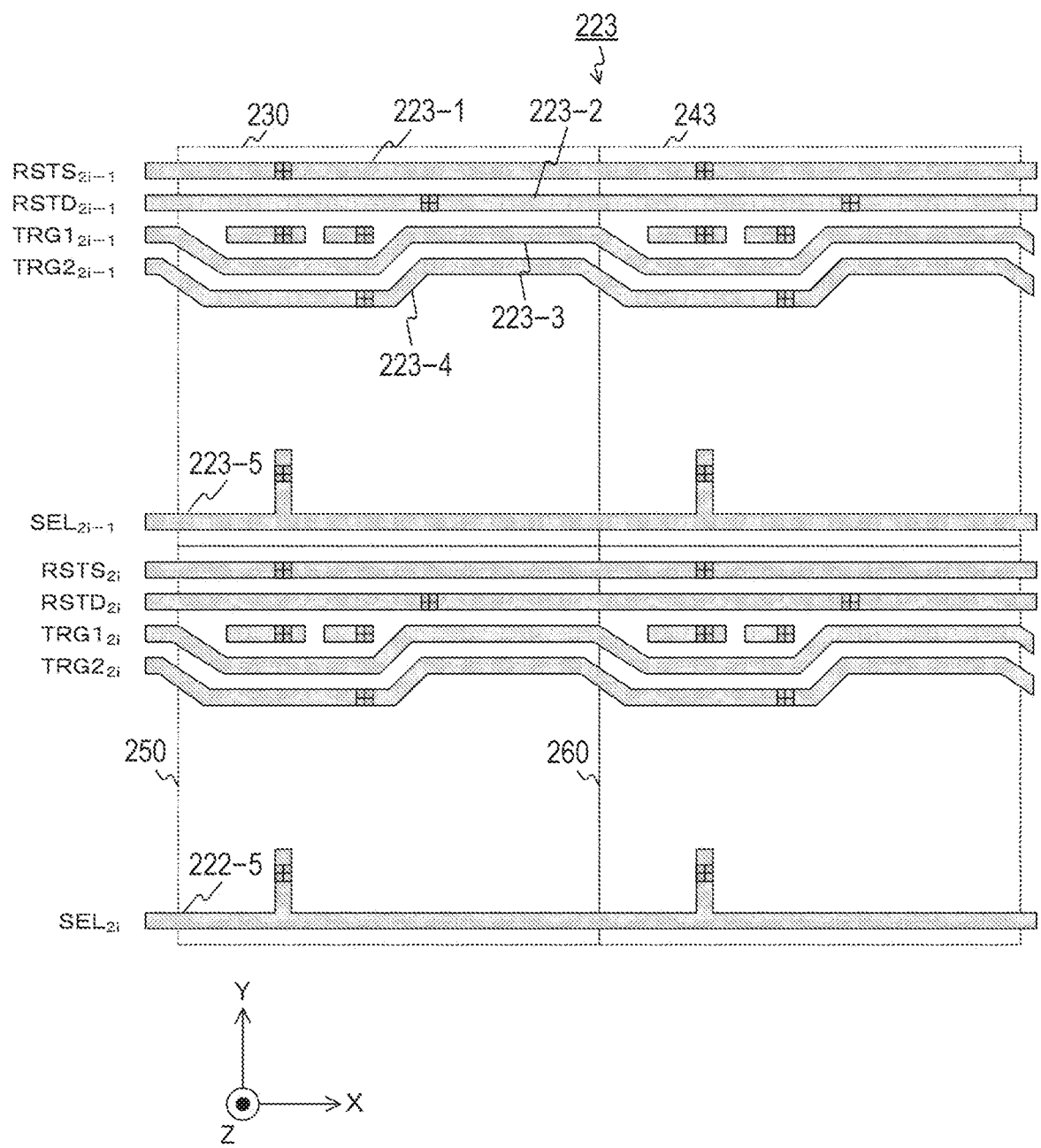
FIG. 22 is a plan view illustrating an example of a wiring layout of a horizontal wiring layer according to the first embodiment of the present technology.

FIG. 22 is a plan view illustrating an example of a wiring layout of the horizontal wiring layer 223 according to the first embodiment of the present technology. In the pixel 230 and the pixel 240, horizontal signal lines 223-1, 223-2, 223-3, 223-4, and 223-5 are wired along the X direction (row direction). Similarly, in the pixels 250 and 260, five horizontal signal lines are wired. The horizontal signal line 223-1 transmits the reset signal $RSTS_{2i}$ or $RSTS_{2i-1}$. The horizontal signal line 223-2 transmits the reset signal $RSTD_{2i}$ or $RSTD_{2i-1}$. The horizontal signal line 223-3 transmits the transfer signal $TRG1_{2i}$ or $TRG1_{2i-1}$. The horizontal signal line 223-4 transmits the transfer signal $TRG2_{2i}$ or $TRG2_{2i-1}$. The horizontal signal line 223-5 transmits the selection signal $SEL_{2i}$ or $SEL_{2i-1}$.

Figure 23:
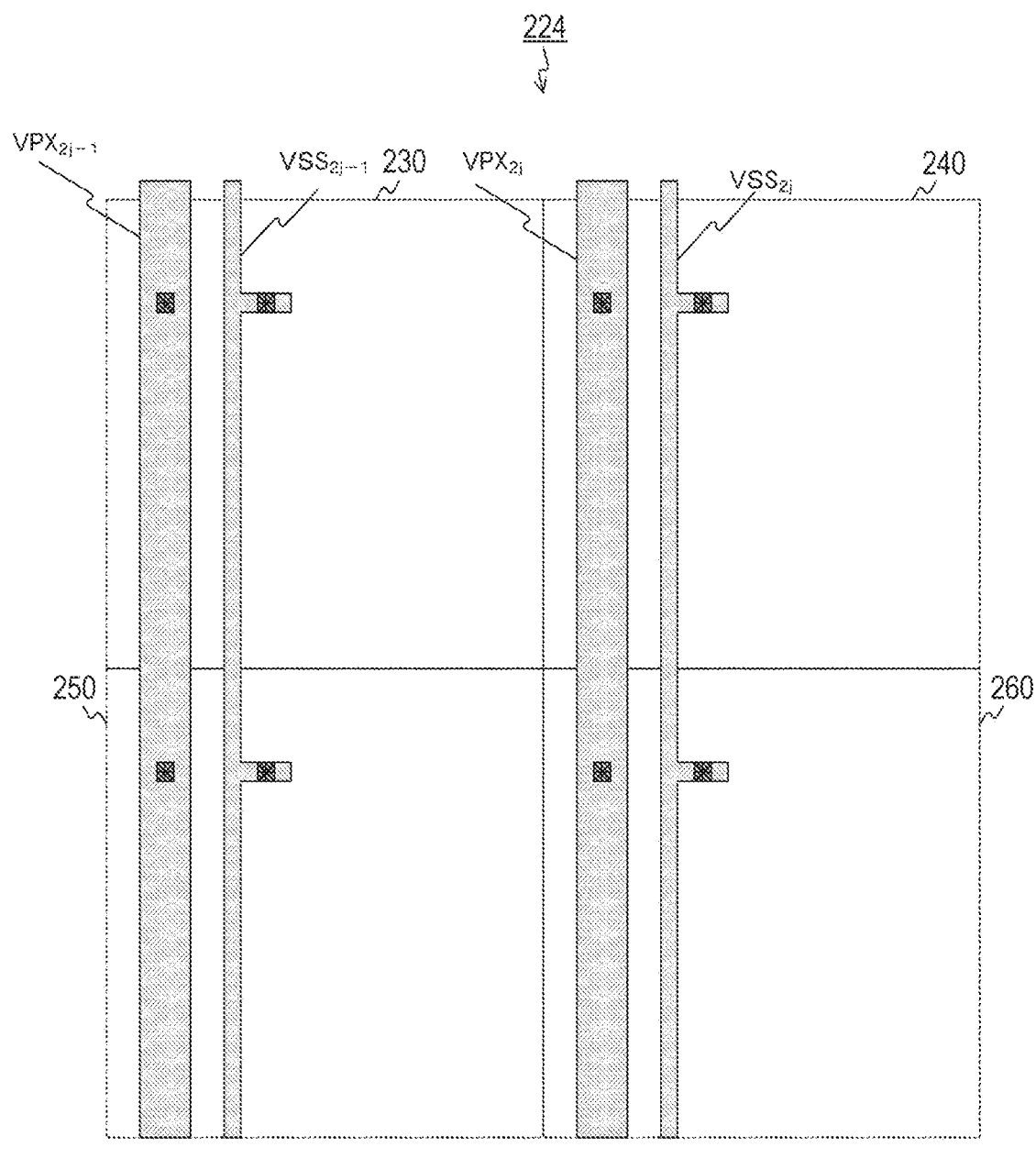
FIG. 23 is a plan view illustrating an example of a wiring layout of a ground-side vertical wiring layer according to the first embodiment of the present technology.

FIG. 23 is a plan view illustrating an example of a wiring layout of the ground-side vertical wiring layer 224 according to the first embodiment of the present technology. In the pixels 230 and 250, the vertical signal line $VPX_{2j-1}$ and a ground line $VSS_{2j-1}$ are wired along the Y direction. In the pixels 240 and 260, the vertical signal line $VPX_{2j}$ and a ground line $VSS_{2j}$ are wired along the Y direction.

[Operation Example of Solid-State Image Sensor]

Figure 24:
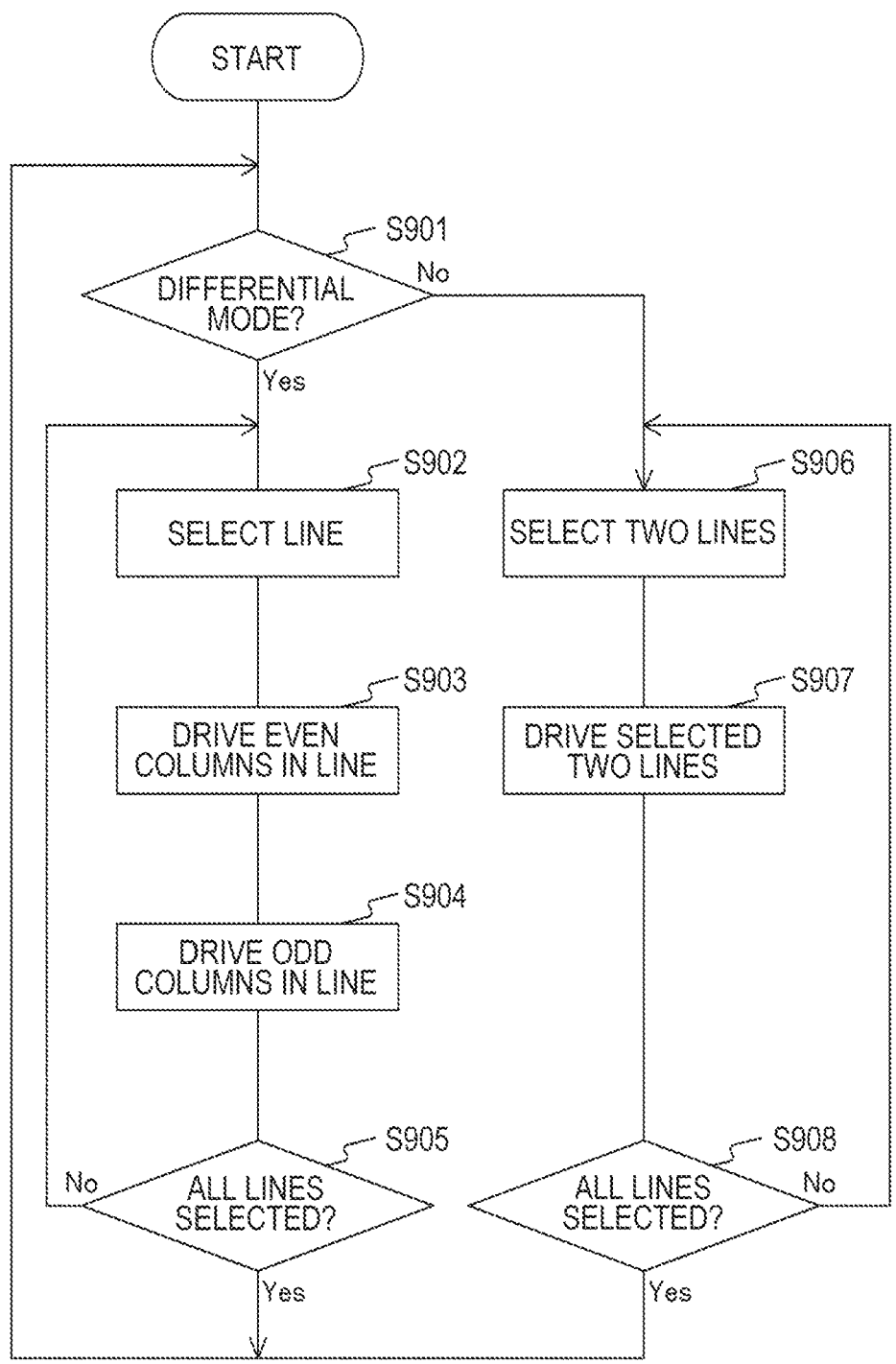
FIG. 24 is a flowchart illustrating an example of an operation of a solid-state image sensor according to the first embodiment of the present technology.

FIG. 24 is a flowchart illustrating an example of an operation of the solid-state image sensor 200 according to the first embodiment of the present technology. This operation is started when, for example, a predetermined application for capturing image data is executed.

The solid-state image sensor 200 determines whether or not the current mode is the differential mode (step S901). In a case where the current mode is the differential mode (step S901: Yes), the solid-state image sensor 200 selects one line (step S902). Then, the solid-state image sensor 200 drives even columns in the selected line (step S903), and then drives odd columns (step S904). Then, the solid-state image sensor 200 determines whether or not all of lines has been selected (step S905). In a case of having selected all the lines (step S905: Yes), the solid-state image sensor 200 repeats step S901 and the subsequent steps. In a case of not having selected all the lines (step S905: No), the solid-state image sensor 200 repeatedly executes step S902 and the subsequent steps.

Meanwhile, in a case where the current mode is the non-differential mode (step S901: No), the solid-state image sensor 200 selects two lines (step S906) and drives the two lines simultaneously (step S907). Then, the solid-state image sensor 200 determines whether or not all of lines has been selected (step S908). In a case of having selected all the lines (step S908: Yes), the solid-state image sensor 200 repeats step S901 and the subsequent steps. In a case of not having selected all the lines (step S908: No), the solid-state image sensor 200 repeatedly executes step S906 and the subsequent steps.

As described above, in the first embodiment of the present technology, the unit readout circuit 310 connects the vertical signal lines $VRD_{2j-1}$ and $VRD_{2j}$ to the pixels 250 and 260 in the non-differential mode, thereby simultaneously reading out the pixel signals from two rows including the pixels 250 and 260. As a result, the readout speed can be made faster than the case of reading a pixel signal row by row.

2. Second Embodiment

In the above-described first embodiment, the four pixels in the basic unit 225 have been arrayed in 2 rows×2 columns, but in the array of 2 rows×2 columns, only two rows can be read at a time in the non-differential mode. A solid-state image sensor 200 according to a second embodiment is different from that in the first embodiment in simultaneously reading three or more rows.

Figure 25:
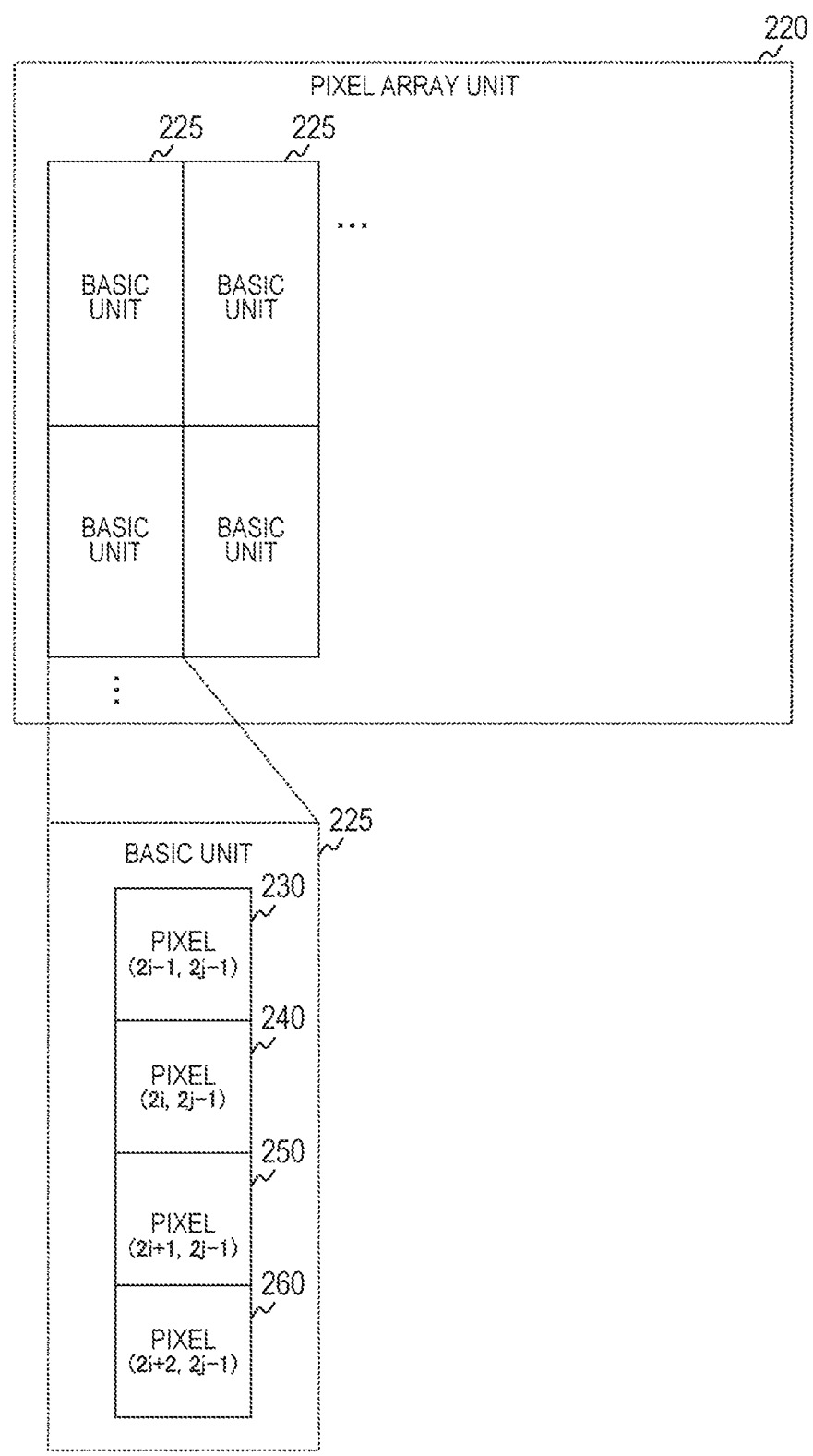
FIG. 25 is a plan view illustrating a configuration example of a pixel array unit according to a second embodiment of the present technology.

FIG. 25 is a plan view illustrating a configuration example of a pixel array unit 220 according to the second embodiment of the present technology. The pixel array unit 220 in the second embodiment is different from that in the first embodiment in arraying four pixels in a basic units 225 in 4 rows×1 column.

For example, a pixel 230 is arranged in a 2i−1 row and a pixel 240 is arranged in a 2i row. Furthermore, a pixel 250 is arranged in a 2i+1 row and a pixel 260 is arranged in a 2i+2 row. Furthermore, a unit readout circuit 310 is arranged for every column.

Figure 26:
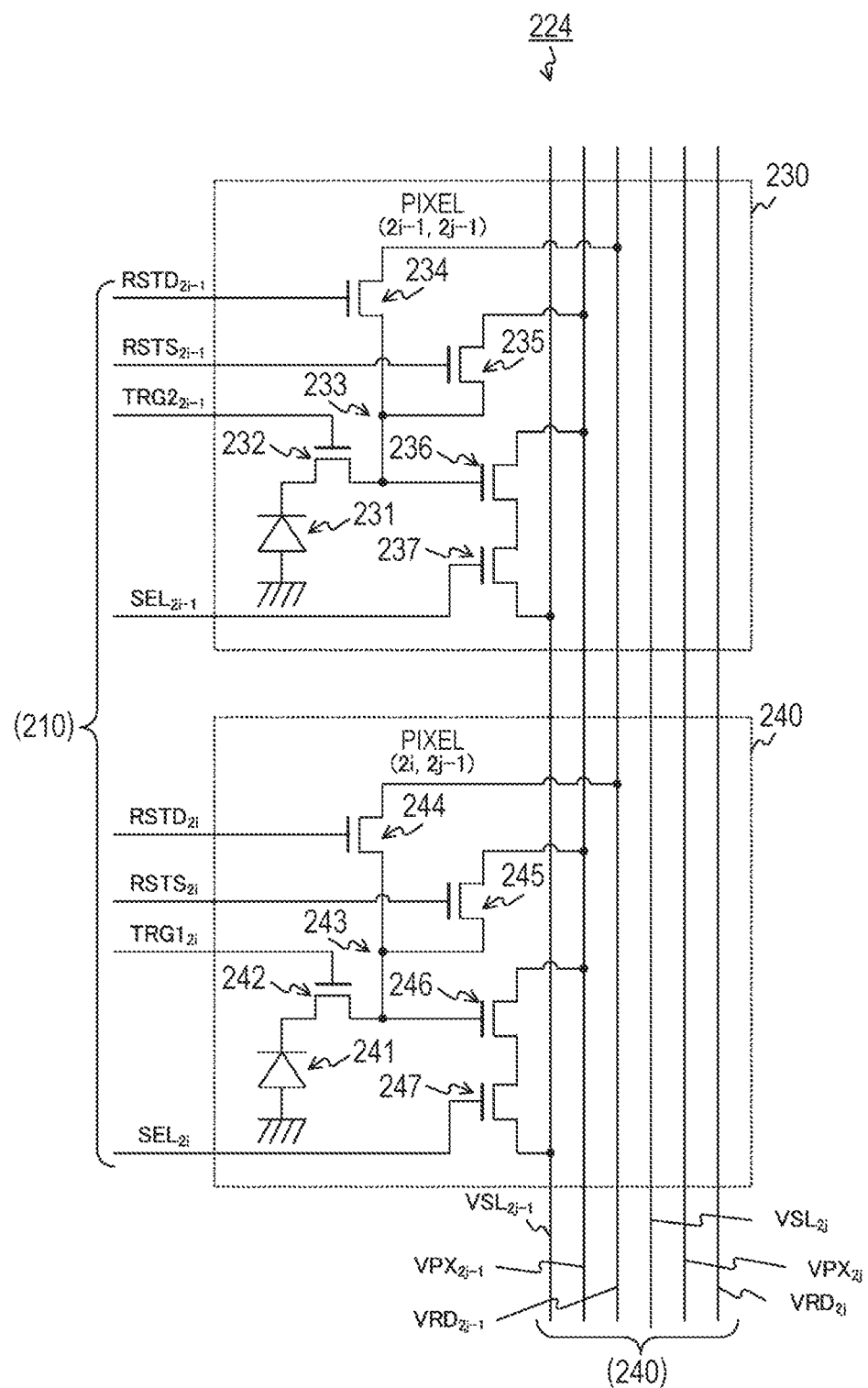
FIG. 26 is a circuit diagram illustrating a configuration example of pixels farther from a column readout circuit according to the second embodiment of the present technology.
Figure 27:
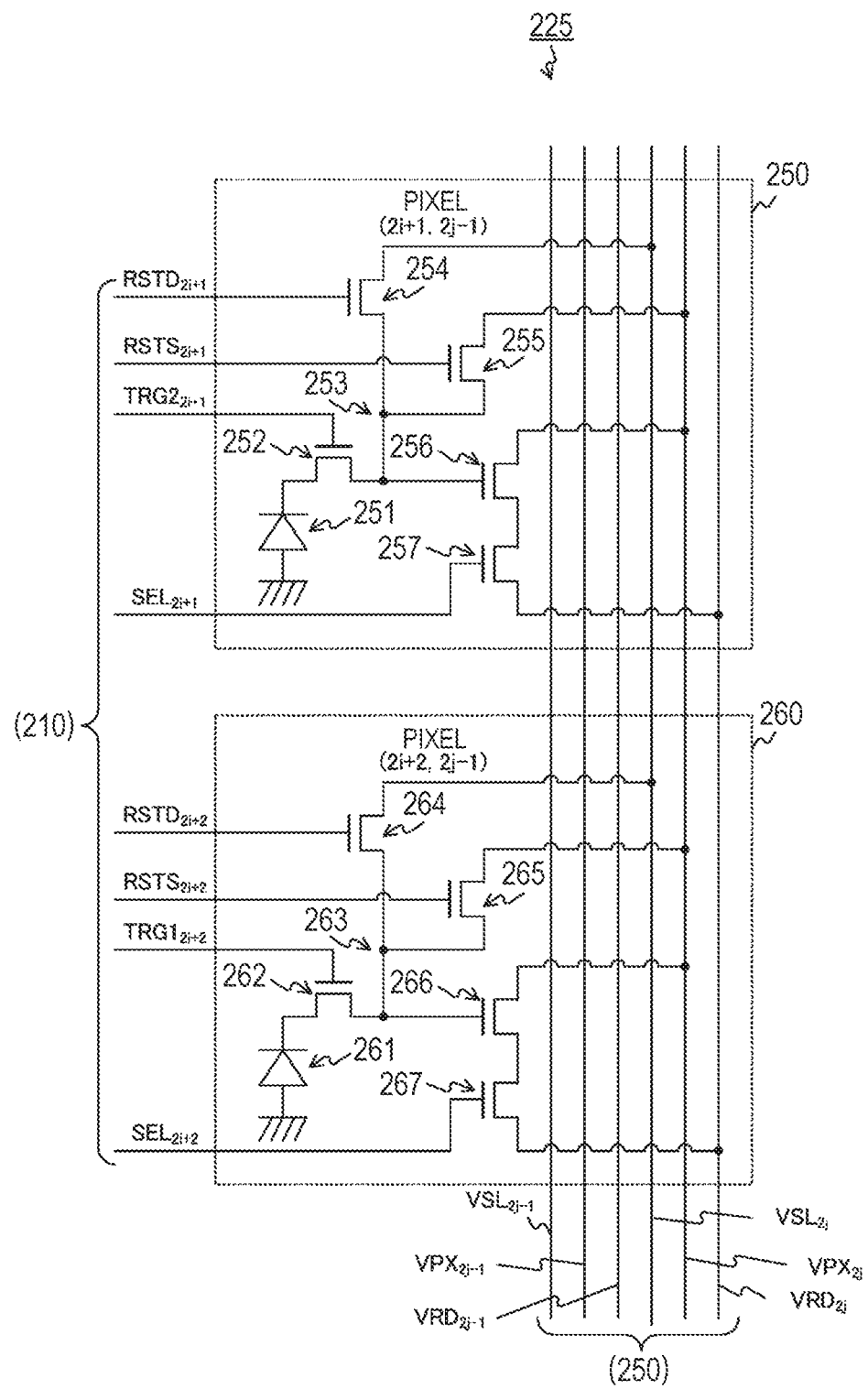
FIG. 27 is a circuit diagram illustrating a configuration example of pixels closer to the column readout circuit according to the second embodiment of the present technology.

FIG. 26 is a circuit diagram illustrating a configuration example of the pixels 230 and 240 farther from a column readout circuit 300 according to the second embodiment of the present technology. FIG. 27 is a circuit diagram illustrating a configuration example of the pixels 250 and 260 closer to the column readout circuit 300 according to the second embodiment of the present technology.

As illustrated in FIGS. 26 and 27, vertical signal lines $VSL_{2j-1}$, $VSL_{2j}$, $VPX_{2j-1}$, $VPX_{2j}$, $VRD_{2j-1}$, and $VRD_{2j}$ are wired for every column. Furthermore, a vertical drive unit 210 simultaneously drives four rows in a non-differential mode.

As described above, in the second embodiment of the present technology, four pixels are arrayed in 4 rows×1 column in the basic units 225. Therefore, four rows can be simultaneously read out. With the configuration, a readout speed can be further improved as compared with a case of simultaneously reading two rows.

3. Third Embodiment

In the above-described first embodiment, the four pixels in the basic unit 225 have been arrayed in 2 rows×2 columns. In the array of 2 rows×2 columns, the unit readout circuit 310 needs to be arranged for every two columns in the column readout circuit 300. For this reason, the increase in the circuit scale of the column readout circuit 300 accompanying the increase in the number of columns is large. A solid-state image sensor 200 according to a third embodiment is different from that in the first embodiment in that the circuit scale of a column readout circuit 300 is reduced.

Figure 28:
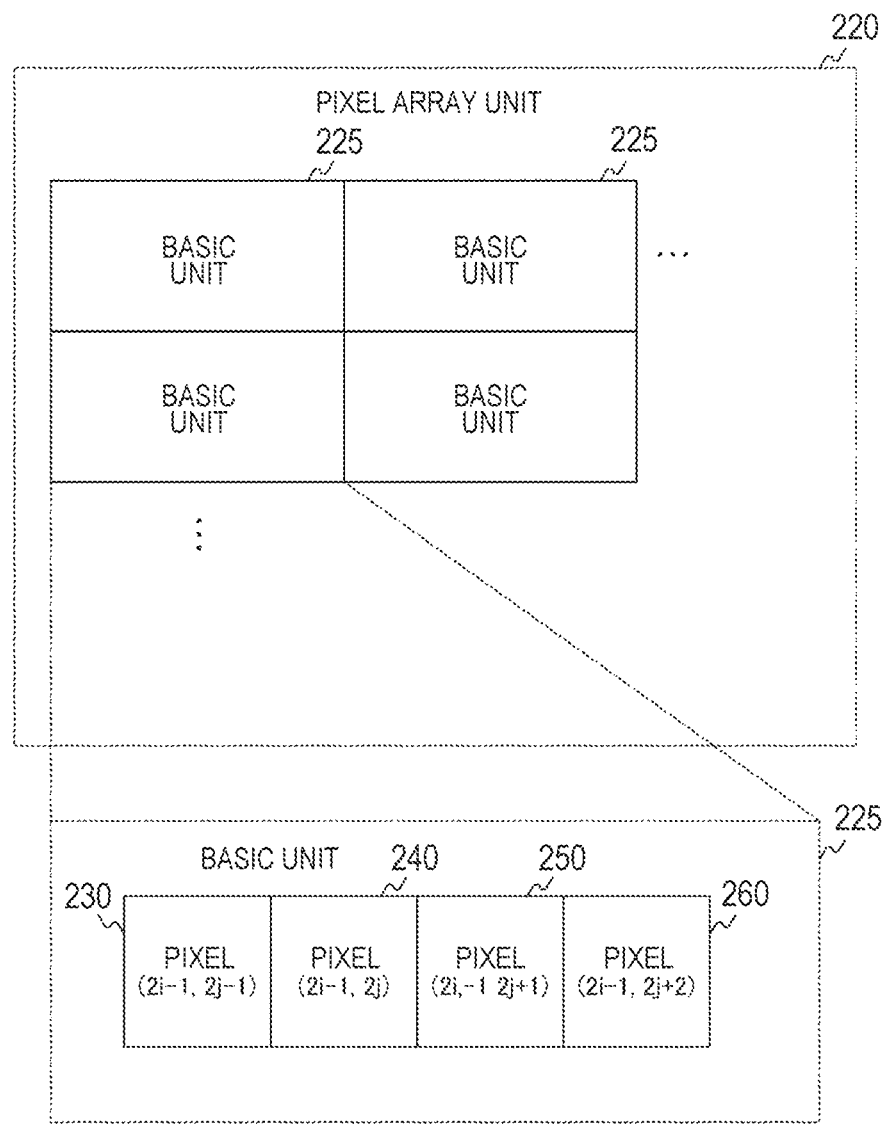
FIG. 28 is a plan view illustrating a configuration example of a pixel array unit according to a third embodiment of the present technology.

FIG. 28 is a plan view illustrating a configuration example of a pixel array unit 220 according to the third embodiment of the present technology. The pixel array unit 220 in the third embodiment is different from that in the first embodiment in arraying four pixels in a basic units 225 in 1 row×4 columns.

For example, a pixel 230 is arranged in a 2j−1 column and a pixel 240 is arranged in a 2j column. Furthermore, a pixel 250 is arranged in a 2j+1 column and a pixel 260 is arranged in a 2j+2 column. Furthermore, a unit readout circuit 310 is arranged for every four columns.

Figure 29:
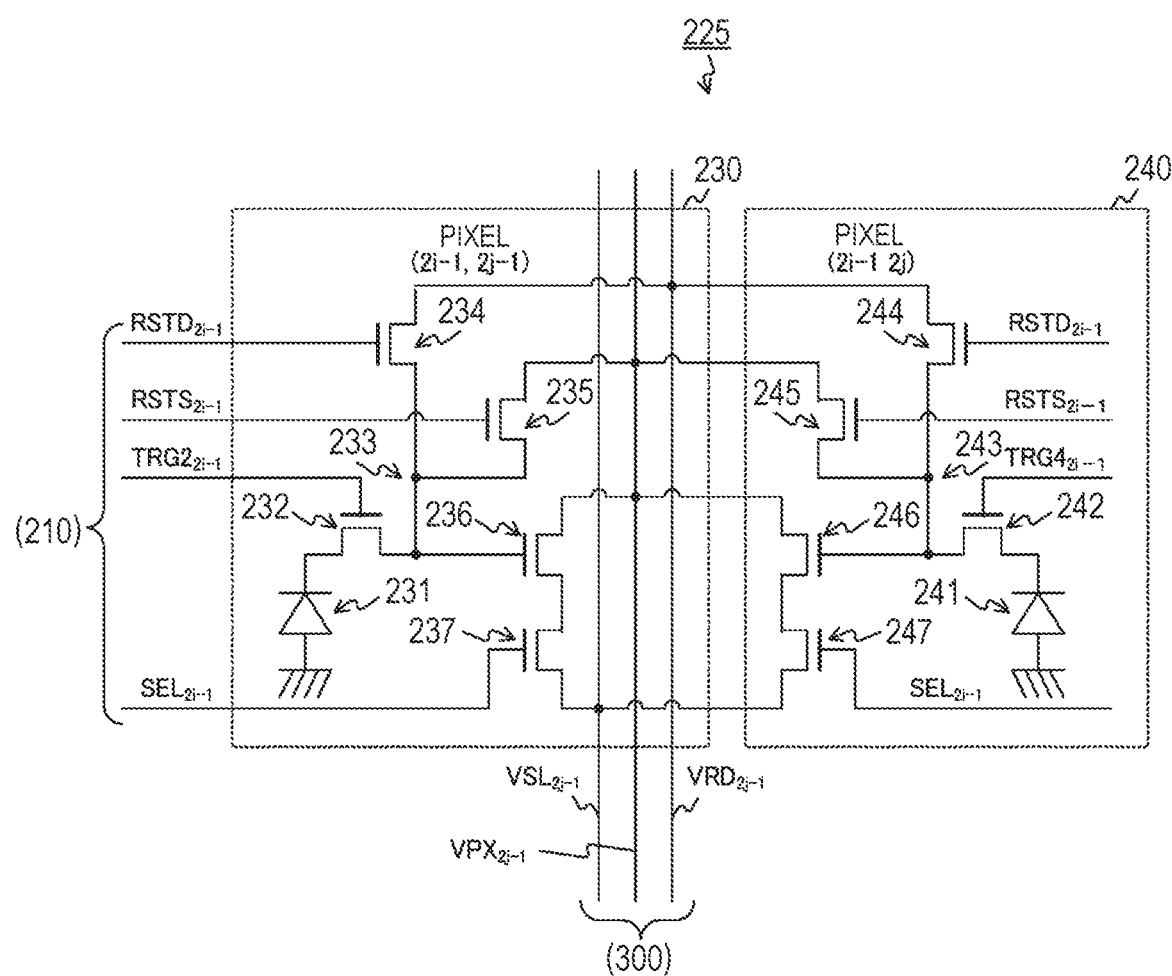
FIG. 29 is a circuit diagram illustrating a configuration example of pixels closer to a vertical drive unit according to the third embodiment of the present technology.

FIG. 29 is a circuit diagram illustrating a configuration example of the pixels 230 and 240 closer to a vertical drive unit 210 according to the third embodiment of the present technology. As illustrated in FIG. 29, vertical signal lines $VSL_{2j-1}$, $VPX_{2j-1}$, and $VRD_{2j-1}$ are wired to the pixel 230.

Figure 30:
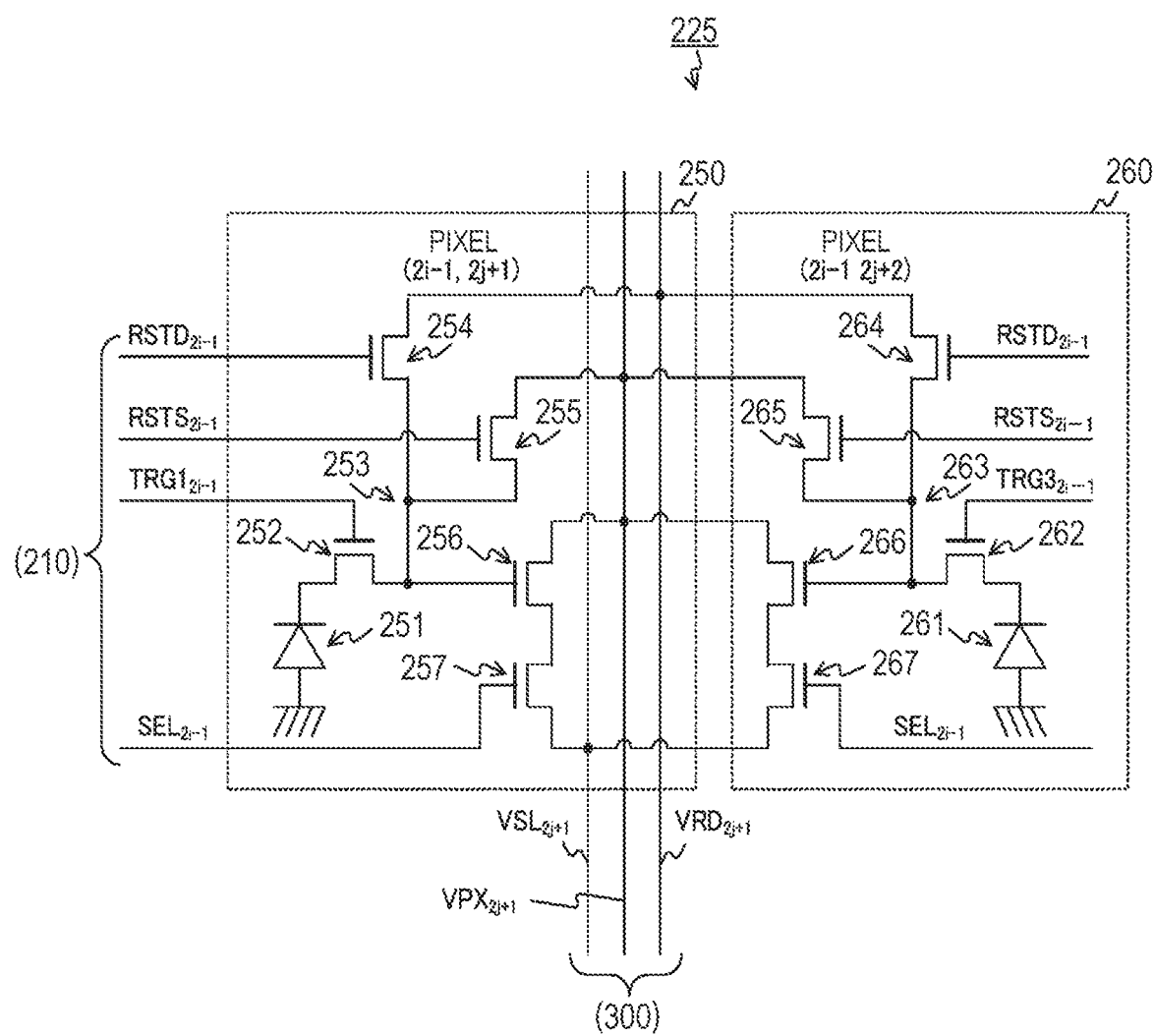
FIG. 30 is a circuit diagram illustrating a configuration example of pixels farther from the vertical drive unit according to the third embodiment of the present technology.

FIG. 30 is a circuit diagram illustrating a configuration example of the pixels 250 and 260 farther from the vertical drive unit 210 according to the second embodiment of the present technology. As illustrated in FIG. 30, vertical signal lines $VSL_{2j+1}$, $VPX_{2j+1}$, and $VRD_{2j+1}$ are wired to the pixel 250.

Here, a comparative example is assumed in which connection destinations of the vertical signal lines $VRD_{2j-1}$ and $VRD_{2j}$ are not switched in a non-differential mode and pixels are arrayed in 1 row×4 columns. In this comparative example, in the non-differential mode, the solid-state image sensor cannot read the entire row at a time, and needs to read half of N columns in a row first and then read the remaining columns, for each row. However, in the solid-state image sensor 200, since the column readout circuit 300 has switched the connection destinations of the vertical signal lines $VRD_{2j-1}$ and $VRD_{2j}$ in the non-differential mode, the solid-state image sensor 200 can read one row at a time in the non-differential mode. For this reason, a readout speed can be made faster than the comparative example. Moreover, in the array of 1 row×4 columns, it is sufficient to arrange the unit readout circuit 310 for every four columns. Therefore, the circuit scale of the column readout circuit 300 can be reduced as compared with a configuration of arranging the unit readout circuit 310 for every two columns.

As described above, in the third embodiment of the present technology, the unit readout circuit 310 is arranged for every four columns in the column readout circuit 300. Therefore, the circuit scale of the column readout circuit 300 can be reduced as compared with the case of arranging the unit readout circuit 310 for every two columns.

4. Fourth Embodiment

In the above-described first embodiment, the five transistors have been arranged for each pixel. However, with this configuration, miniaturization may be difficult. To facilitate miniaturization, reduction of the number of transistors per pixel is desirable. A solid-state image sensor 200 according to a fourth embodiment is different from that in the first embodiment in that the number of transistors per pixel is reduced.

Figure 31:
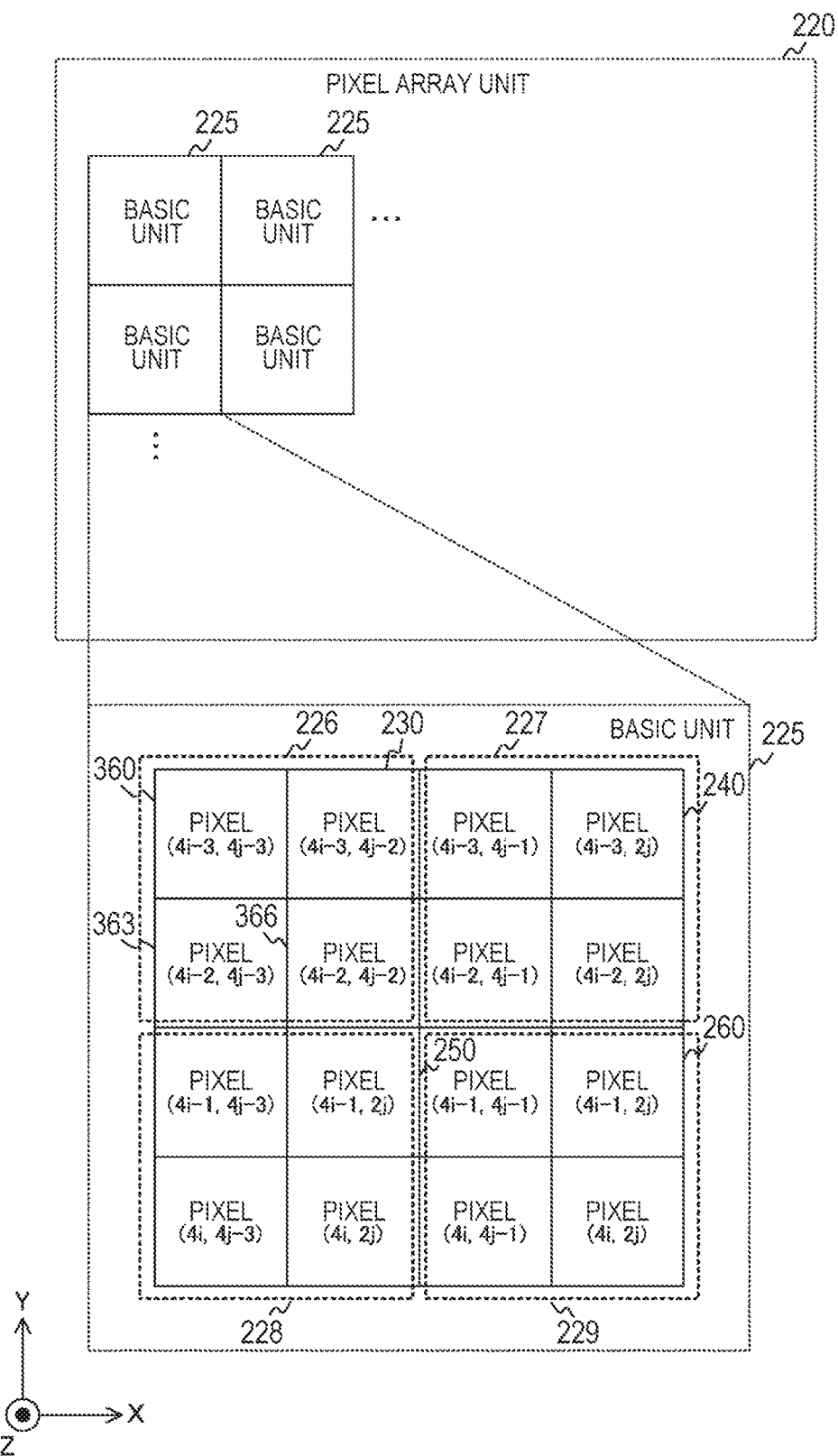
FIG. 31 is a plan view illustrating a configuration example of a pixel array unit according to a fourth embodiment of the present technology.

FIG. 31 is a plan view illustrating a configuration example of a pixel array unit 220 according to the fourth embodiment of the present technology. The pixel array unit 220 in the fourth embodiment is different from that in the first embodiment in that FD shared blocks 226, 227, 228, and 229 are arranged in a basic unit 225.

In the FD shared block 226, pixels 360, 230, 363, and 366 are arrayed in 2 rows×2 columns. These pixels share a charge storage unit 233 (FD). In the FD shared block 227, four pixels including a pixel 240 are arrayed in 2 rows×2 columns. These pixels share a charge storage unit 243.

In the FD shared block 228, four pixels including a pixel 250 are arrayed in 2 rows×2 columns. These pixels share a charge storage unit 253. In the FD shared block 229, four pixels including a pixel 260 are arrayed in 2 rows×2 columns. These pixels share a charge storage unit 263.

Figure 32:
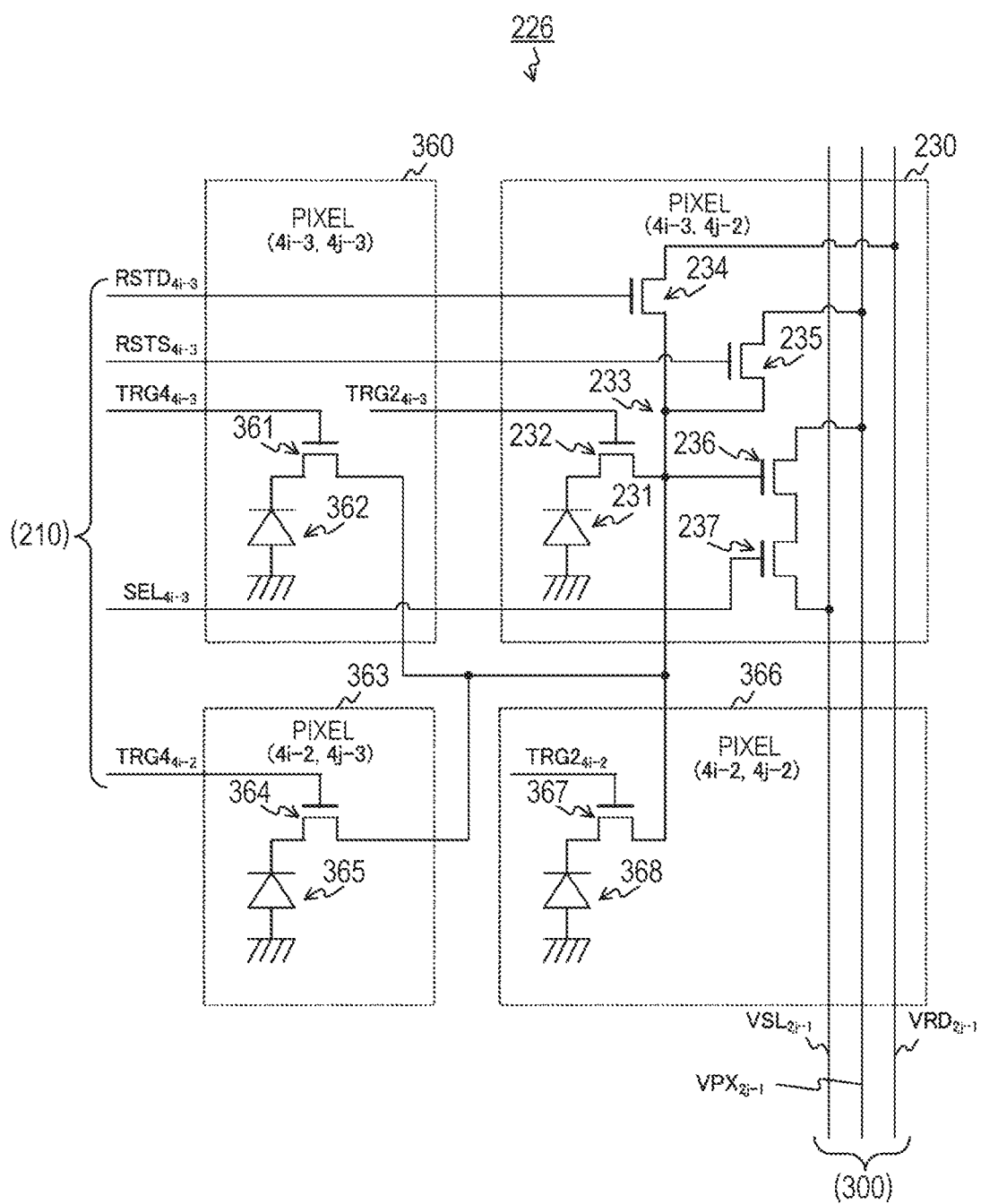
FIG. 32 is a circuit diagram illustrating a configuration example of a floating diffusion (FD) shared block according to the fourth embodiment of the present technology.

FIG. 32 is a circuit diagram illustrating a configuration example of the FD shared block 226 according to the fourth embodiment of the present technology. In the pixel 360, a transfer transistor 361 and a photodiode 362 are arranged. Furthermore, in the pixel 363, a transfer transistor 364 and a photodiode 365 are arranged. In the pixel 366, a transfer transistor 367 and a photodiode 368 are arranged. Configurations of the FD shared blocks 227, 228, and 229 are similar to the configuration of the FD shared block 226.

The transfer transistor 361 transfers a charge from the photodiode 362 to the charge storage unit 233 according to the control of a vertical drive unit 210, and the transfer transistor 364 transfers a charge from the photodiode 365 to the charge storage unit 233. Furthermore, the transfer transistor 367 transfers a charge from the photodiode 368 to the charge storage unit 233. Note that a circuit including the transfer transistors 361, 232, 364, and 367 is an example of a transfer unit described in the claims.

With the above-described configuration, the charge storage unit 233 (FD), reset transistors 234 and 235, an amplification transistor 236, and a selection transistor 237 are shared by four pixels. Therefore, the number of transistors per pixel can be reduced as compared with the first embodiment in which these elements are arranged for each pixel.

Figure 33:
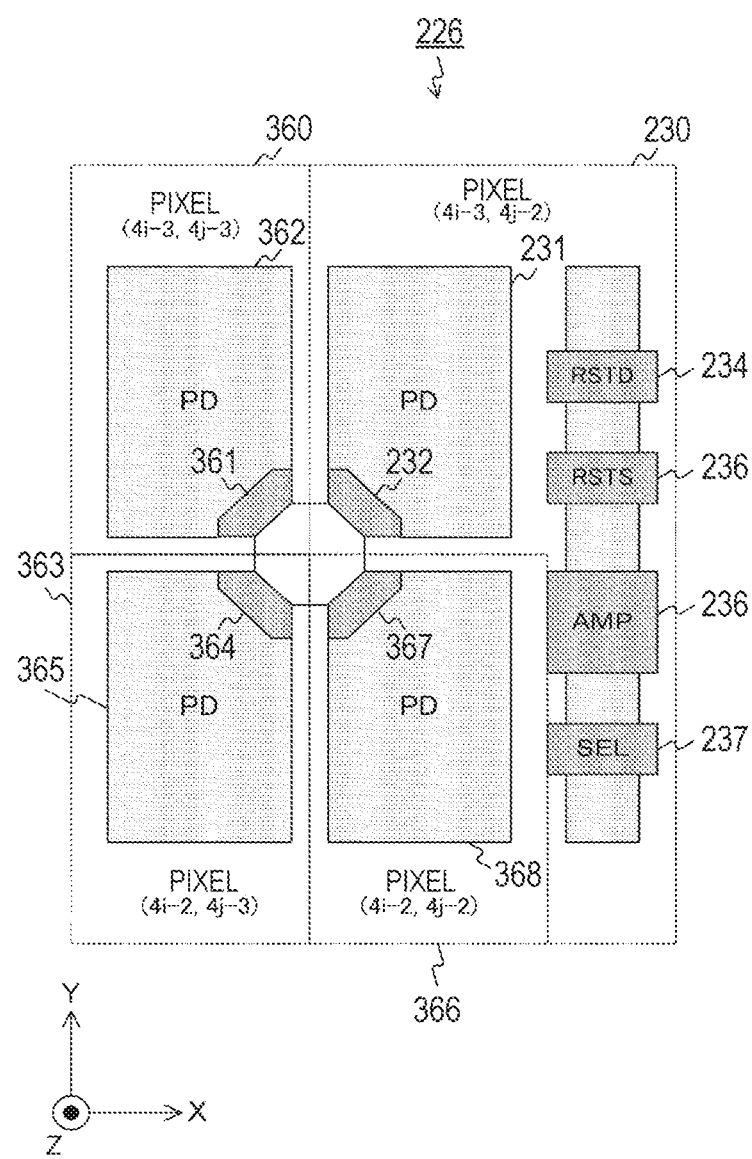
FIG. 33 is a plan view illustrating an arrangement example of elements in the FD shared block according to the fourth embodiment of the present technology.

FIG. 33 is a plan view illustrating an arrangement example of elements in the FD shared block 226 according to the fourth embodiment of the present technology. The photodiodes 362, 231, 365, and 368 are arrayed in 2 rows×2 columns. Furthermore, the reset transistors 234 and 235, the amplification transistor 236, and the selection transistor 237 are arrayed along a Y direction.

As described above, in the four embodiment of the present technology, four pixels share the charge storage unit 233 and the transistors, and thus the number of transistors per pixel can be reduced as compared with a configuration of not sharing the charge storage unit 233 and transistors.

5. Fifth Embodiment

In the above-described fourth embodiment, the four pixels have shared the charge storage unit (FD). However, with the configuration, further miniaturization may be difficult. For further miniaturization, it is desirable to increase the number of pixels sharing an FD to five or more. A solid-state image sensor 200 according to a fifth embodiment is different from that in the fourth embodiment in that the number of pixels sharing an FD is increased.

Figure 34:
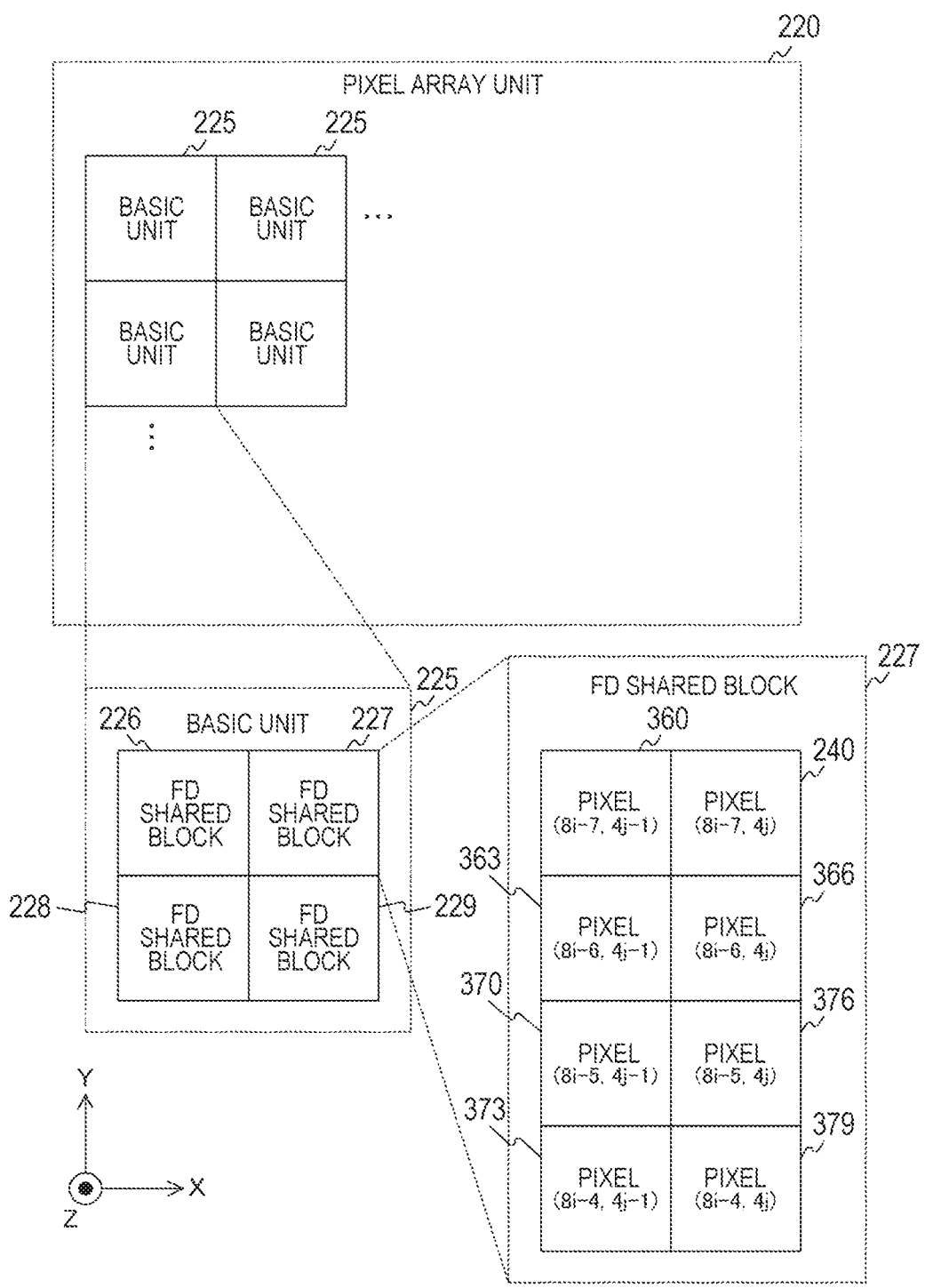
FIG. 34 is a plan view illustrating a configuration example of a pixel array unit according to a fifth embodiment of the present technology.

FIG. 34 is a plan view illustrating a configuration example of a pixel array unit 220 according to the fifth embodiment of the present technology. The pixel array unit 220 in the fifth embodiment is different from that in the fourth embodiment in that eight pixels are arranged in each of FD shared blocks 226, 227, 228, and 229.

For example, in the FD shared block 227, pixels 360, 240, 363, 366, 370, 376, 373, and 379 are arrayed in 4 rows×2 columns. These eight pixels share a charge storage unit 243 (FD). As for the FD shared blocks 226, 228, and 229, eight pixels in each of the blocks similarly share an FD.

Figure 35:
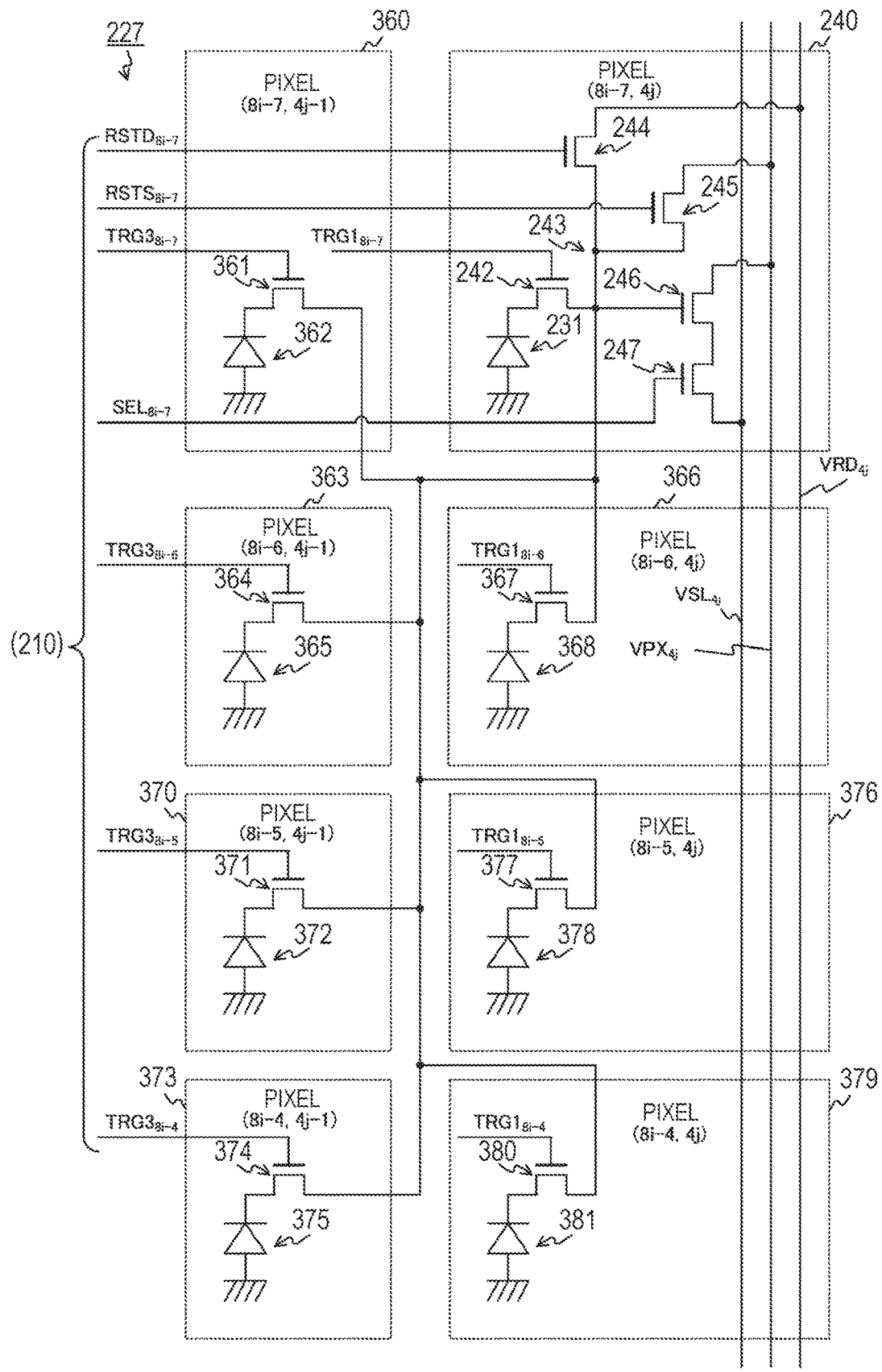
FIG. 35 is a circuit diagram illustrating a configuration example of an FD shared block according to the fifth embodiment of the present technology.

FIG. 35 is a circuit diagram illustrating a configuration example of the FD shared block 227 according to the fifth embodiment of the present technology. Configurations of the pixels 360, 363, and 366 in the fifth embodiment are similar to the configurations in the fourth embodiment.

In the pixel 370, a transfer transistor 371 and a photodiode 372 are arranged. In the pixel 373, a transfer transistor 374 and a photodiode 375 are arranged. Furthermore, in the pixel 376, a transfer transistor 377 and a photodiode 378 are arranged. In the pixel 379, a transfer transistor 380 and a photodiode 381 are arranged.

The transfer transistor 371 transfers a charge from the photodiode 372 to the charge storage unit 243 according to the control of a vertical drive unit 210, and the transfer transistor 374 transfers a charge from the photodiode 375 to the charge storage unit 243. Furthermore, the transfer transistor 377 transfers a charge from the photodiode 378 to the charge storage unit 243. The transfer transistor 380 transfers a charge from the photodiode 381 to the charge storage unit 243.

Figure 36:
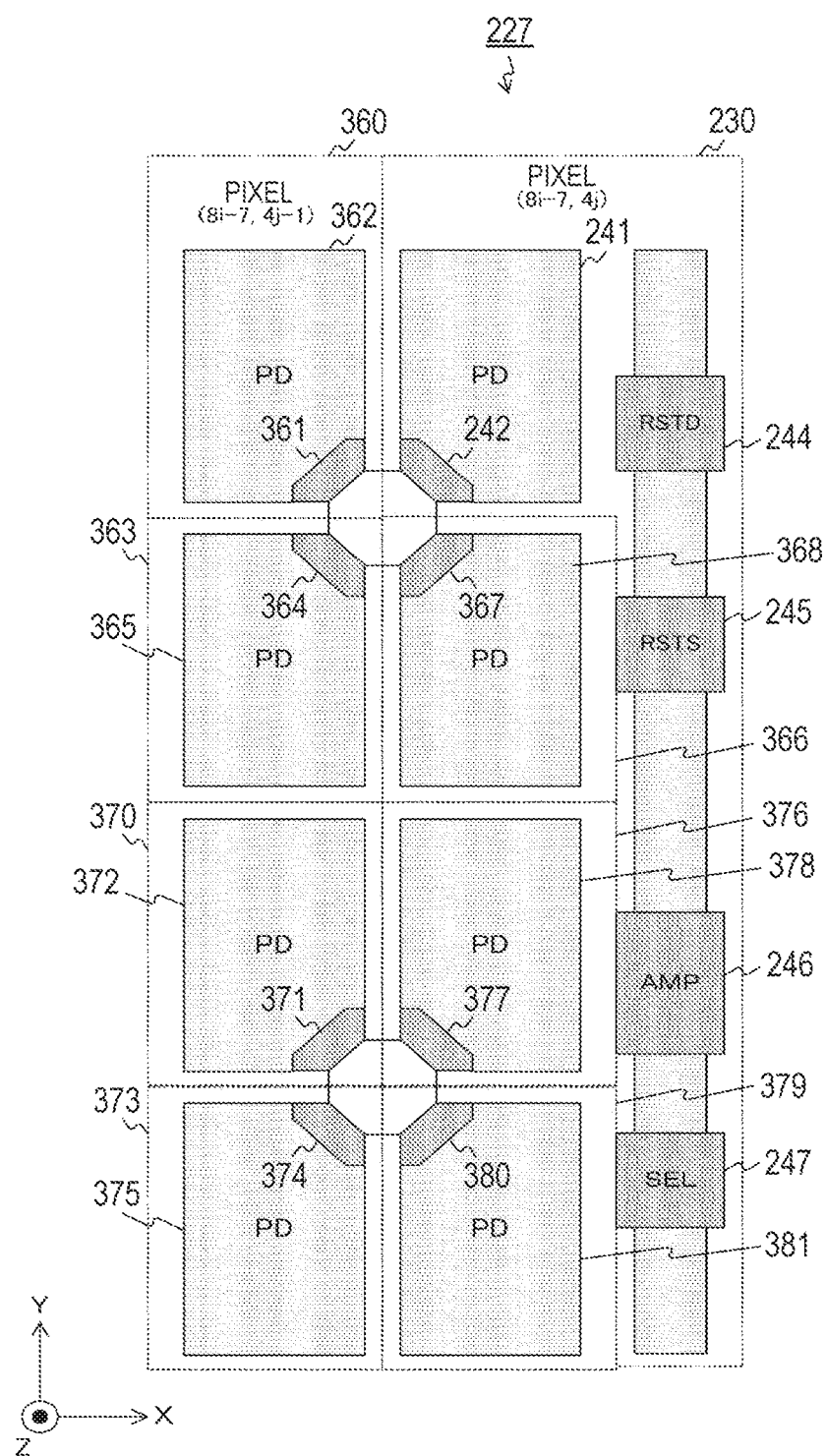
FIG. 36 is a plan view illustrating an arrangement example of elements in the FD shared block according to the fifth embodiment of the present technology.

FIG. 36 is a plan view illustrating an arrangement example of elements in the FD shared block 227 according to the fifth embodiment of the present technology. The photodiodes 362, 241, 365, 368, 372, 375, 378, and 381 are arrayed in 4 rows×2 columns. Furthermore, reset transistors 244 and 245, an amplification transistor 246, and a selection transistor 247 are arrayed along a Y direction.

As described above, in the fifth embodiment of the present technology, the eight pixels share the charge storage unit (FD) and the transistors, and thus can further reduce the number of transistors per pixel as compared with the configuration in which four pixels share the charge storage unit and transistors.

6. Sixth Embodiment

In the above-described first embodiment, the front surface irradiation-type configuration to irradiate a front surface with light, the front surface being a surface on the side of the wiring layer, has been used. However, in the front surface irradiation-type solid-state image sensor, the wiring layer blocks a part of the light and the sensitivity is lowered. A solid-state image sensor 200 in a sixth embodiment is different from that in the first embodiment in improving the sensitivity.

Figure 37:
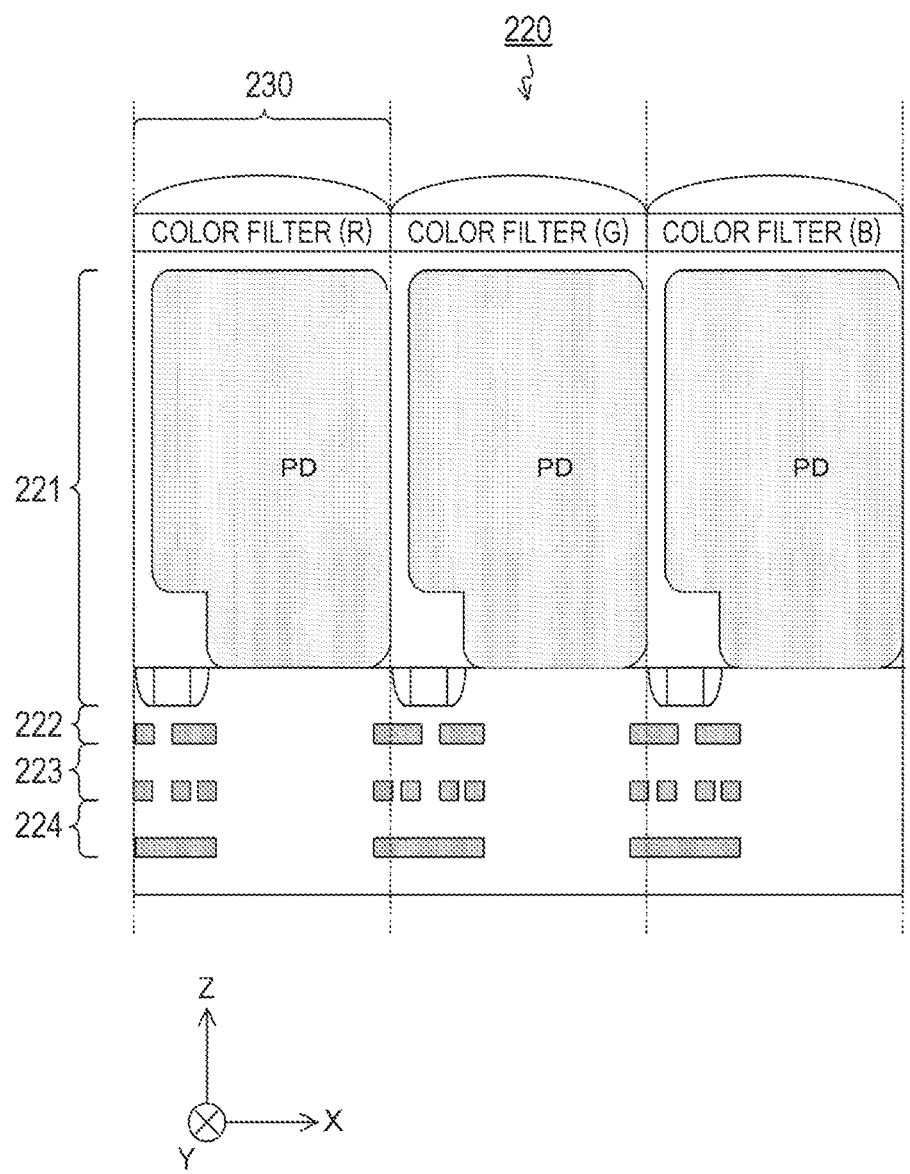
FIG. 37 is an example of a cross-sectional view of a solid-state image sensor according to a sixth embodiment of the present technology.

FIG. 37 is an example of a cross-sectional view of the solid-state image sensor 200 according to the sixth embodiment of the present technology. A photoelectric conversion layer 221 is arranged below a microlens, and a power supply-side vertical wiring layer 222 is arranged below the photoelectric conversion layer 221. A horizontal wiring layer 223 is provided below the power supply-side vertical wiring layer 222. Furthermore, a ground-side vertical wiring layer 224 is provided below the horizontal wiring layer 223.

As described above, in the solid-state image sensor 200 having the photoelectric conversion layer 221 arranged between the microlens and the wiring layers such as the power supply-side vertical wiring layer 222, a back surface facing a front surface is irradiated with light. Such a solid-state image sensor is called back surface irradiation-type solid-state image sensor. This back surface irradiation-type solid-state image sensor has higher sensitivity than the front surface irradiation-type solid-state image sensor because light is not blocked by part of the wiring layers.

As described above, according to the sixth embodiment of the present technology, the back surface irradiation-type structure in which the photoelectric conversion layer 221 is arranged between the microlens and the wiring layers such as the power supply-side vertical wiring layer 222 has been adopted, thereby improving the sensitivity as compared with a front surface irradiation-type structure.

7. Seventh Embodiment

In the above-described first embodiment, the circuits in the solid-state image sensor 200 have been provided on the single semiconductor chip. However, in the case of providing the circuits on the single semiconductor chip, the vertical drive unit 210 and the like in addition to the pixel array unit 220 need to be arranged on the chip. Therefore, if the area of the semiconductor chip is constant, the area of the pixel array unit 220 is reduced by the area of the circuits other than the pixel array unit 220. To increase the area of the pixel array unit 220, the circuits in the solid-state image sensor 200 are only required to be distributed and arranged in a plurality of stacked semiconductor chips, for example. A solid-state image sensor 200 according to a seventh embodiment is different from that in the first embodiment in arranging circuits in a plurality of stacked semiconductor chips in a distributed manner.

Figure 38:
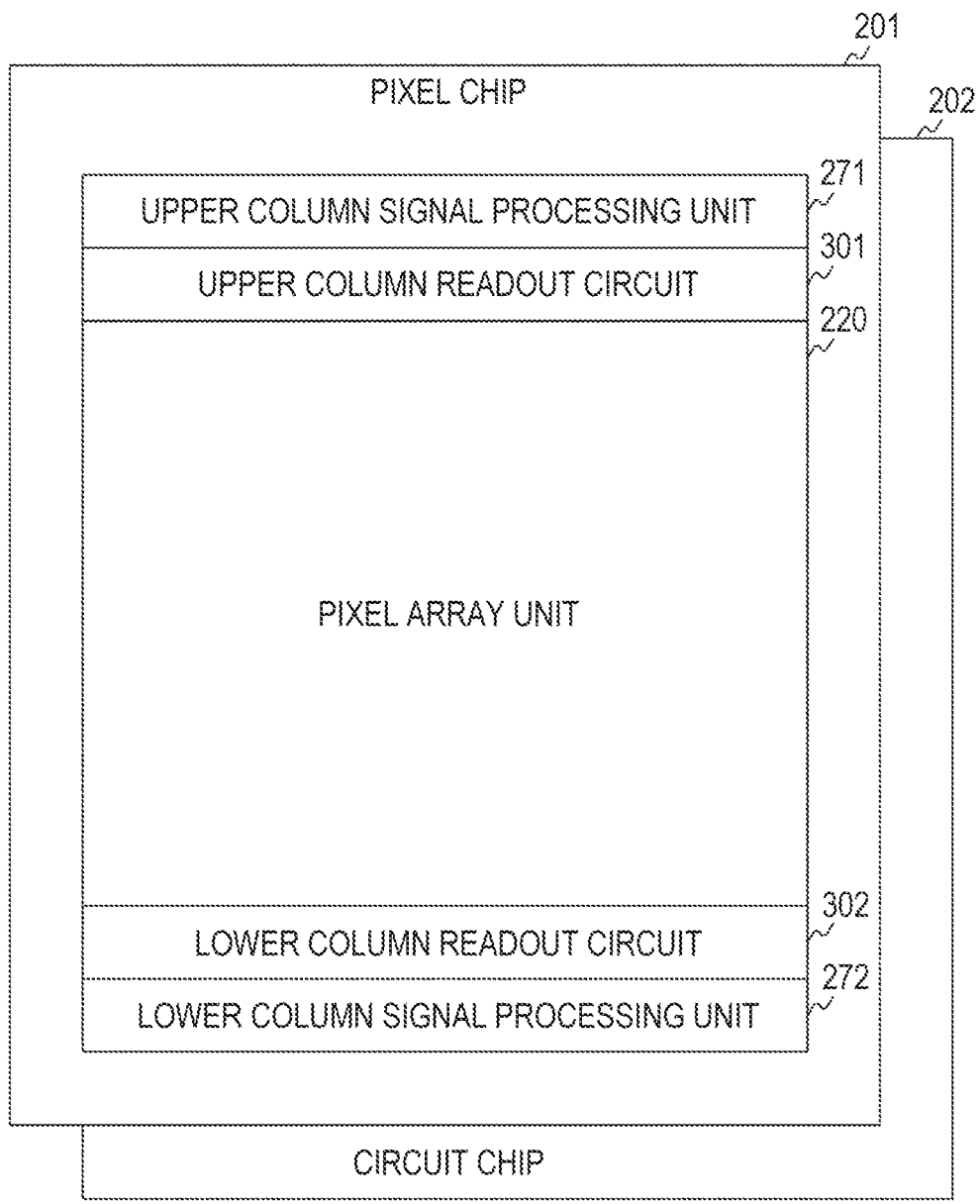
FIG. 38 is a block diagram illustrating a configuration example of a solid-state image sensor according to a seventh embodiment of the present technology.

FIG. 38 is a block diagram illustrating a configuration example of the solid-state image sensor 200 according to the seventh embodiment of the present technology. The solid-state image sensor 200 according to the seventh embodiment includes a stacked pixel chip 201 and a stacked circuit chip 202.

The pixel chip 201 is a semiconductor chip on which pixels are arranged. In the pixel chip 201, an upper column signal processing unit 271, an upper column readout circuit 301, a pixel array unit 220, a lower column readout circuit 302, and a lower column signal processing unit 272 are arranged.

A unit readout circuit 310 corresponding to half of M columns is arranged in the upper column readout circuit 301, and a unit readout circuit 310 corresponding to the remaining columns is arranged in the lower column readout circuit 302. An ADC corresponding to the upper column readout circuit 301 is arranged in the upper column signal processing unit 271, and an ADC corresponding to the lower column readout circuit 302 is arranged in the lower column signal processing unit 272.

The circuit chip 202 is a semiconductor chip in which circuits such as a vertical drive unit 210, a system control unit 291, a horizontal drive unit 292, a data storage unit 293, and an image processing unit 294 are arranged.

Note that the pixel chip 201 is an example of a first semiconductor chip described in the claims, and the circuit chip 202 is an example of a second semiconductor chip described in the claims.

As described above, in the seventh embodiment of the present technology, the circuits in the solid-state image sensor 200 are distributed and arranged in the plurality of stacked semiconductor chips, and thus the area of the pixel array unit 220 can be made larger than the case of arranging circuits in a single semiconductor chip.

Modification

In the above-described seventh embodiment, the circuits such as the upper column signal processing unit 271 other than the pixel array unit 220 have been arranged together with the pixel array unit 220 on the pixel chip 201. In this configuration, if the area of the pixel chip 201 is constant, the area of the pixel array unit 220 is reduced by the area of the circuits other than the pixel array unit 220. To increase the area of the pixel array unit 220, the circuits other than the pixel array unit 220 are only required to be arranged on the circuit chip 202, for example. A solid-state image sensor 200 in a modification of the seventh embodiment is different from the solid-state image sensor 200 in the seventh embodiment in arranging the circuits other than the pixel array unit 220 in the circuit chip 202.

Figure 39:
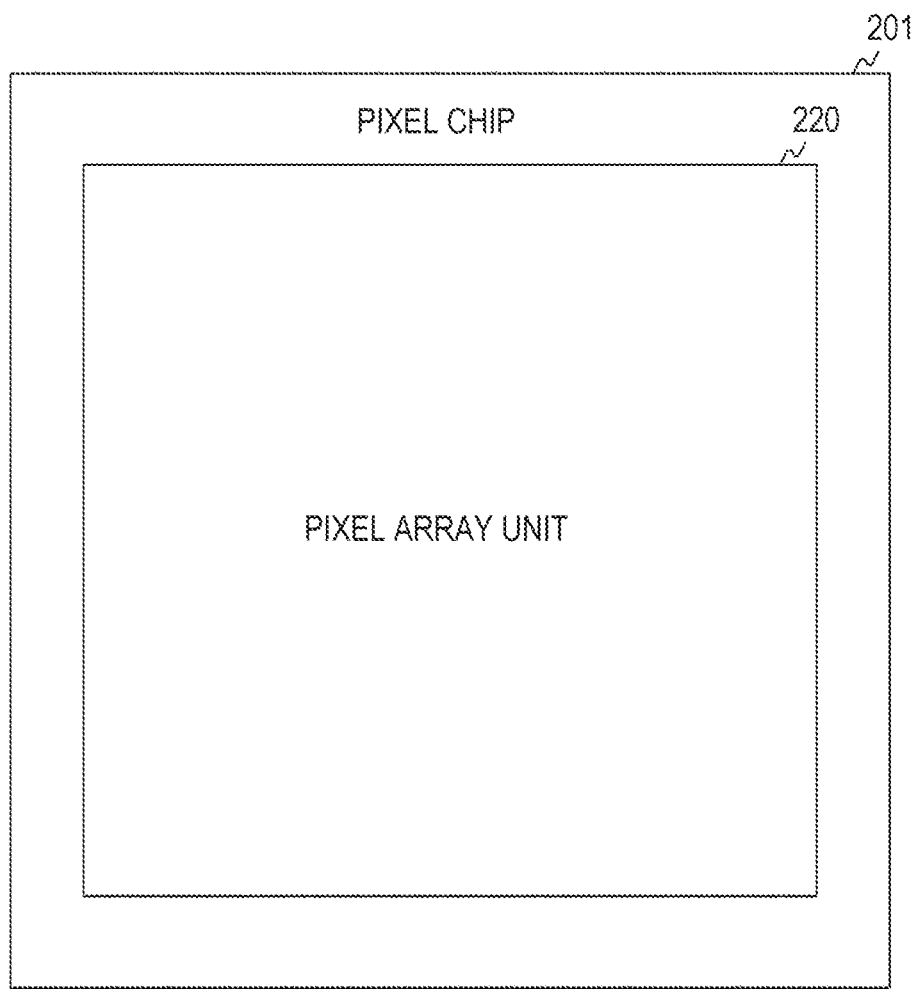
FIG. 39 is a diagram illustrating a configuration example of a pixel chip according to a modification of the seventh embodiment of the present technology.

FIG. 39 is a diagram illustrating a configuration example of the pixel chip 201 according to the modification of the seventh embodiment of the present technology. The pixel chip 201 according to the modification of the seventh embodiment is different from the configuration in the first embodiment in that only the pixel array unit 220 is arranged.

Figure 40:
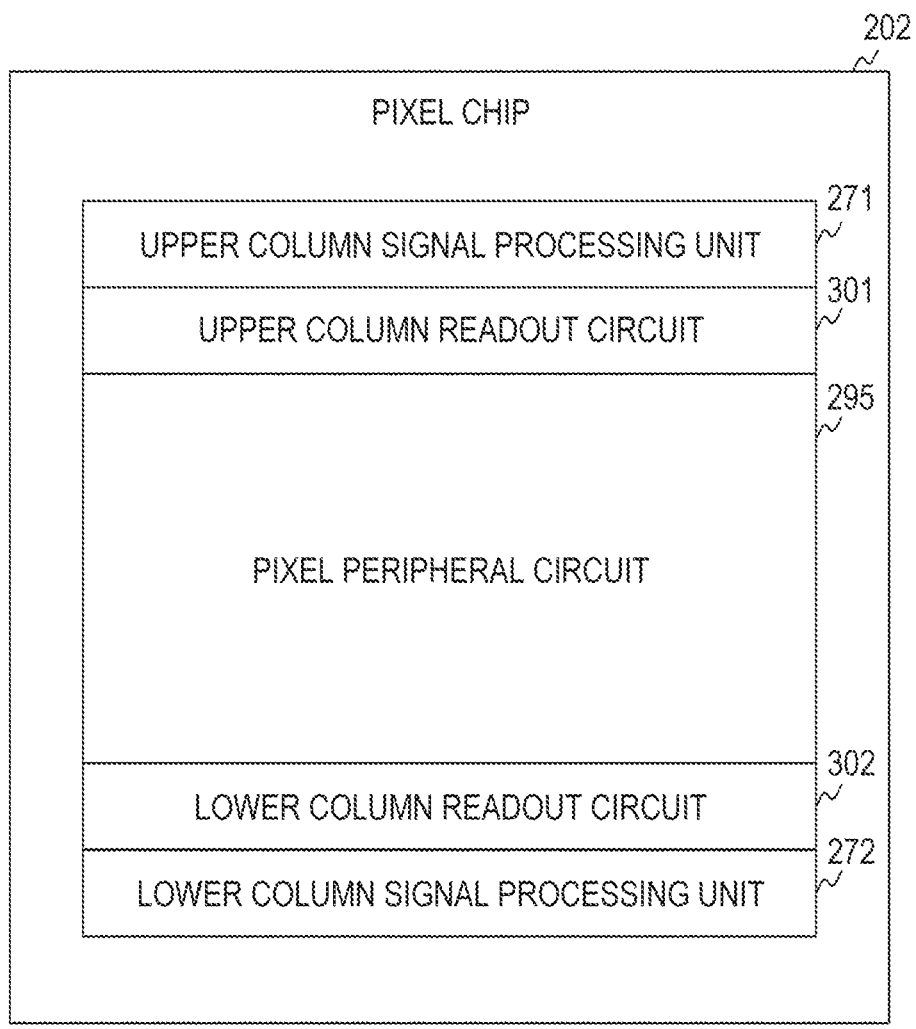
FIG. 40 is a block diagram illustrating a configuration example of a circuit chip according to a modification of the seventh embodiment of the present technology.

FIG. 40 is a diagram illustrating a configuration example of the circuit chip 202 according to the modification of the seventh embodiment of the present technology. In the circuit chip 202 according to the modification of the seventh embodiment, the upper column signal processing unit 271, the upper column readout circuit 301, a pixel peripheral circuit 295, the lower column readout circuit 302, and the lower column signal processing unit 272 are arranged.

The pixel peripheral circuit 295 includes the vertical drive unit 210, the system control unit 291, the horizontal drive unit 292, the data storage unit 293, the image processing unit 294, and the like.

As described above, the seventh embodiment of the present technology, the circuits other than the pixel array unit 220 are arranged on the circuit chip 202, and thus the area of the pixel array unit 220 can be made larger than the case of arranging the circuits on the pixel chip 201.

8. Eighth Embodiment

In the above-described first embodiment, the solid-state image sensor 200 has performed the conversion (i.e., sampling) of the reset level and the signal level into digital signals only once. Further reduction of noise in the pixel data has been difficult. For example, if sampling is performed a plurality of times for each of the reset level and the signal level and results are added, the noise can be further reduced. A solid-state image sensor 200 according to an eighth embodiment is different from that in the first embodiment in performing sampling a plurality of times for each of a reset level and a signal level.

Figure 41:
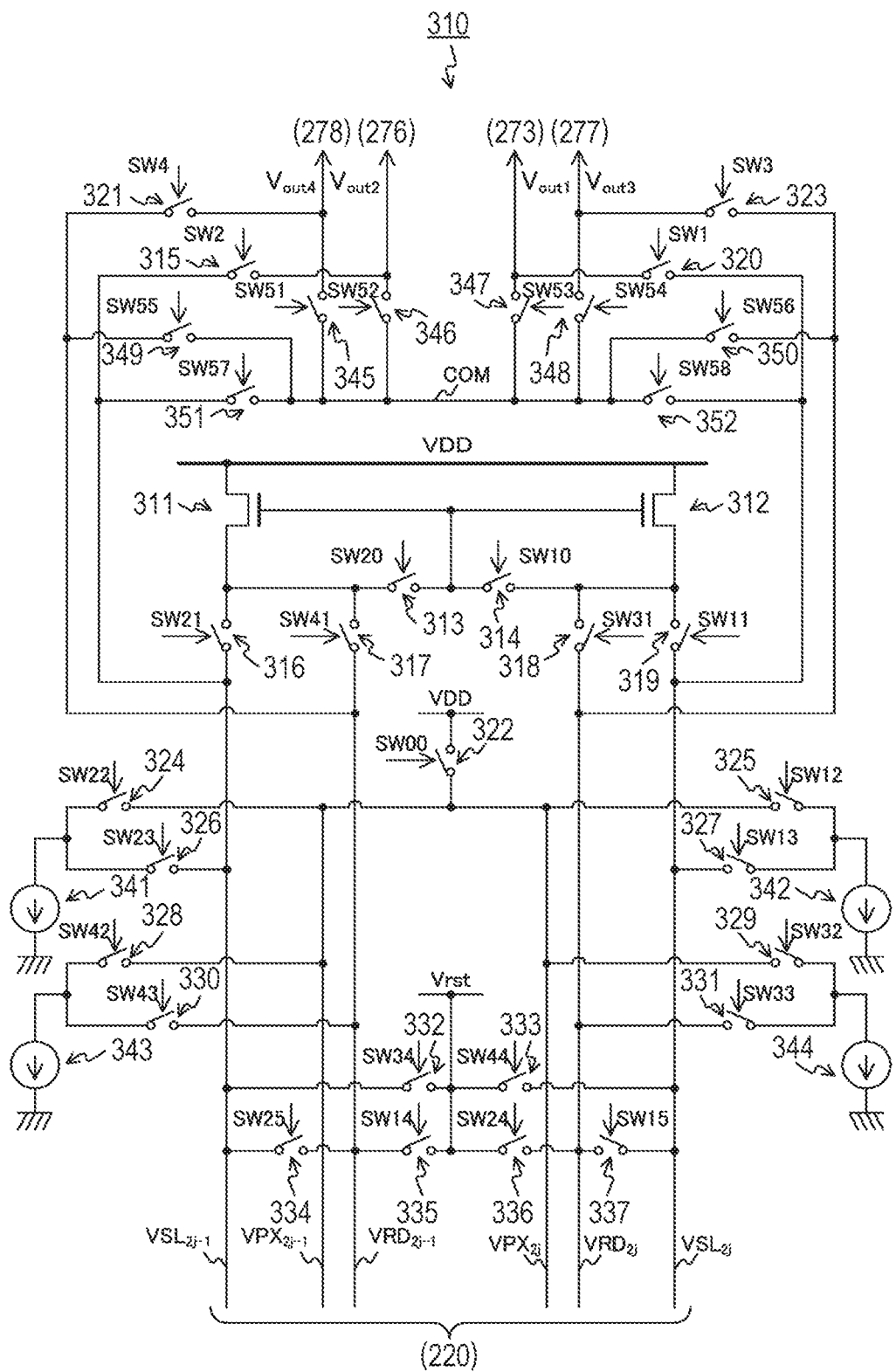
FIG. 41 is a circuit diagram illustrating a configuration example of a unit readout circuit according to an eighth embodiment of the present technology.

FIG. 41 is a circuit diagram illustrating a configuration example of a unit readout circuit 310 according to the eighth embodiment of the present technology. The unit readout circuit 310 in the eighth embodiment is different from that in the first embodiment in further including switches 345 to 352.

The switch 345 opens and closes a path between a signal line COM and an ADC 278 according to a control signal SW51 from a system control unit 291. The switch 346 opens and closes a path between the signal line COM and an ADC 276 according to a control signal SW52 from the system control unit 291.

Furthermore, the switch 347 opens and closes a path between the signal line COM and an ADC 273 according to a control signal SW53 from the system control unit 291. The switch 348 opens and closes a path between the signal line COM and an ADC 277 according to a control signal SW54 from the system control unit 291.

The switch 349 opens and closes a path between a vertical signal line $VRD_{2j-1}$ and the signal line COM according to a control signal SW55 from the system control unit 291. The switch 350 opens and closes a path between a vertical signal line $VRD_{2j}$ and the signal line COM according to a control signal SW56 from the system control unit 291.

The switch 351 opens and closes a path between a vertical signal line $VSL_{2j-1}$ and the signal line COM according to a control signal SW57 from the system control unit 291. The switch 352 opens and closes a path between a vertical signal line $VSL_{2j}$ and the signal line COM according to a control signal SW58 from the system control unit 291.

The system control unit 291 controls each of the switches in a non-differential mode and simultaneously supplies a reset level of a certain pixel to the ADCs 273, 275, 276, and 277. A D phase level is similarly simultaneously supplied to the four ADCs. For example, when supplying pixel signals (reset level and signal level) of a pixel 240, the control signals SW51, SW52, SW54, and SW58 are supplied. Meanwhile, in a differential mode, only one of the ADCs 273, 275, 276, and 277 is used for each pixel, as in the first embodiment.

Figure 42:
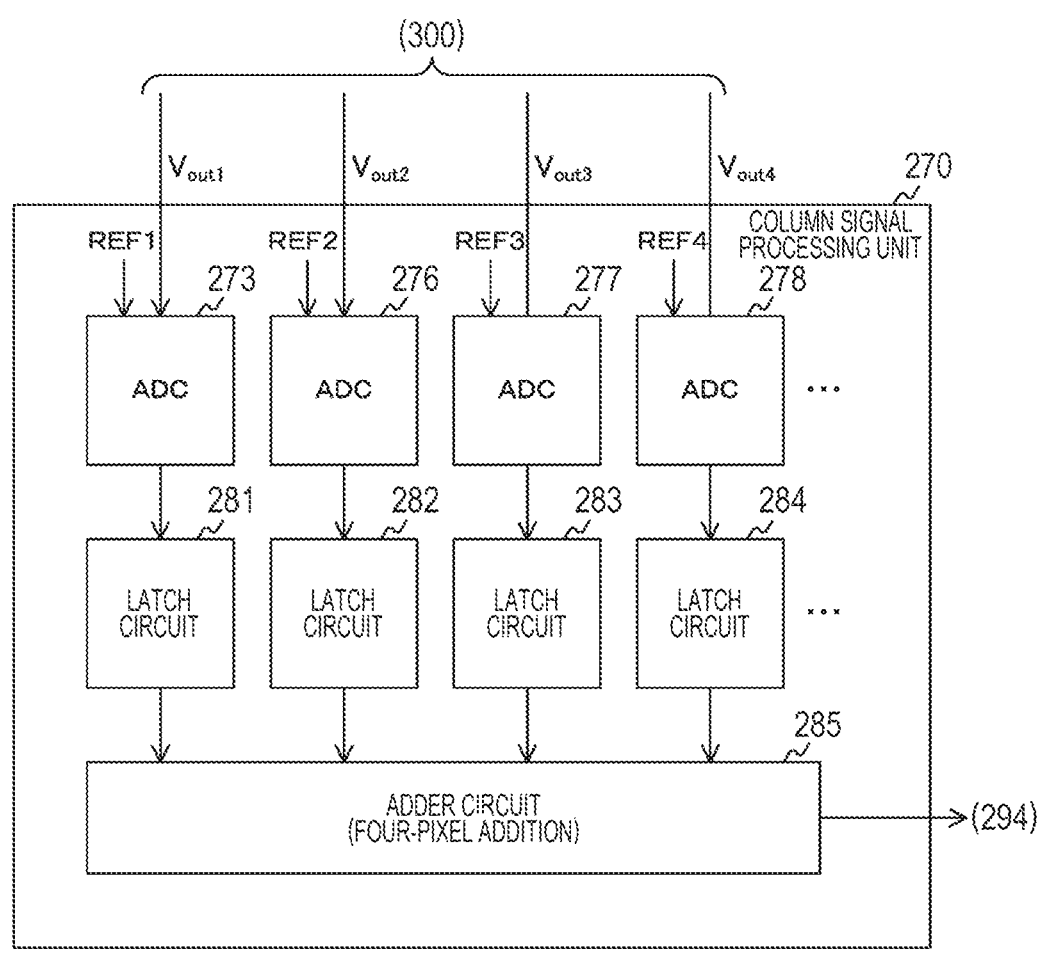
FIG. 42 is a circuit diagram illustrating a configuration example of a column signal processing unit according to the eighth embodiment of the present technology.

FIG. 42 is a circuit diagram illustrating a configuration example of a column signal processing unit 270 according to the eighth embodiment of the present technology. The column signal processing unit 270 includes latch circuits 281 to 284 and an adder circuit 285 instead of an output unit 280.

Furthermore, a reference signal REF1 of reference signals REF1, REF2, REF3, and REF4 having different phases from one another is input to the ADC 273. The reference signal REF2 is input to the ADC 276, and the reference signal REF3 is input to the ADC 277. The reference signal REF4 is input to the ADC 278.

The latch circuit 281 holds a digital signal from the ADC 273. The latch circuit 282 holds a digital signal from the ADC 276. The latch circuit 283 holds a digital signal from the ADC 277. The latch circuit 284 holds a digital signal from the ADC 278. These latch circuits 281 to 284 supply the held signals to the adder circuit 285.

The adder circuit 285 adds the digital signals from each of the latch circuits 281 to 284, and outputs added data to the image processing unit 294 as pixel data.

As described above, according to the eighth embodiment of the present technology, the sampling is performed a plurality of times for each pixel and the results are added, and thus the noise of the pixel data can be further reduced.

9. Application Example to Mobile Bodies

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 43:
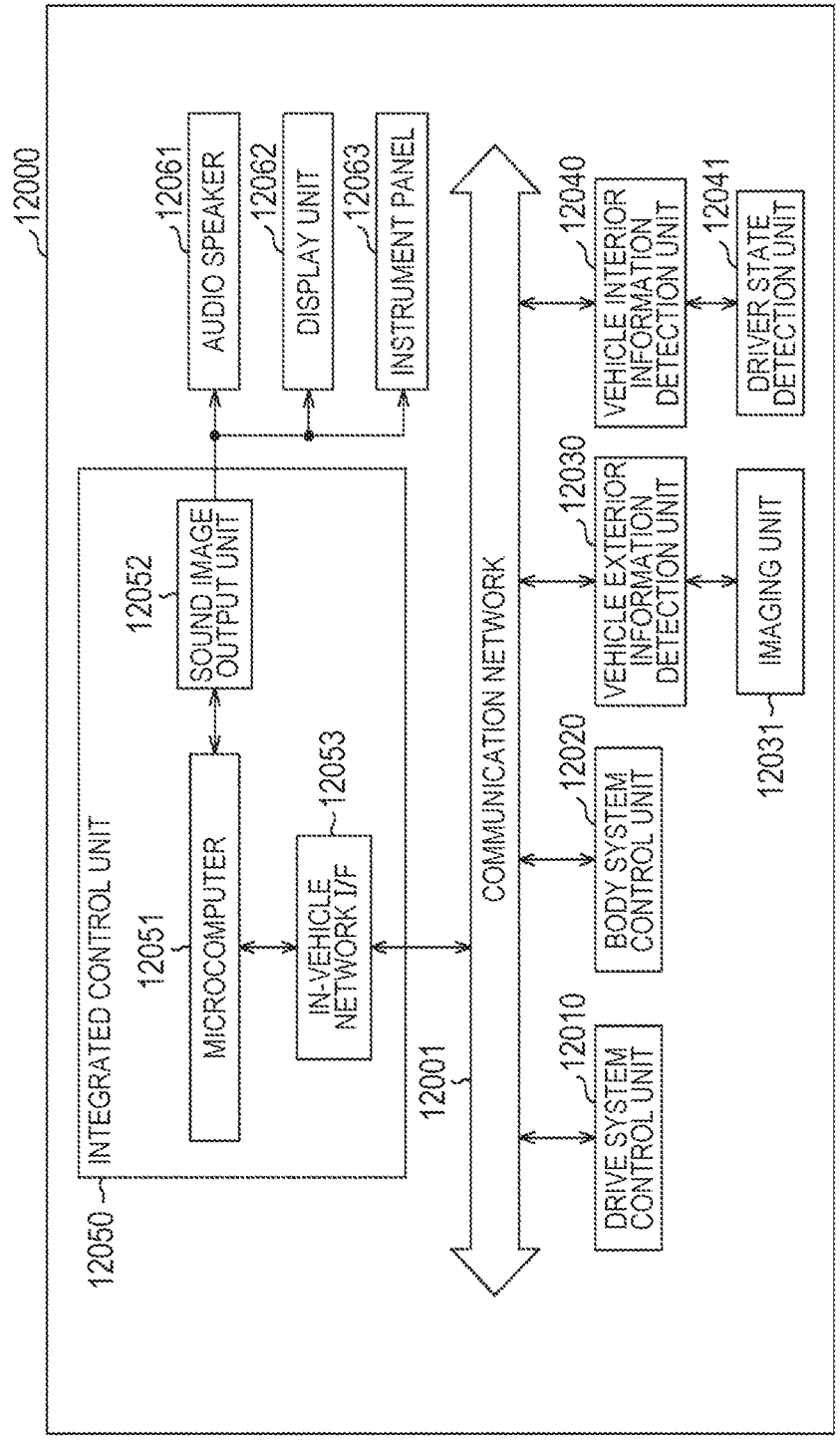
FIG. 43 is a block diagram illustrating a schematic configuration example of a vehicle control system.

FIG. 43 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 43, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the imaged image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to the amount of received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive power generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realizing the function of an advanced driver assistance system (ADAS) function including collision avoidance or shock mitigation of the vehicle, following travel based on an inter-vehicle distance, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 43, as the output device, an audio speaker 12061, a display unit 12062, and an instrument panel 12063 are exemplarily illustrated. The display unit 12062 may include, for example, at least one of an on-board display or a head-up display.

Figure 44:
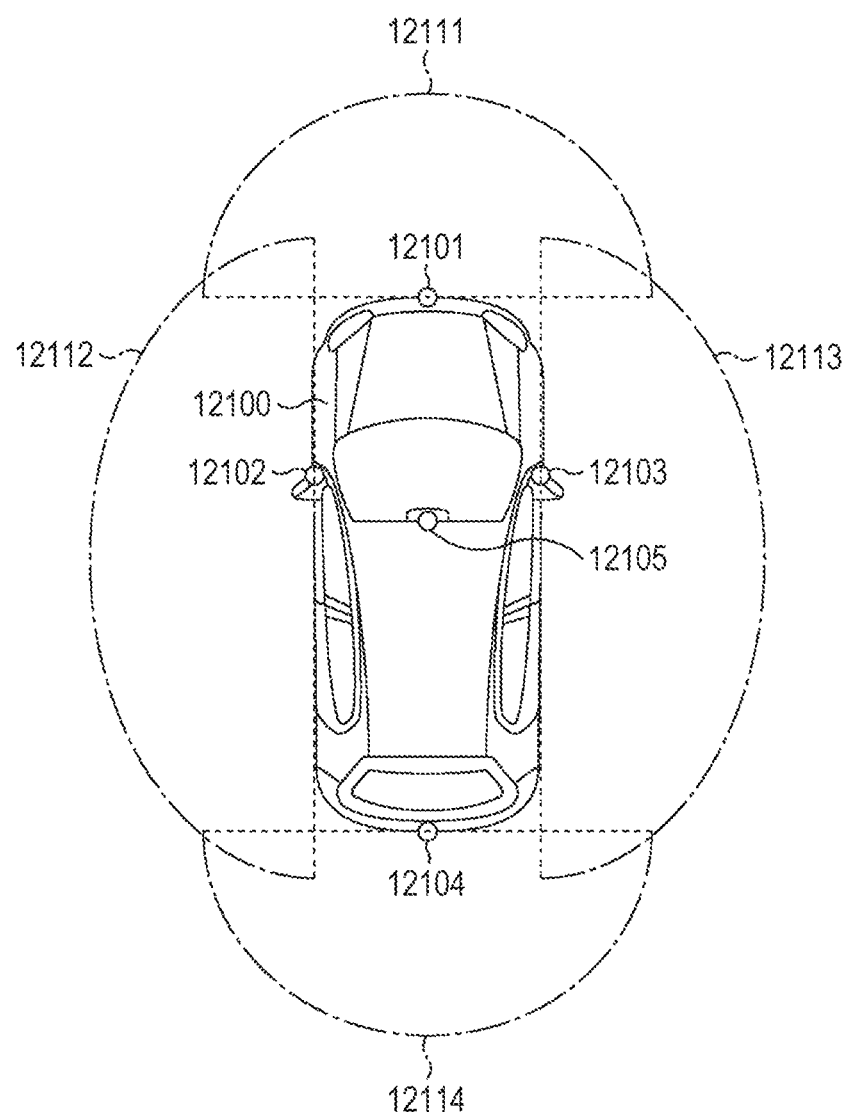
FIG. 44 is an explanatory diagram illustrating an example of installation positions of imaging units.

FIG. 44 is a diagram illustrating an example of an installation position of the imaging unit 12031.

In FIG. 44, imaging units 12101, 12102, 12103, 12104, and 12105 are included as the imaging unit 12031.

The imaging units 12101, 12102, 12103, 12104, and 12105 are provided at positions such as a front nose, side mirrors, a rear bumper, a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 44 illustrates an example of imaging ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic drive of autonomous travel without depending on an operation of the driver or the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. Then, the microcomputer 12051 determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the imaged images of the imaging units 12101 to 12104, thereby to recognize the pedestrian. The recognition of a pedestrian is performed by a process of extracting characteristic points in the imaged images of the imaging units 12101 to 12104, as the infrared camera, for example, and by a process of performing pattern matching processing for the series of characteristic points indicating a contour of an object and discriminating whether or not the object is a pedestrian. When the microcomputer 12051 determines that a pedestrian exists in the imaged images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to the imaging unit 12031, of the above-described configurations, for example. Specifically, the imaging device 100 in FIG. 1 can be applied to the imaging unit 12031. By applying the technology according to the present disclosure to the imaging unit 12031, the readout speed can be increased and the frame rate can be improved.

Note that the above-described embodiments describe an example for embodying the present technology, and the matters in the embodiments and the matters used to specify the invention in the claims have correspondence, respectively. Similarly, the matters used to specify the invention in the claims and the matters in the embodiment of the present technology given the same names have correspondence, respectively. However, the present technology is not limited to the embodiments, and can be embodied by application of various modifications to the embodiments without departing from the gist of the present technology.

Note that the effects described in the present specification are merely examples and are not limited, and other effects may be exhibited.

Note that the present technology can also have the following configurations.

(1) A solid-state image sensor including:
a first pixel connected to a first signal line;
a second pixel connected to a second signal line;
a third pixel;
a fourth pixel;
a connection control unit configured to sequentially perform control of connecting the first pixel to a reset power supply via a third signal line and control of connecting the second pixel to the reset power supply via a fourth signal line in a differential mode, and perform control of connecting the third pixel to the third signal line and control of connecting the fourth pixel to the fourth signal line in a non-differential mode; and
a drive unit configured to output a signal obtained by amplifying a difference between respective pixel signals of the first and second pixels via one of the first and second signal lines in the differential mode, and output respective pixel signals of the first, second, third, and fourth pixels via the first, second, third, and fourth signal lines in the non-differential mode.

(2) The solid-state image sensor according to (1), in which
the connection control unit further performs control of connecting the first and second pixels to a predetermined current source via fifth and sixth signal lines in the differential mode, and further performs control of connecting the first and third pixels to a power supply via the fifth signal line and control of connecting the second and fourth pixels to a power supply via the sixth signal line in the non-differential mode.

(3) The solid-state image sensor according to (2), in which
each of the first and second pixels includes
a charge storage unit configured to store a charge, and
a pair of reset transistors configured to initialize an amount of the stored charge, and
the connection control unit sequentially performs control of connecting one of the pair of transistors of the first pixel to the reset power supply via the third signal line and control of connecting one of the pair of transistors of the second pixel to the reset power supply via the fourth signal line in the differential mode, and performs control of connecting the others of the respective pairs of transistors of the first and third pixels to the power supply via the fifth signal line and control of connecting the others of the respective pairs of transistors of the second and fourth pixels to the power supply via the sixth signal line in the non-differential mode.

(4) The solid-state image sensor according to any one of (1) to (3), in which
the first, second, third, and fourth signal lines are wired along a perpendicular direction to a predetermined direction,
the first and second pixels are arrayed in the predetermined direction,
the first and third pixels are arrayed in the perpendicular direction, and
the third and fourth pixels are arrayed in the predetermined direction.

(5) The solid-state image sensor according to any one of (1) to (3), in which
the first, second, third, and fourth signal lines are wired along a perpendicular direction to a predetermined direction, and
the first, second, third, and fourth pixels are arrayed in the predetermined direction.

(6) The solid-state image sensor according to any one of (1) to (3), in which
the first, second, third, and fourth signal lines are wired along a perpendicular direction to a predetermined direction, and
the first, second, third, and fourth pixels are arrayed in the perpendicular direction.

(7) The solid-state image sensor according to any one of (1) to (6), in which
each of the first, second, third, and fourth pixels includes
a charge storage unit configured to store a charge,
a plurality of photoelectric conversion elements each configured to photoelectrically convert incident light to generate the charge, and
a transfer unit configured to transfer the charge from each of the plurality of photoelectric conversion elements to the charge storage unit.

(8) The solid-state image sensor according to any one of (1) to (7), in which
each of the first, second, third, and fourth pixels includes
a microlens configured to collect incident light, a photoelectric conversion layer configured to photoelectrically convert the collected incident light to generate a charge, and a wiring layer arranged between the photoelectric conversion layer and the microlens, and the first, second, third, and fourth signal lines are wired in the wiring layer.

(9) The solid-state image sensor according to any one of (1) to (7), in which each of the first, second, third, and fourth pixels includes a microlens configured to collect incident light, a wiring layer, and a photoelectric conversion layer arranged between the microlens and the wiring layer and configured to photoelectrically convert the collected incident light to generate a charge, and the first, second, third, and fourth signal lines are wired in the wiring layer.

(10) The solid-state image sensor according to any one of (1) to (9), in which the first, second, third, and fourth pixels and the connection control unit are arranged in a first semiconductor chip, and the drive unit is arranged in a second semiconductor chip stacked on the first semiconductor chip.

(11) The solid-state image sensor according to any one of (1) to (9), in which the first, second, third, and fourth pixels are arranged in a first semiconductor chip, and the connection control unit and the drive unit are arranged in a second semiconductor chip stacked on the first semiconductor chip.

(12) The solid-state image sensor according to any one of (1) to (11), further including:

an analog-to-digital conversion unit configured to execute sampling processing of converting the pixel signal into a digital signal every time the pixel signal is output over a plurality of times; and an adder circuit configured to add and output the digital signals.

(13) An imaging device including:

a first pixel connected to a first signal line;

a second pixel connected to a second signal line;

a third pixel;

a fourth pixel;

a connection control unit configured to sequentially perform control of connecting the first pixel to a reset power supply via a third signal line and control of connecting the second pixel to the reset power supply via a fourth signal line in a differential mode, and perform control of connecting the third pixel to the third signal line and control of connecting the fourth pixel to the fourth signal line in a non-differential mode;

a drive unit configured to output a signal obtained by amplifying a difference between respective pixel signals of the first and second pixels via one of the first and second signal lines in the differential mode, and output respective pixel signals of the first, second, third, and fourth pixels via the first, second, third, and fourth signal lines in the non-differential mode; and an image processing unit configured to execute predetermined processing for image data generated from the pixel signals.

(14) A method of controlling a solid-state image sensor, the method including:

a connection control procedure of sequentially performing control of connecting a first pixel connected to a first signal line to a reset power supply via a third signal line and control of connecting a second pixel connected to a second signal line to the reset power supply via a fourth signal line in a differential mode, and performing control of connecting a third pixel to the third signal line and control of connecting the fourth pixel to the fourth signal line in a non-differential mode; and a drive procedure of outputting a signal obtained by amplifying a difference between respective pixel signals of the first and second pixels via one of the first and second signal lines in the differential mode, and outputting respective pixel signals of the first, second, third, and fourth pixels via the first, second, third, and fourth signal lines in the non-differential mode.

REFERENCE SIGNS LIST

100 Imaging device
110 Optical unit
120 Digital signal processor
130 Display unit
140 Operation unit
150 Bus
160 Power supply unit
170 Recording unit
180 Frame memory
200 Solid-state image sensor
201 Pixel chip
202 Circuit chip
210 Vertical drive unit
220 Pixel array unit
221 Photoelectric conversion layer
222 Power supply-side vertical wiring layer
223 Horizontal wiring layer
224 Ground-side vertical wiring layer
225 Basic unit
226 to 229 FD shared block
230, 240, 250, 260, 360, 363, 366, 370, 373, 376, 379 Pixel
231, 241, 251, 261, 362, 365, 368, 372, 375, 378, 381 Photodiode
232, 242, 252, 262, 361, 364, 367, 371, 374, 377, 380 Transfer transistor
233, 243, 253, 263 Charge storage unit
234, 235, 244, 245, 254, 255, 264, 265 Reset transistor
236, 246, 256, 266 Amplification transistor
237, 247, 257, 267 Selection transistor
270 Column signal processing unit
271 Upper column signal processing unit
272 Lower column signal processing unit
273, 276, 277, 278 ADC
274 Comparator
275 Counter
280 Output unit
281 to 284 Latch circuit
285 Adder circuit
291 System control unit
292 Horizontal drive unit
293 Data storage unit
294 Image processing unit
295 Pixel peripheral circuit
300 Column readout circuit
301 Upper column readout circuit
302 Lower column readout circuit
310 Unit readout circuit
311, 312 n-type transistor
313 to 337, 345 to 352 Switch
341 to 344 Current source
12031 Imaging unit

The invention claimed is:

1. A solid-state image sensor comprising:
a first pixel connected to a first signal line;
a second pixel connected to a second signal line;
a third pixel;
a fourth pixel;
a connection control unit configured to sequentially perform control of connecting the first pixel to a reset power supply via a third signal line and control of connecting the second pixel to the reset power supply via a fourth signal line in a differential mode, and perform control of connecting the third pixel to the third signal line and control of connecting the fourth pixel to the fourth signal line in a non-differential mode; and
a drive unit configured to output a signal obtained by amplifying a difference between respective pixel signals of the first pixel and the second pixel via one of the first signal line and the second signal line in the differential mode, and output respective pixel signals of the first pixel, the second pixel, the third pixel, and the fourth pixel via the first signal line, the second signal line, the third signal line, and the fourth signal line in the non-differential mode.

2. The solid-state image sensor according to claim 1, wherein
the connection control unit further performs control of connecting the first pixel and the second pixel to a predetermined current source via a fifth signal line and a sixth signal line in the differential mode, and further performs control of connecting the first pixel and the third pixel to a power supply via the fifth signal line and control of connecting the second pixel and the fourth pixel to a power supply via the sixth signal line in the non-differential mode.

3. The solid-state image sensor according to claim 2, wherein
each of the first pixel and the second pixel includes
a charge storage unit configured to store a charge, and
a pair of reset transistors configured to initialize an amount of the stored charge, and
the connection control unit sequentially performs control of connecting one of a pair of transistors of the first pixel to the reset power supply via the third signal line and control of connecting one of a pair of transistors of the second pixel to the reset power supply via the fourth signal line in the differential mode, and performs control of connecting others of respective pairs of transistors of the first pixel and the third pixel to the power supply via the fifth signal line and control of connecting others of respective pairs of transistors of the second pixel and the fourth pixel to the power supply via the sixth signal line in the non-differential mode.

4. The solid-state image sensor according to claim 1, wherein
the first signal line, the second signal line, the third signal line, and the fourth signal line are wired along a perpendicular direction to a predetermined direction,
the first pixel and the second pixel are arrayed in the predetermined direction,
the first pixel and the third pixel are arrayed in the perpendicular direction, and
the third pixel and the fourth pixel are arrayed in the predetermined direction.

5. The solid-state image sensor according to claim 1, wherein
the first signal line, the second signal line, the third signal line, and the fourth signal line are wired along a perpendicular direction to a predetermined direction, and
the first pixel, the second pixel, the third pixel, and the fourth pixel are arrayed in the predetermined direction.

6. The solid-state image sensor according to claim 1, wherein
the first signal line, the second signal line, third signal line, and the fourth signal line are wired along a perpendicular direction to a predetermined direction, and
the first pixel, the second pixel, the third pixel, and the fourth pixel are arrayed in the perpendicular direction.

7. The solid-state image sensor according to claim 1, wherein
each of the first pixel, the second pixel, the third pixel, and the fourth pixel includes:
a charge storage unit configured to store a charge;
a plurality of photoelectric conversion elements each configured to photoelectrically convert incident light to generate the charge; and
a transfer unit configured to transfer the charge from each of the plurality of photoelectric conversion elements to the charge storage unit.

8. The solid-state image sensor according to claim 1, wherein
each of the first pixel, the second pixel, the third pixel, and the fourth pixel includes:
a microlens configured to collect incident light;
a photoelectric conversion layer configured to photoelectrically convert the collected incident light to generate a charge; and
a wiring layer arranged between the photoelectric conversion layer and the microlens, and
the first signal line, the second signal line, the third signal line, and the fourth signal line are wired in the wiring layer.

9. The solid-state image sensor according to claim 1, wherein
each of the first pixel, the second pixel, the third pixel, and the fourth pixel includes:
a microlens configured to collect incident light;
a wiring layer; and
a photoelectric conversion layer arranged between the microlens and the wiring layer and configured to photoelectrically convert the collected incident light to generate a charge, and
the first signal line, the second signal line, the third signal line, and the fourth signal line are wired in the wiring layer.

10. The solid-state image sensor according to claim 1, wherein
the first pixel, the second pixel, the third pixel, and the fourth pixel and the connection control unit are arranged in a first semiconductor chip, and
the drive unit is arranged in a second semiconductor chip stacked on the first semiconductor chip.

11. The solid-state image sensor according to claim 1, wherein
the first pixel, the second pixel, the third pixel, and the fourth pixel are arranged in a first semiconductor chip, and
the connection control unit and the drive unit are arranged in a second semiconductor chip stacked on the first semiconductor chip.

12. The solid-state image sensor according to claim 1, further comprising:
- an analog-to-digital conversion unit configured to execute sampling processing of converting a pixel signal into a digital signal every time the pixel signal is output over a plurality of times; and
- an adder circuit configured to add and output the digital signals.

13. An imaging device, comprising:
- a first pixel connected to a first signal line;
- a second pixel connected to a second signal line;
- a third pixel;
- a fourth pixel;
- a connection control unit configured to sequentially perform control of connecting the first pixel to a reset power supply via a third signal line and control of connecting the second pixel to the reset power supply via a fourth signal line in a differential mode, and perform control of connecting the third pixel to the third signal line and control of connecting the fourth pixel to the fourth signal line in a non-differential mode;
- a drive unit configured to output a signal obtained by amplifying a difference between respective pixel signals of the first pixel and the second pixel via one of the first signal line and the second signal line in the differential mode, and output respective pixel signals of the first pixel, the second pixel, the third pixel, and the fourth pixel via the first signal line, the second signal line, the third signal line, and the fourth signal line in the non-differential mode; and
- an image processing unit configured to execute predetermined processing for image data generated from the pixel signals.

14. A method of controlling a solid-state image sensor, the method comprising:
- a connection control procedure of sequentially performing control of connecting a first pixel connected to a first signal line to a reset power supply via a third signal line and control of connecting a second pixel connected to a second signal line to the reset power supply via a fourth signal line in a differential mode, and performing control of connecting a third pixel to the third signal line and control of connecting a fourth pixel to the fourth signal line in a non-differential mode; and
- a drive procedure of outputting a signal obtained by amplifying a difference between respective pixel signals of the first pixel and the second pixel via one of the first signal line and the second signal line in the differential mode, and outputting respective pixel signals of the first pixel, the second pixel, the third pixel, and the fourth pixel via the first signal line, the second signal line, the third signal line, and the fourth signal line in the non-differential mode.

* * * * *